(12) United States Patent
Morgan

(10) Patent No.: US 7,873,257 B2
(45) Date of Patent: Jan. 18, 2011

(54) LIGHT-GUIDE SOLAR PANEL AND METHOD OF FABRICATION THEREOF

(75) Inventor: John Paul Morgan, Toronto (CA)

(73) Assignee: Morgan Solar Inc., Toronto (CA)

( * ) Notice: Subject to any disclaimer, the term of this patent is extended or adjusted under 35 U.S.C. 154(b) by 485 days.

(21) Appl. No.: 12/113,705

(22) Filed: May 1, 2008

(65) Prior Publication Data

US 2008/0271776 A1 Nov. 6, 2008

Related U.S. Application Data

(60) Provisional application No. 60/915,207, filed on May 1, 2007, provisional application No. 60/942,745, filed on Jun. 8, 2007, provisional application No. 60/951,775, filed on Jul. 25, 2007.

(51) Int. Cl.
*G02B 6/10* (2006.01)
*G02B 6/26* (2006.01)
*H01J 31/00* (2006.01)
*F24J 2/10* (2006.01)

(52) U.S. Cl. .................. 385/146; 385/31; 136/246; 126/685

(58) Field of Classification Search .......... 362/84, 362/183, 228, 557; 126/634, 684, 685; 136/259, 136/257, 246, 243; 359/868, 869, 853, 365; 385/31, 33, 146, 147, 900, 901

See application file for complete search history.

(56) References Cited

U.S. PATENT DOCUMENTS

| | | | |
|---|---|---|---|
| 3,780,722 A | 12/1973 | Swet | |
| 4,037,096 A | 7/1977 | Brendgord et al. | |
| 4,074,704 A | 2/1978 | Gellert | |
| 4,151,582 A | 4/1979 | Grunberger | |
| 4,199,376 A | 4/1980 | Sill | |
| 4,252,416 A | 2/1981 | Jaccard | |
| 4,257,401 A | 3/1981 | Daniels | |
| 4,261,335 A * | 4/1981 | Balhorn | 126/602 |
| 4,282,862 A | 8/1981 | Soleau | |
| 4,292,959 A * | 10/1981 | Coburn, Jr. | 126/686 |

(Continued)

FOREIGN PATENT DOCUMENTS

DE 19937448 A1 2/2001

(Continued)

OTHER PUBLICATIONS

Supplementary European Search Report of EP2153475; Oscar Chao; Jun. 22, 2010; Berlin.

(Continued)

*Primary Examiner*—Akm E Ullah
(74) *Attorney, Agent, or Firm*—Osler, Hoskin & Harcourt LLP

(57) ABSTRACT

The present invention is that of a solar energy system that uses a light-guide solar panel (LGSP) to trap light inside a dielectric or other transparent panel and propagates the light to one of the panel edges for harvesting by a solar energy collector such as a photovoltaic cell. This allows for very thin modules whose thickness is comparable to the height of the solar energy collector. This eliminates eliminating the depth requirements inherent in traditional concentrated photovoltaic solar energy systems.

20 Claims, 54 Drawing Sheets

U.S. PATENT DOCUMENTS

| | | |
|---|---|---|
| 4,344,417 A | 8/1982 | Malecek |
| 4,357,486 A | 11/1982 | Blieden et al. |
| 4,379,613 A | 4/1983 | Coburn |
| 4,389,698 A | 6/1983 | Cibie |
| 4,411,490 A | 10/1983 | Daniel |
| 4,432,039 A | 2/1984 | Cibie |
| 4,496,211 A | 1/1985 | Daniel |
| 4,505,264 A | 3/1985 | Tremblay |
| 4,529,830 A | 7/1985 | Daniel |
| 4,539,625 A | 9/1985 | Bornstein et al. |
| 4,691,994 A | 9/1987 | Afian et al. |
| 4,697,867 A | 10/1987 | Blanc et al. |
| 4,798,448 A | 1/1989 | Van Raalte |
| 4,863,224 A | 9/1989 | Afian et al. |
| 4,954,930 A | 9/1990 | Maegawa et al. |
| 5,050,946 A | 9/1991 | Hathaway |
| 5,089,055 A | 2/1992 | Nakamura |
| 5,136,480 A | 8/1992 | Pristash et al. |
| 5,197,792 A | 3/1993 | Jiao et al. |
| 5,202,950 A | 4/1993 | Arego et al. |
| 5,220,462 A | 6/1993 | Feldman, Jr. |
| 5,280,557 A * | 1/1994 | Nwasokwa .................. 385/146 |
| 5,357,592 A | 10/1994 | Neilson |
| 5,385,615 A | 1/1995 | Horne |
| 5,390,085 A | 2/1995 | Mari-Roca et al. |
| 5,396,350 A | 3/1995 | Beeson et al. |
| 5,438,485 A | 8/1995 | Li et al. |
| 5,485,291 A | 1/1996 | Qiao et al. |
| 5,485,354 A | 1/1996 | Ciupke et al. |
| 5,521,725 A | 5/1996 | Beeson et al. |
| 5,528,720 A | 6/1996 | Winston et al. |
| 5,540,216 A | 7/1996 | Rasmusson |
| 5,664,862 A | 9/1997 | Redmond et al. |
| 5,719,649 A | 2/1998 | Shono et al. |
| 5,806,955 A | 9/1998 | Parkyn, Jr. et al. |
| 5,838,403 A | 11/1998 | Jannson et al. |
| 5,877,874 A | 3/1999 | Rosenberg |
| 5,914,760 A | 6/1999 | Daiku |
| 5,926,601 A | 7/1999 | Tai et al. |
| 5,977,478 A | 11/1999 | Hibino et al. |
| 6,021,007 A | 2/2000 | Murtha |
| 6,036,340 A | 3/2000 | Fohl et al. |
| 6,072,551 A | 6/2000 | Jannson et al. |
| 6,097,549 A | 8/2000 | Jenkins et al. |
| 6,108,059 A | 8/2000 | Yang |
| 6,129,439 A | 10/2000 | Hou et al. |
| 6,139,176 A | 10/2000 | Hulse et al. |
| 6,201,246 B1 | 3/2001 | Potekev et al. |
| 6,224,223 B1 | 5/2001 | Higuchi et al. |
| 6,252,155 B1 | 6/2001 | Ortabasi |
| 6,294,723 B2 | 9/2001 | Uematsu et al. |
| 6,367,941 B2 | 4/2002 | Lea et al. |
| 6,379,016 B1 | 4/2002 | Boyd et al. |
| 6,425,391 B1 | 7/2002 | Davoren et al. |
| 6,440,769 B2 | 8/2002 | Peumans et al. |
| 6,461,007 B1 | 10/2002 | Akaoka |
| 6,473,554 B1 | 10/2002 | Pelka et al. |
| 6,476,312 B1 | 11/2002 | Barnham |
| 6,541,694 B2 | 4/2003 | Winston et al. |
| 6,570,710 B1 | 5/2003 | Nilsen et al. |
| 6,576,887 B2 | 6/2003 | Whitney et al. |
| 6,607,286 B2 | 8/2003 | West et al. |
| 6,612,709 B2 | 9/2003 | Yamada et al. |
| 6,623,132 B2 | 9/2003 | Lekson et al. |
| 6,639,733 B2 | 10/2003 | Minano et al. |
| 6,647,199 B1 | 11/2003 | Pelka et al. |
| 6,730,840 B2 | 5/2004 | Sasaoka et al. |
| 6,811,277 B2 | 11/2004 | Amano |
| 6,819,687 B1 | 11/2004 | Fein |
| 6,899,443 B2 | 5/2005 | Rizkin et al. |
| 6,966,661 B2 | 11/2005 | Read |
| 7,021,805 B2 | 4/2006 | Amano et al. |
| 7,046,907 B2 | 5/2006 | Miyashita |
| 7,083,313 B2 | 8/2006 | Smith |
| 7,134,778 B2 | 11/2006 | Kazuhiro et al. |
| 7,160,010 B1 | 1/2007 | Chinniah et al. |
| 7,286,296 B2 | 10/2007 | Chaves et al. |
| 7,347,611 B2 | 3/2008 | Kwon |
| 7,371,001 B2 | 5/2008 | Miyashita |
| 7,664,350 B2 * | 2/2010 | Ghosh et al. .................. 385/31 |
| 7,672,549 B2 * | 3/2010 | Ghosh et al. .................. 385/31 |
| 2002/0148497 A1 | 10/2002 | Sasaoka et al. |
| 2003/0063474 A1 | 4/2003 | Coushaine |
| 2003/0067760 A1 | 4/2003 | Jagt et al. |
| 2003/0075167 A1 | 4/2003 | Dominguez et al. |
| 2003/0075212 A1 | 4/2003 | Chen |
| 2004/0022071 A1* | 2/2004 | Cheng et al. ................. 362/557 |
| 2004/0103938 A1 | 6/2004 | Rider |
| 2005/0111235 A1 | 5/2005 | Suzuki et al. |
| 2005/0129358 A1 | 6/2005 | Minano et al. |
| 2005/0254259 A1 | 11/2005 | Yamashita et al. |
| 2006/0072222 A1 | 4/2006 | Lichy |
| 2006/0077692 A1 | 4/2006 | Noh et al. |
| 2006/0098929 A1 | 5/2006 | Steenblik et al. |
| 2006/0207650 A1 | 9/2006 | Winston et al. |
| 2007/0047260 A1 | 3/2007 | Lee et al. |
| 2007/0171418 A1 | 7/2007 | Nyhart, Jr. |
| 2007/0246040 A1 | 10/2007 | Schaafsma |
| 2007/0251568 A1 | 11/2007 | Maeda |
| 2008/0002159 A1* | 1/2008 | Liu et al. ...................... 353/84 |
| 2008/0048102 A1 | 2/2008 | Kurtz et al. |
| 2008/0087323 A1 | 4/2008 | Araki et al. |
| 2008/0165437 A1 | 7/2008 | DiDomenico |
| 2008/0184989 A1 | 8/2008 | Mecham |
| 2008/0223443 A1 | 9/2008 | Benitez et al. |
| 2008/0257408 A1 | 10/2008 | Chen et al. |
| 2008/0264486 A1 | 10/2008 | Chen et al. |
| 2009/0027872 A1* | 1/2009 | Debije et al. .................. 362/84 |
| 2009/0064993 A1* | 3/2009 | Ghosh et al. ................. 126/685 |
| 2009/0126792 A1 | 5/2009 | Gruhlke et al. |
| 2010/0024868 A1 | 2/2010 | Baruchi et al. |
| 2010/0037954 A1 | 2/2010 | Thony |
| 2010/0065120 A1 | 3/2010 | Mcdonald |
| 2010/0108124 A1 | 5/2010 | Knox et al. |
| 2010/0116336 A1 | 5/2010 | Anton et al. |
| 2010/0126554 A1* | 5/2010 | Morgan et al. ............... 136/246 |
| 2010/0165495 A1 | 7/2010 | Murtha |
| 2010/0252026 A1* | 10/2010 | Schilling et al. ............ 126/601 |

FOREIGN PATENT DOCUMENTS

| | | |
|---|---|---|
| EP | 1895228 A1 | 3/2008 |
| EP | 2061093 A1 | 5/2009 |
| EP | 2077586 A1 | 7/2009 |
| ES | P200803237 | 11/2008 |
| FR | 2872256 A1 | 12/2005 |
| GB | 1570684 A | 7/1980 |
| JP | 2001289515 A | 10/2001 |
| JP | 2003258291 A | 9/2003 |
| JP | 2005019587 A | 1/2005 |
| JP | 2005123036 A | 5/2005 |
| WO | 199826212 A1 | 6/1998 |
| WO | 2002044766 A2 | 6/2002 |
| WO | 2004114418 A1 | 12/2004 |
| WO | 2006010249 A1 | 2/2006 |
| WO | 2006064365 A2 | 6/2006 |
| WO | 2006088369 A2 | 8/2006 |
| WO | 2007045917 A2 | 4/2007 |
| WO | 2008012777 A2 | 1/2008 |
| WO | 2008058245 A2 | 5/2008 |
| WO | 2008092679 A1 | 8/2008 |
| WO | 2008103987 A2 | 8/2008 |
| WO | 2009001106 A2 | 12/2008 |
| WO | 2009041330 A1 | 4/2009 |

| | | | |
|---|---|---|---|
| WO | 2009058619 A2 | 5/2009 |
| WO | 2009063416 A2 | 5/2009 |
| WO | 2009064701 A1 | 5/2009 |
| WO | 2009086293 A2 | 7/2009 |
| WO | 2010033859 A2 | 3/2010 |
| WO | 2010040053 A1 | 4/2010 |

OTHER PUBLICATIONS

Ghosh et al.: "A New Approach to Concentrating and Aggregating Light Energy", Jun. 2007.
Chaves et al.: "Ideal Concentrators with Gaps", Mar. 1, 2002, Applied Optics, vol. 41, No. 7 pp. 1267-1276.
Chaves et al.: "Ultra Flat Ideal Concentrators of High Concentration", 2000, Solar Energy, vol. 69, No. 4, pp. 269-281.
PCT Patent Application No. PCT/CA2008/000831 International Search Report dated Aug. 4, 2008.
English Abstract of FR2872256, Dec. 30, 2005.
English Abstract of JP2001289515, Oct. 19, 2001.
English Abstract of JP2003258291, Sep. 12, 2003.
English Abstract of JP2005019587, Jan. 20, 2005.
English Abstract of JP2005123036, May 12, 2005.
English Abstract of EP1895228, Mar. 5, 2008.
English Abstract of DE19937448, Feb. 8, 2001.
Benitez et al., "High Performance Fresnel-based Photovoltaic Concentrator", Apr. 26, 2010, Opitcal Society of America, vol. 18, No. S1.
Winston et al., "Planar Concentrators near the Étendue Limit", Oct. 1, 2005, Optical Society of America, vol. 30, No. 19.
U.S. Appl. No. 12/705,415, filed Feb. 12, 2010; Title: Light-Guide Solar Panel and Method of Fabricaiton Thereof.
U.S. Appl. No. 12/597,648, filed Apr. 12, 2010; Title: Illumination Device.
Document "Chapter 2: Holographic Methods", (No. date).
The William L. Bonnell Company, "Extrusion Process Description", (No date).
"Plastic and Their Properties" (No date).
"High Reflectors" (No date).
"Plexiglas Acrylic Molding Resin", 2008, Altuglas International, (year 2008 only).
Plexiglas Acrylic Molding Resin "Extrusion", 2008, Altuglas International, Year 2008 only.
JDSU "Thin Film Custom Optics", Dec. 2007, (Dec. 2007 only).
"Meisner Acrylic Casting", (No date).

* cited by examiner

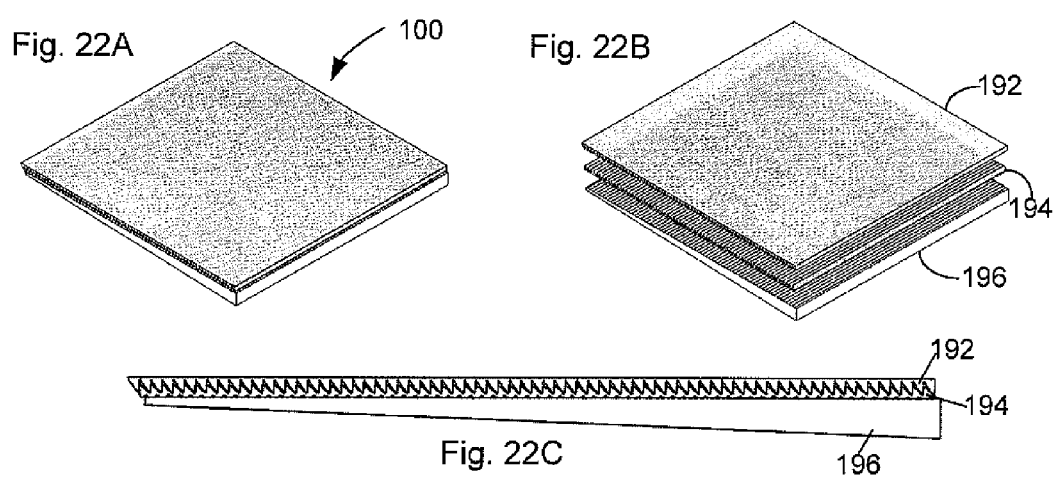
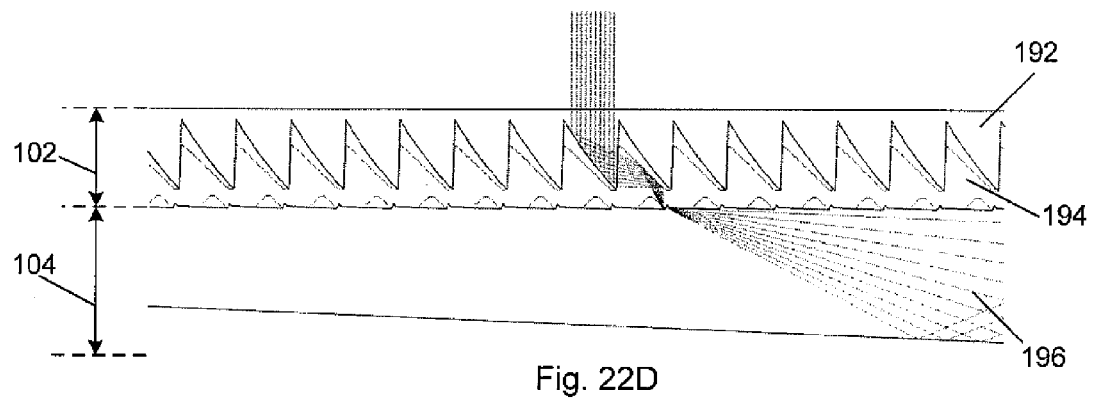

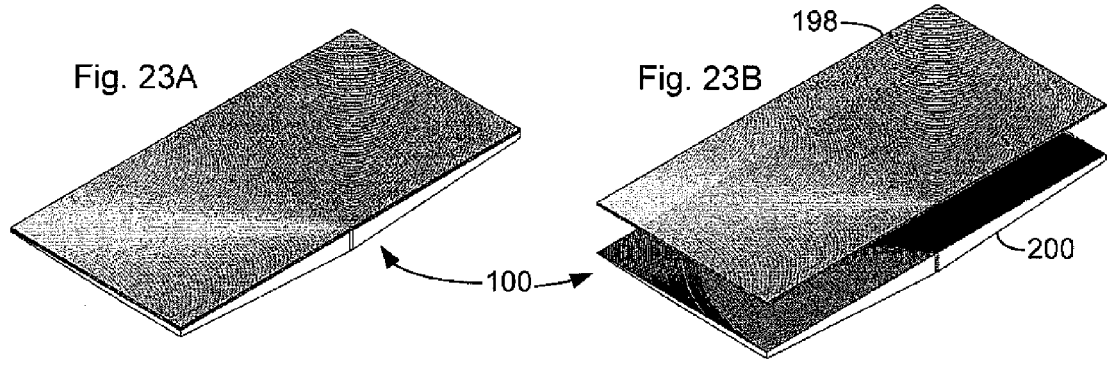
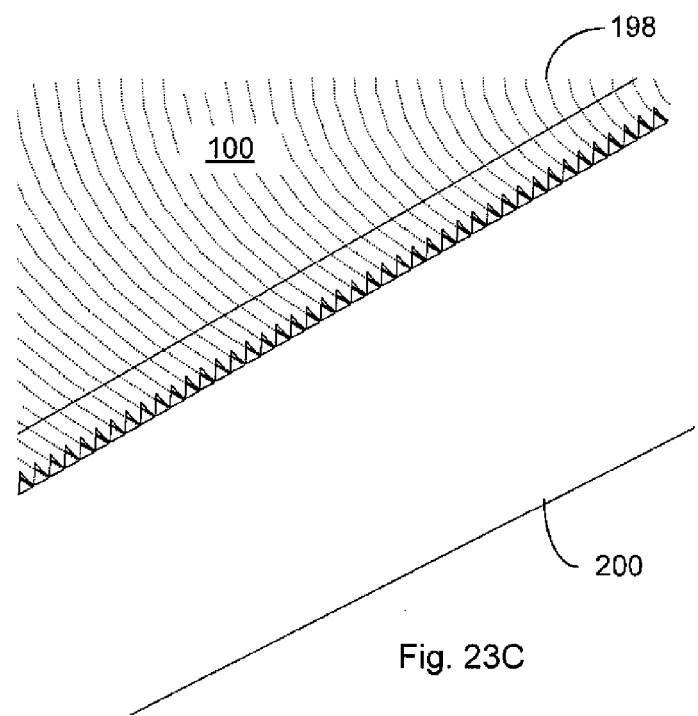

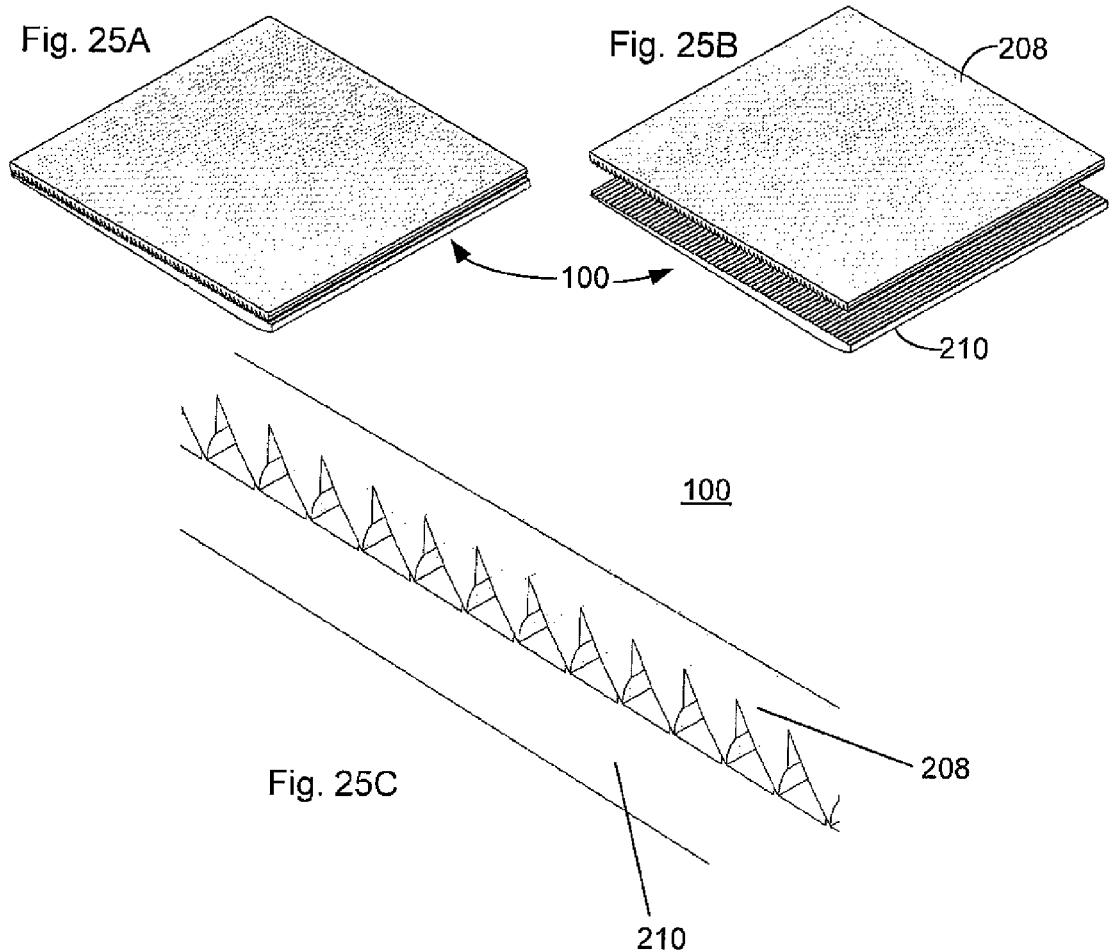

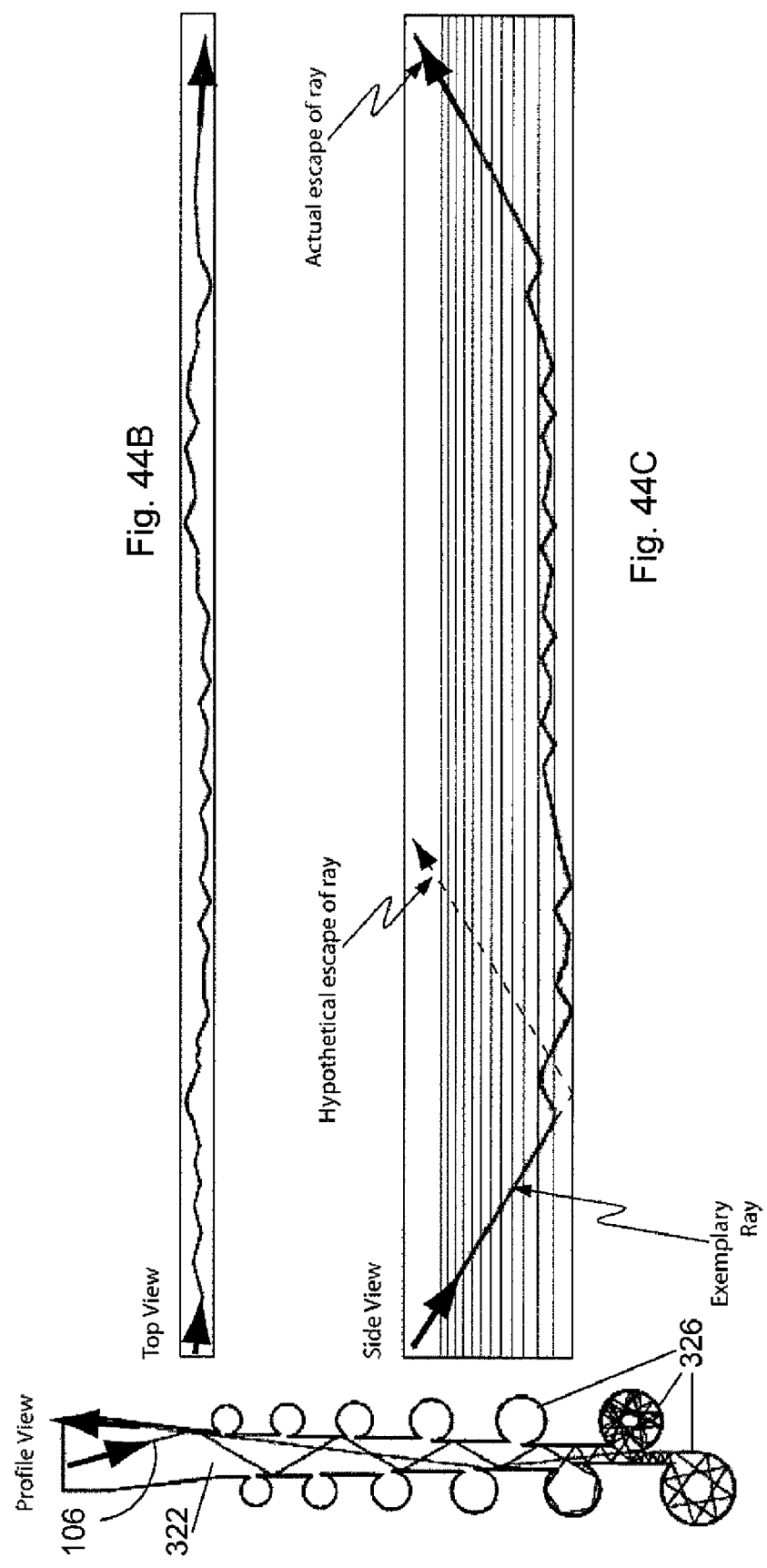

LIGHT-GUIDE SOLAR PANEL AND METHOD OF FABRICATION THEREOF

CROSS REFERENCE TO RELATED APPLICATIONS

This application claims the benefit of priority of U.S. Provisional Patent Application No. 60/915,207 filed May 1, 2007; U.S. Provisional Patent Application No. 60/942,745 filed Jun. 8, 2007; and U.S. Provisional Patent Application No. 60/951,775 filed Jul. 25, 2007, which are incorporated herein by reference in their entirety.

FIELD OF THE INVENTION

The present invention relates generally to solar panels. More particularly, the present invention relates to light-guiding concentrator solar panels.

BACKGROUND OF THE INVENTION

Solar panel assemblies having photovoltaic (PV) cells arrayed over a large surface area directly exposed to the sun are known. However, PV cell material is expensive and solutions have been sought to reduce the amount of PV cell material required in solar panels. One of these solutions makes use of concentrating optical elements, such as lenses and mirrors, to concentrate sunlight on a smaller surface area occupied by a correspondingly smaller PV cell. Given that the concentrating optical elements all have a non-zero focal length, they make for concentrated photovoltaic (CPV) modules that are typically bulkier than their non-concentrating counterparts. This bulkiness is disadvantageous not only in terms of the handling of the CPV modules, but also in terms of material costs. It is possible to obtain less bulky CPV modules while maintaining the same concentration factor by reducing the size of the PV cell; however, dicing PV cells into smaller cells increases the complexity and cost of the modules.

Additionally, present CPV modules typically require that the concentrating optical elements be secured in a complex structural enclosure to hold all the elements in place. This invariably adds to the weight and cost of the CPV modules, and makes for either stricter shipping requirements to mitigate risk of breakage of the assembled CPV modules or, requires that the CPV modules be shipped disassembled to their destination, thereby requiring assembly time and effort at the receiving destination.

Therefore, it is desirable therefore to provide a CPV module that is less bulky than existing CPV modules. It is also desirable to provide a CPV module that requires relatively less PV cell material than known CPV modules. Additionally, it is desirable to provide a CPV module that requires a less voluminous and complex structural enclosure for concentrating optical elements than in known CPV modules.

SUMMARY OF THE INVENTION

It is an object of the present invention to obviate or mitigate at least one disadvantage of previous solar panels.

In a first aspect, the present invention provides a light-guide solar panel that comprises a light-insertion stage having an input surface for receiving light, optical elements and at least one optical output aperture, the optical elements being formed between the input surface and the at least one optical output aperture to direct the light from the input surface to the at least one optical output aperture. The panel further comprises an optical waveguide stage having an output surface, the optical waveguide stage being optically coupled to the at least one optical output aperture to receive the light therefrom, the optical waveguide stage for guiding the light towards the output surface.

The solar panel can have the optical elements spaced-apart from each other along substantially parallel lines and the output surface can be substantially non-orthogonal to the input surface.

The solar panel can have the optical elements spaced-apart from each other along substantially concentric circle arcs, and the output surface can be shaped as a circle arc substantially concentric with the optical elements.

The solar panel can have the optical elements include at least one of parabolic reflectors, cubic reflectors, hyperbolic reflectors, elliptical reflectors, flat reflectors, Cassegrain optics, Winston cone optics, round reflectors, lenses, a hologram and prismatic ridges.

The solar panel can have the optical waveguide stage wedge-shaped. The solar panel can have the optical waveguide stage at least partially cone-shaped.

The solar panel can have the optical waveguide stage include a first surface off of which the light received from the at least one optical output aperture goes through a first total internal reflection. The solar panel as claimed can have at least one of the input surface and the first surface with a cladding layer formed thereon.

The solar panel as claimed can have the optical waveguide section with a plurality of reflector elements formed opposite the first surface, the plurality of reflector elements for receiving totally internally reflected light from the first surface and for reflecting the totally internally reflected light towards the first surface. The plurality of reflector elements can include planar reflectors. The planar reflectors can be substantially parallel to the first surface. At least one reflecting element can have total internal reflection surface. The at least one optical output aperture can be located in between adjacent reflector elements.

The solar panel as claimed can be such that substantially no light is coupled from the optical waveguide stage to the light-insertion stage through the at least one optical output aperture.

The solar panel can be such that the optical waveguide stage guides the light towards the output surface through a series of total internal reflections. The solar panel can be such that the input surface has a light input area and the output surface has a light collecting area, the light collecting area being smaller than the light input area.

The solar panel can comprise a solar energy collector optically coupled to the output surface. The solar energy collector can include at least one of a photovoltaic solar cell and a heat collector. The solar panel of can further comprise an optical prism for optically coupling the output surface to the solar energy collector.

The solar panel can be such that the optical waveguide stage has at least one parabolically-shaped interface adjacent the output surface, the at least one parabolically-shaped interface for concentrating the light on the output surface. The solar can comprise a tapered optical element adjacent the output surface, the tapered optical element for spacing the solar energy collector from the optical waveguide stage and for concentrating the light onto the solar energy collector. The tapered optical element can have a refractive index different than that of the optical waveguide stage. The solar panel can have the optical waveguide stage include a plurality of waveguides, each waveguide being optically coupled to one of the at least one optical output aperture, each waveguide for receiving the light from a corresponding optical output aperture and for propagating the light along the waveguide in a direction determined at least by the optical elements. Each waveguide can have a waveguide output surface, the waveguide stage output surface comprising the waveguide output surface of each waveguide. The optical elements can direct the light to propagate in only one direction along each waveguide or in two opposite directions along each waveguide. The optical elements can include a volume phase hologram. The optical elements can include a plurality of prismatic ridges.

The solar panel can be such that the light-insertion stage can include a plurality of tapered light channels and the optical waveguide stage can include a plurality of waveguides, at least one of the tapered light channels being optically coupled to at least one waveguide through one of the at least one optical output aperture, each waveguide for guiding the light along the waveguide in a propagation direction determined at least by the optical elements. The at least one waveguide can include waveguides of different diameters. The optical elements can include at least one of a volume phase hologram and prismatic ridges for imparting the propagation direction to the light. The optical elements can further include at least one of parabolic reflectors, cubic reflectors, hyperbolic reflectors, elliptical reflectors, flat reflectors and round reflectors.

The light-insertion stage can be formed in a first slab of optically transmissive material and the optical waveguide stage can be formed in a second slab of optically transmissive material. The first slab can include the input surface and the optical elements, and can have an output profiled surface opposite the input surface. The second slab can include an input profiled surface adjacent the output profiled surface, with the output profiled surface of the first slab and the input profiled surface of the second slab being complementary to each other and defining the at least one optical output aperture.

The solar panel can be such that the light-insertion stage is formed in first and second layers of optically transmissive material, and the optical waveguide stage is formed in a third layer of optically transmissive material. The first layer can include the input surface and further include a first profiled surface opposite the input surface. The second layer can include a second profiled surface adjacent and complementary to the first profiled surface, with the second layer further including a third profiled surface opposite the second profiled surface. The third layer can include a fourth profiled surface adjacent and complementary to the third profiled surface, the third profiled surface and the fourth profiled surface defining the at least one optical output aperture.

The solar panel can be such that the light-insertion stage and the optical waveguide stage are formed in a same optically transmissive material.

The solar panel can be such that the light insertion stage has a first section having a first set of optical elements spaced-apart from each other along a first set of substantially concentric circle arcs and a second section having a second set of optical elements spaced-apart from each other along a second set of substantially concentric circle arcs. The first set of optical elements can direct a first portion of the light in a first direction and the second set of optical elements can direct a second portion of the light in a second direction distinct from the first direction. The second direction can be opposite the first direction. The first section of the light-insertion stage can have at least one first section optical output aperture and the second section of the light-insertion stage can have at least one second section optical output aperture, the optical waveguide stage having a first section optically coupled to the at least one first section optical aperture and a second section optically coupled to the at least one second section optical aperture.

In a further aspect, there is provided a light-guide solar panel that comprises a light-insertion stage having an input surface for receiving light, optical elements and at least one optical output aperture, the optical elements being formed between the input surface and the at least one optical output aperture to direct the light from the input surface to the at least one optical output aperture; an optical waveguide stage having an output surface, the optical waveguide stage being optically coupled to the at least one optical output aperture to receive the light therefrom, the optical waveguide stage for guiding the light towards the output surface; and a photovoltaic cell optically coupled to the output surface.

In yet a further aspect, there is provided a method of fabricating a light-guide solar panel. The method comprises steps of forming a light-insertion stage having an input surface for receiving light, optical elements and at least one optical output aperture, the optical elements being disposed between the input surface and the at least one optical output aperture to direct the light from the input surface to the at least one optical output aperture; forming an optical waveguide stage having an output surface; and optically coupling the optical waveguide stage to the at least one optical output aperture to receive the light therefrom, the optical waveguide stage for guiding the light towards the output surface.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIG. 22A shows a perspective view of a three-layer embodiment of the light-guide solar panel of the present invention;

FIG. 22B shows an exploded view of the embodiment of FIG. 22A;

FIG. 22C shows a side view of the embodiment of FIG. 22A;

FIG. 22D shows an enlarged view of FIG. 22C;

FIG. 23A shows a perspective view of a two-layer embodiment of the light-guide solar panel of the present invention;

FIG. 23B shows an exploded view of the embodiment of FIG. 23A;

FIG. 23C shows an enlarged view of the embodiment of FIG. 23A;

FIG. 25A shows a perspective view of a two-layer embodiment of the light-guide solar panel of the present invention;

FIG. 25B shows an exploded view of the embodiment of FIG. 25A;

FIG. 25C shows an enlarged view of the embodiment of FIG. 25A;

FIG. 33A shows a prism;

FIG. 44A shows a cross-sectional view of an element of an embodiment of the light-guide solar panel of the present invention;

FIG. 44B shows a top view of embodiment of FIG. 44A;

FIG. 44C shows a side view of the embodiment of FIG. 44A;

DETAILED DESCRIPTION

Generally, the present invention provides a solar energy system that uses a light-guide solar panel (LGSP) to trap light inside a dielectric or other transparent panel and propagates the light to one of the panel edges for harvesting by a solar energy collector (SEC). This allows for very thin modules whose thickness is comparable to the height of the SEC, which can be, for example, a PV cell, at the edge of the module, thus eliminating the depth requirements inherent in traditional solar energy systems such as CPV systems. Light striking the LGSP is redirected and trapped internally so that it exits the panel through one of its edges where a SEC receives it.

LGSPs of the present invention can be combined in clusters to make modules. The LGSP optics can be designed structurally to be largely self-supporting, meaning that they do not require any substantial external enclosure to maintain their shape and orientation. A full enclosure can be added to the LGSP. As will be described below, to minimize material use and cost, LGSP modules can be supported by an axle-and-rib configuration.

Concentrated sunlight may be harnessed for a purpose other than creating electricity with (PV) cells. One alternate use is the heating of an element. The modules can also be configured to heat water while simultaneously generating electricity. It is also possible to couple the concentrated light into a fiber optic or other light-guide to propagate it to another location for some other use, such as to a lighting fixture to provide solar lighting.

Figure 1:
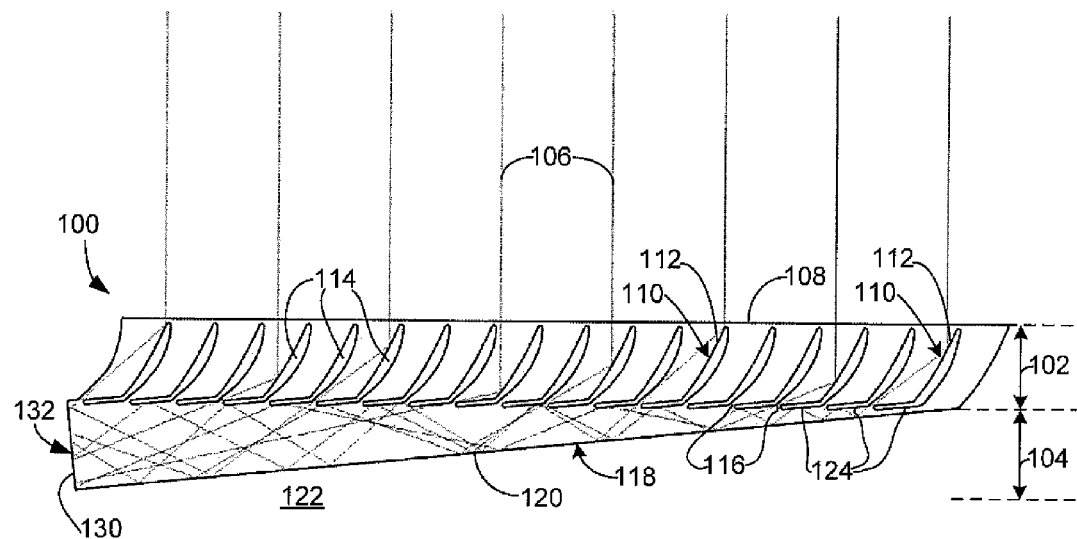
FIG. 1 shows a first embodiment of the light-guide solar panel of the present invention.
Figure 2:
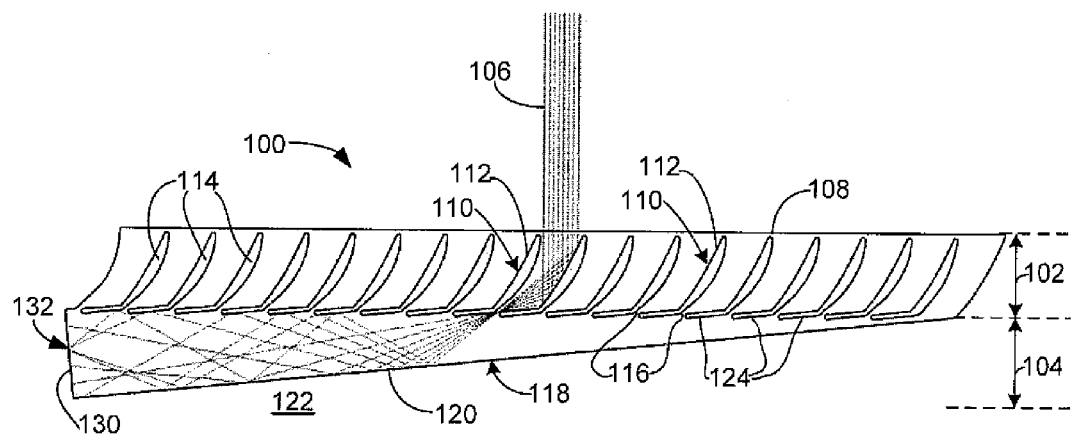
FIG. 2 shows the embodiment of FIG. 1 with a plurality of light rays being focused by a single reflector.

FIGS. 1 and 2 shows a cross-sectional view of a first embodiment of a LGSP 100 of the present invention. The panel 100 has a light-insertion stage 102 and an optical waveguide stage 104, which can both be made of any suitable optically transmissive material. The light-insertion stage 102 receives sunlight 106 at its input surface 108 and from there, the sunlight 106 is guided towards optical elements such as, for example, a series of reflectors 110. The reflectors 110 are defined by the interfaces 112 between the optically transmissive material of the light insertion stage 102 and the material making up areas 114. The angle at which the interfaces 112 lie with respect to the impinging sunlight 106 and the ratio of the refractive index of the optically transmissive material of the light-insertion stage 102 to the refractive index of the material of areas 114, are chosen such that the sunlight 106 impinging on the interfaces 112 goes through total internal reflection. Typically, the material 114 is air or any other suitable gas; however, any other suitable material can also make up the material 114. The materials of the light-insertion stage 102 and of the optical waveguide stage 104 can include, for example, any type of polymer or acrylic glass such as poly (methyl-methacrylate) (PMMA), which has a refractive index of about 1.49 for the visible part of the optical spectrum. Any other suitable material can also be used. The angle at which the interfaces 112 lie with respect to the impinging sunlight 106 ranges from the critical angle to 90°, as measured from the surface normal of the interface 112 (e.g., for a PMMA-air interface, the angle is comprised substantially between about 42.5° and 90°).

The reflectors 110 are shaped as parabolic reflectors; however, they can be of any other suitable shape. If the spacing between the reflectors is "A" and the origin of the system of coordinates is an aperture 116, then an exemplary equation of the corresponding parabola is $y=(1/2A)x^2-1/4$. As shown at FIG. 1, each reflector 110 directs the sunlight 106 toward a respective output optical aperture 116 by focusing the sunlight 106 at the output optical aperture 116. FIG. 2 shows the focusing of sunlight 106 by a same reflector 110. The sunlight 106 so focused enters the optical waveguide stage 104, which includes a wall 118 towards which the sunlight 106 propagates. The wall 118 has a first surface 120 between the optically transmissive material of the optical waveguide stage 104 and the material 122, which lies on the other side of the wall 118. The angle at which lies the interface 118 can lie with respect to the horizontal is in the range of 1-5°; however, any other suitable angle will also work. The orientation of the wall 118 with respect to the sunlight 106 coming from the apertures 116, and the ratio of the refractive index of the optically transmissive material of the optical waveguide stage 104 to the refractive index of the material 122, are chosen such that the sunlight 106 impinging on the first surface 120 goes through total internal reflection. The material 122 can be air or any other suitable gas; however, any other material having a refractive index lower than that of the optical waveguide stage 104 can also make up the material 122. As for the materials of the light-insertion stage 102 and of the optical waveguide stage 104, they can include, for example, any type of polymer or acrylic glass such as PMMA. Any other suitable material can also be used.

Figure 3:
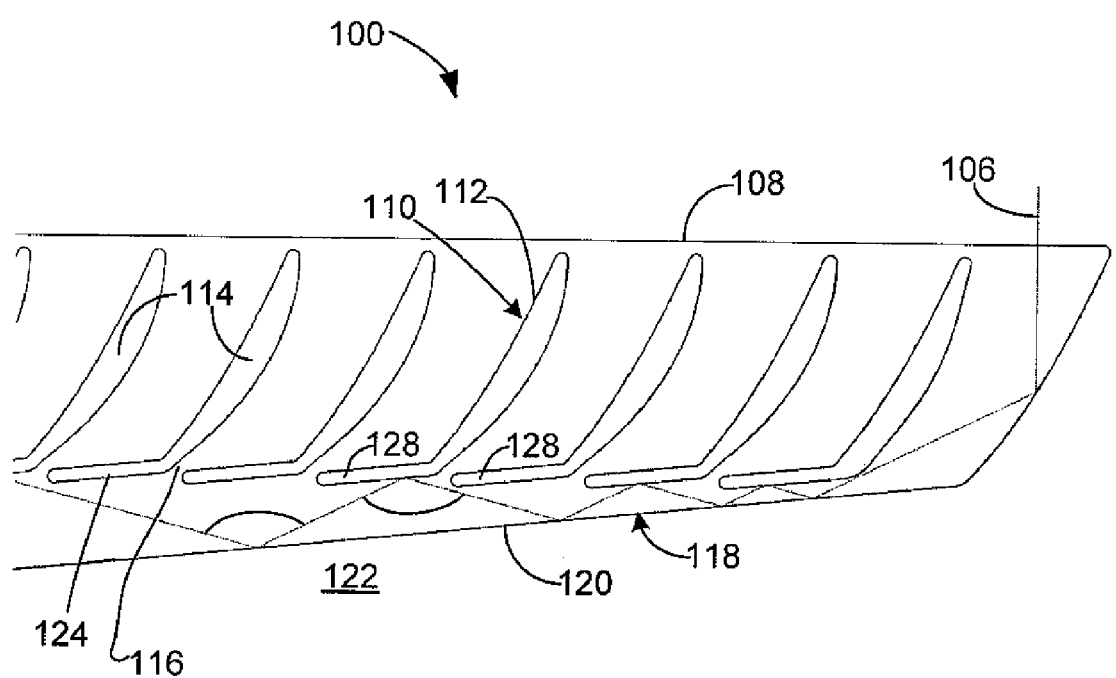
FIG. 3 shows details of the embodiment of FIG. 1.

Once the sunlight 106 is totally internally reflected at the first surface 120, it propagates in the optical waveguide stage 104 towards as series of reflecting elements 124 that reflect the sunlight 106 towards the first surface 120 where the sunlight 106 once again goes through total internal reflection. As shown at FIG. 3, each reflecting element 124 is defined by an interface between the optically transmissive material of the optical waveguide stage 104 and the material making up area 128, which can be the same material as that of areas 114. The orientation of the reflecting elements 124 with respect to the sunlight 106 coming from the first surface 120, and the ratio of the refractive index of the optically transmissive material of the optical waveguide stage 104 to the refractive index of the material 128, are chosen such that the sunlight 106 impinging on reflecting elements 124 goes through total internal reflection. However, the function of the reflecting elements 124, the first surface 120 and the reflectors 110 need not be based on total internal reflection and can include, for example, a suitable type of mirror.

As shown in the exemplary embodiments of FIGS. 1-3, each reflecting element 124 is planar and lies at a non-parallel angle (e,g., 1-5°) to the input surface 108. Additionally, each reflecting element 124 lies at a substantially same distance from the input surface 108 and is substantially parallel to the first surface 120. As such, the optical waveguide stage 104, as shown at FIGS. 1-3, generally has the shape of a wedge, which acts to propagate the sunlight 106 being input in the optical waveguide stage 104 through the optical output apertures 116 in the direction where the wedge widens, which is referred to as the downstream direction. Therefore, the optical waveguide stage 104 is such that after multiple successive total internal reflections at the first surface 120 and at the reflecting elements 124, the sunlight 106 reaches an output surface 130 (FIGS. 1 and 2), which is part of a sidewall 132, where a SEC (not shown) of any suitable type can be disposed to harvest the energy carried by the sunlight 106.

FIGS. 1 and 2 show the sidewall 132 as being non-perpendicular to the input surface 108; however, the sidewall 132 can lie at any suitable angle from the input surface 108. Further, as will be understood by the skilled worker, the LGSP 100 can have any suitable number of reflecting elements 124 and any suitable number of output optical apertures 116.

FIG. 3 shows that in the embodiment where the each reflecting element 124 is parallel to the wall 118. In this embodiment, the angle of incidence remains constant as a ray of sunlight 106 propagates in the downstream direction.

Figure 4:
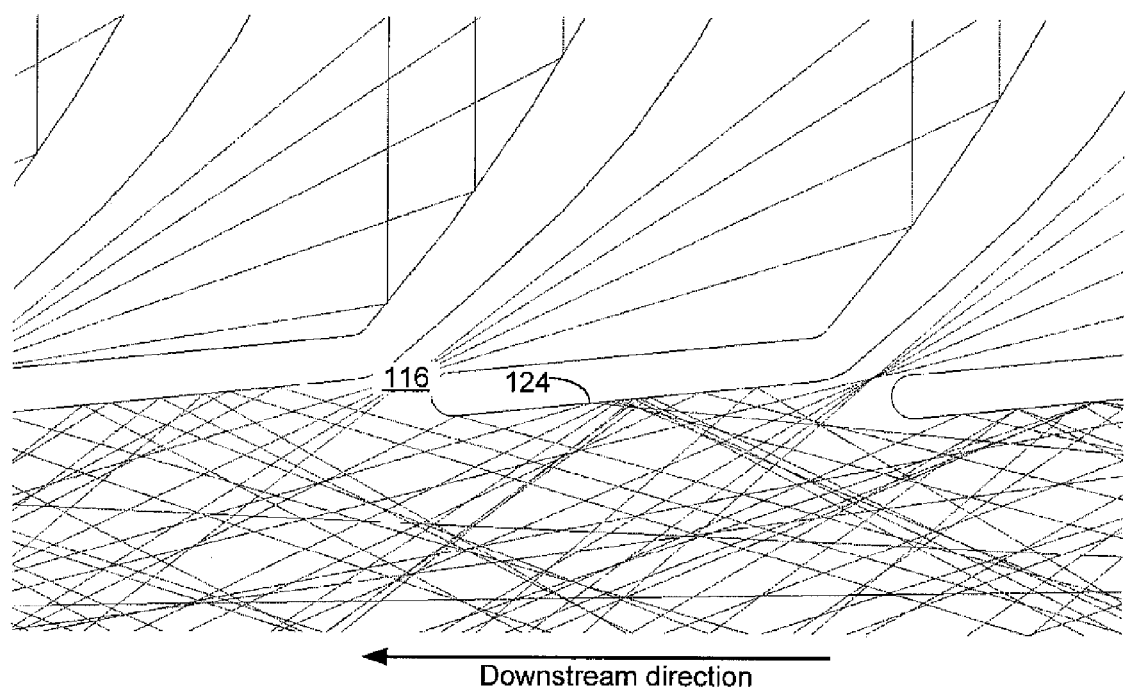
FIG. 4 shows an enlarged view of the embodiment of FIG. 1.

FIG. 4 shows that the reflecting elements 124 can be formed such that sunlight 106 coming from the first surface 120 (FIG. 1) and propagating towards the light-insertion stage 102 will be reflected off a reflecting element 124 and not impinge on an output optical aperture 116.

Figure 5:
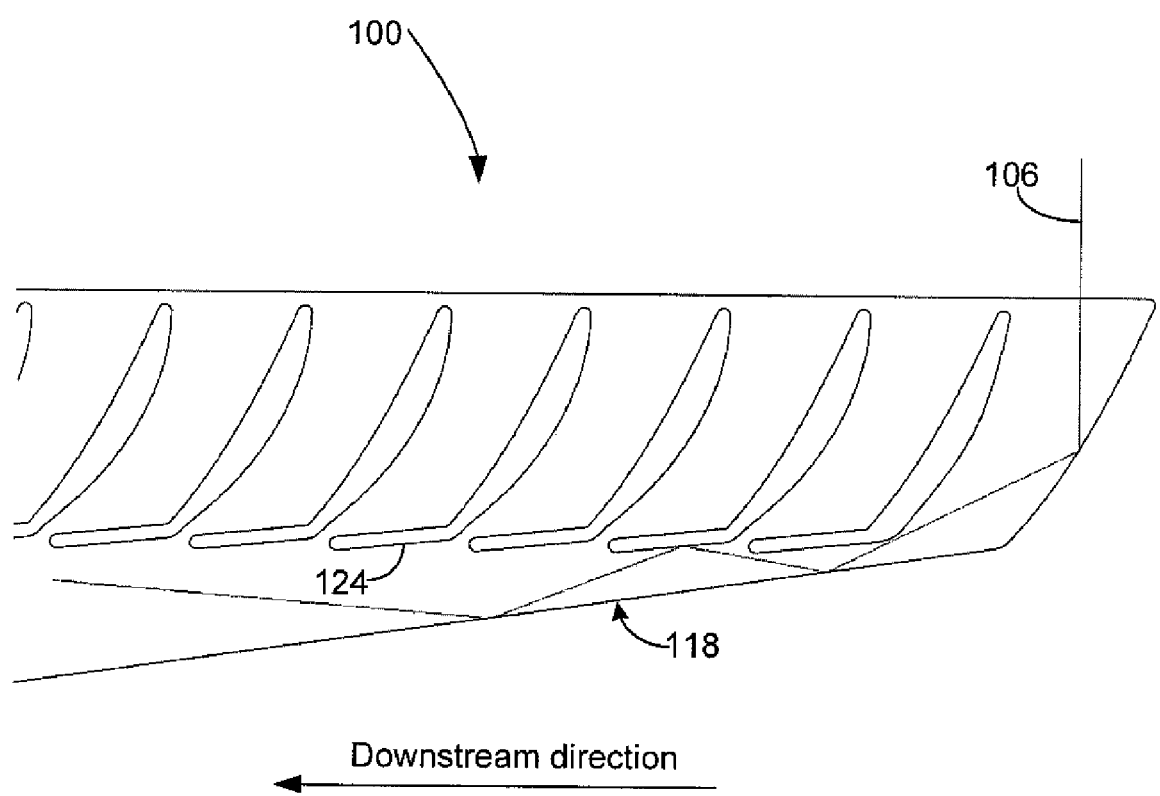
FIG. 5 shows the light-guide solar panel where light rays remain trap in an optical waveguide stage.
Figure 6:
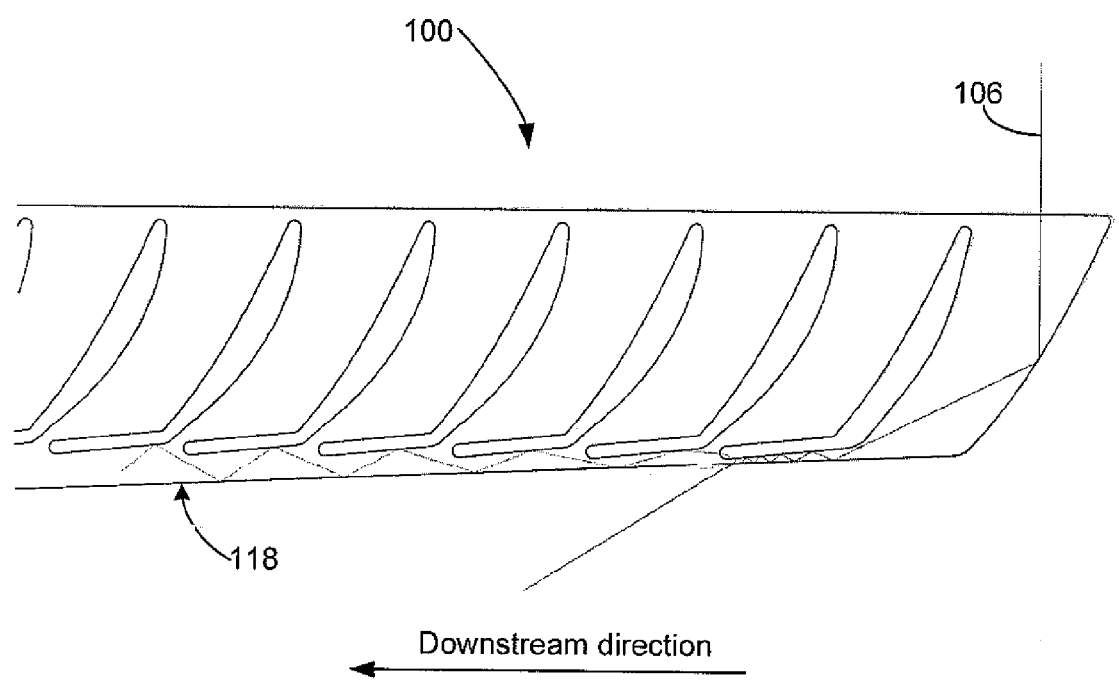
FIG. 6 shows a light-guide solar panel where light rays escape from the optical waveguide stages.

FIG. 5 shows another embodiment of the present invention where the angle between the wall 118 and the reflecting elements 124 is not parallel but opens in the downstream direction. In this embodiment, it can be shown that the sunlight 106 will remain trapped in the optical waveguide stage 104. FIG. 6 shows an embodiment where the angle between the wall 118 and the reflecting elements closes in the downstream direction. In this embodiment, it can be shown that the sunlight 106 eventually transmits out of the optical waveguide stage 104.

Figure 7:
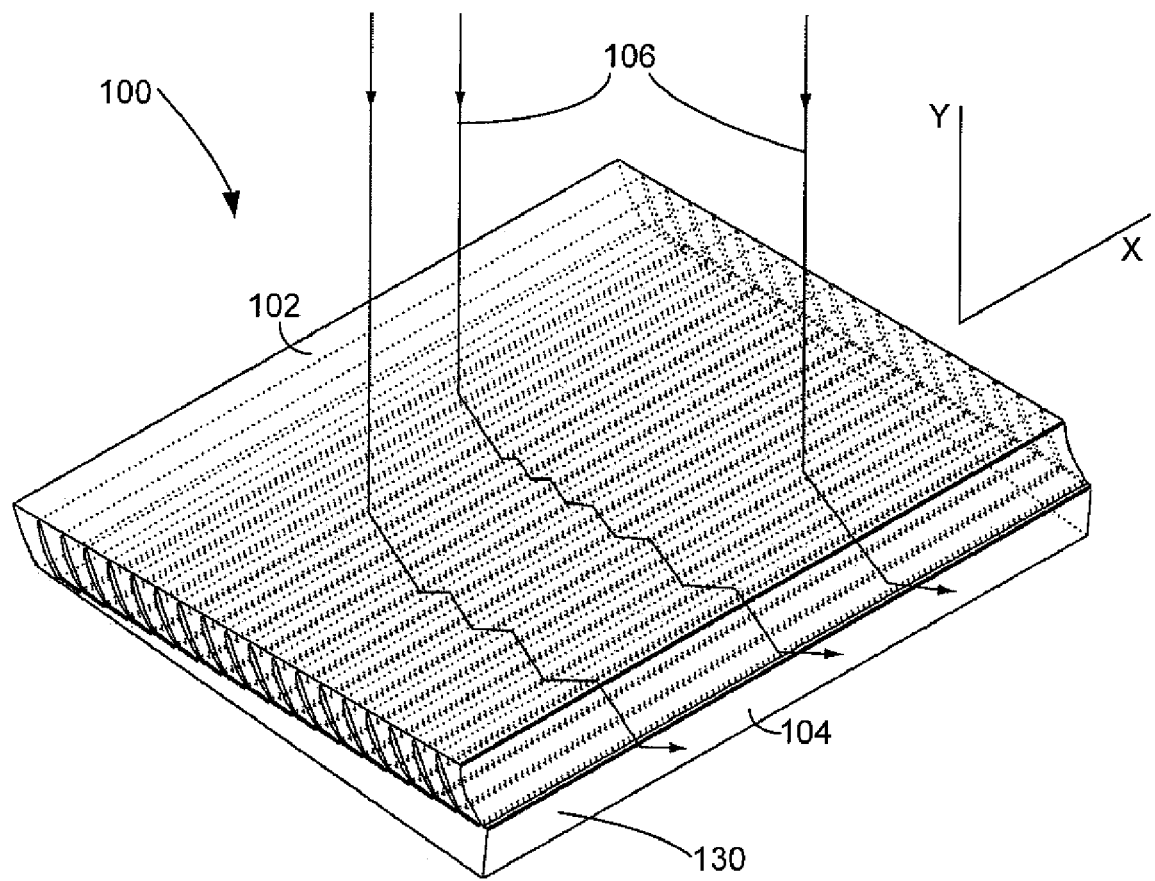
FIG. 7 shows a perspective view of a linear geometry embodiment of the light-guide solar panel of the present invention.

FIG. 7 shows a perspective view of a LGSP 100 that can have the cross-section shown at FIG. 1. The LGSP 100 of FIG. 7 concentrates the sunlight 106 on the sidewall 132. The embodiment of the LGSP 100 of FIG. 7 can be referred to as having a linear geometry since the reflectors 110 all lie along parallel lines.

Figure 8:
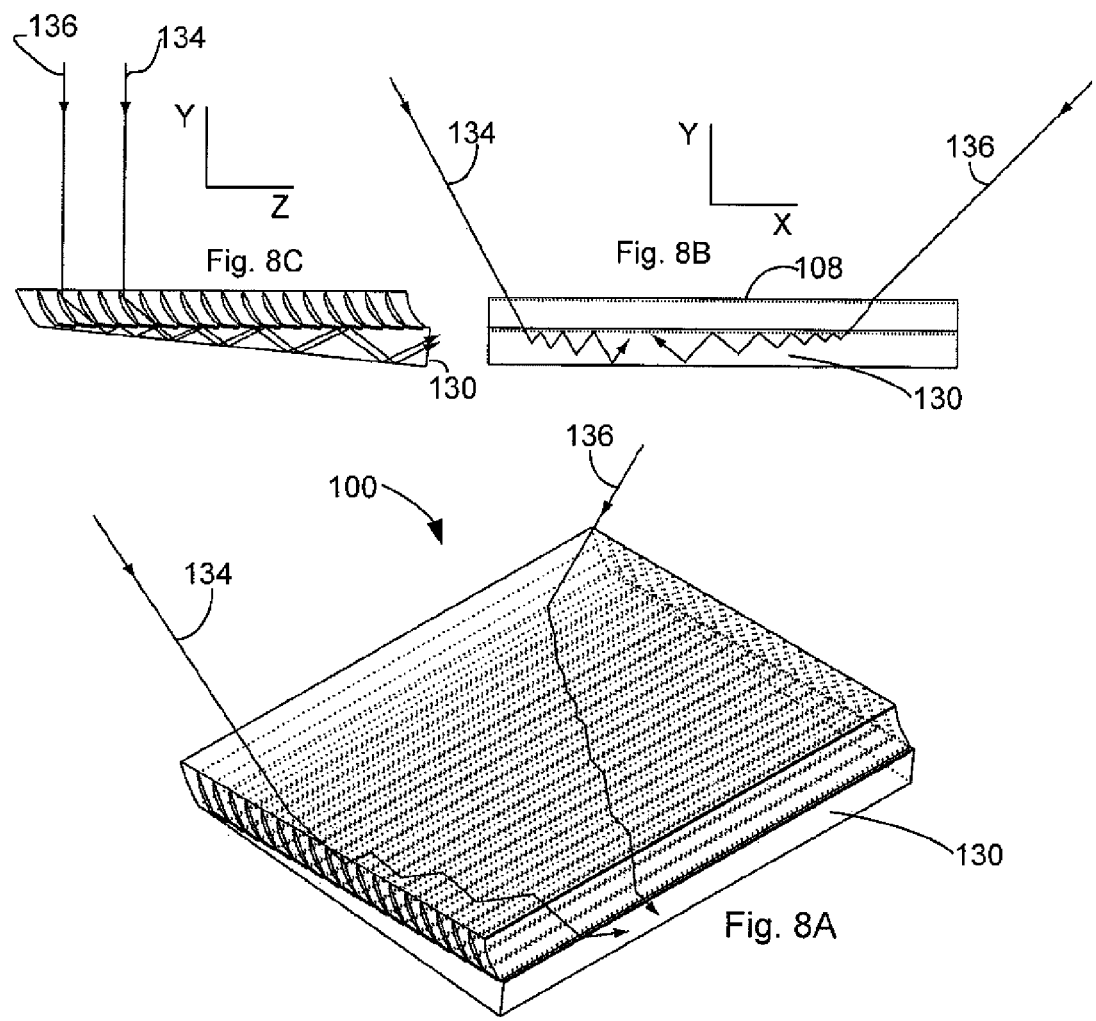
FIG. 8A shows a side view of the embodiment of FIG. 7 with two light rays propagating therein.
FIG. 8B shows a front view of the embodiment of FIG. 7 with two light rays propagating therein.
FIG. 8C shows a perspective view of the embodiment of FIG. 7 with two light rays propagating therein.

The performance of the LGSP 100 of FIG. 7 is substantially invariant to changes in the angle of incidence of the sunlight 106 in the plane defined by the X and Y axes. This invariance is shown at FIGS. 8A-8C where rays 134 and 136, respectively incident on the input surface 108 at 30° and 45° are directed to the optical waveguide stage 104 by the light-insertion stage 102, and propagate downstream in the optical waveguide stage 104 towards the output surface 130. Because of this invariance to angle of incidence in the X-Y plane, the LGSP 100 of FIG. 7 can be used in conjunction with any suitable single axis sun tracker to effectively concentrate the sunlight 106 to an edge of the panel, i.e., to the output surface 130. As will be understood by the skilled worker, a single axis tracker keeps the panel in a constant alignment with the sun so as to maximize the amount of sunlight captured by the LGSP 100.

Figure 9:
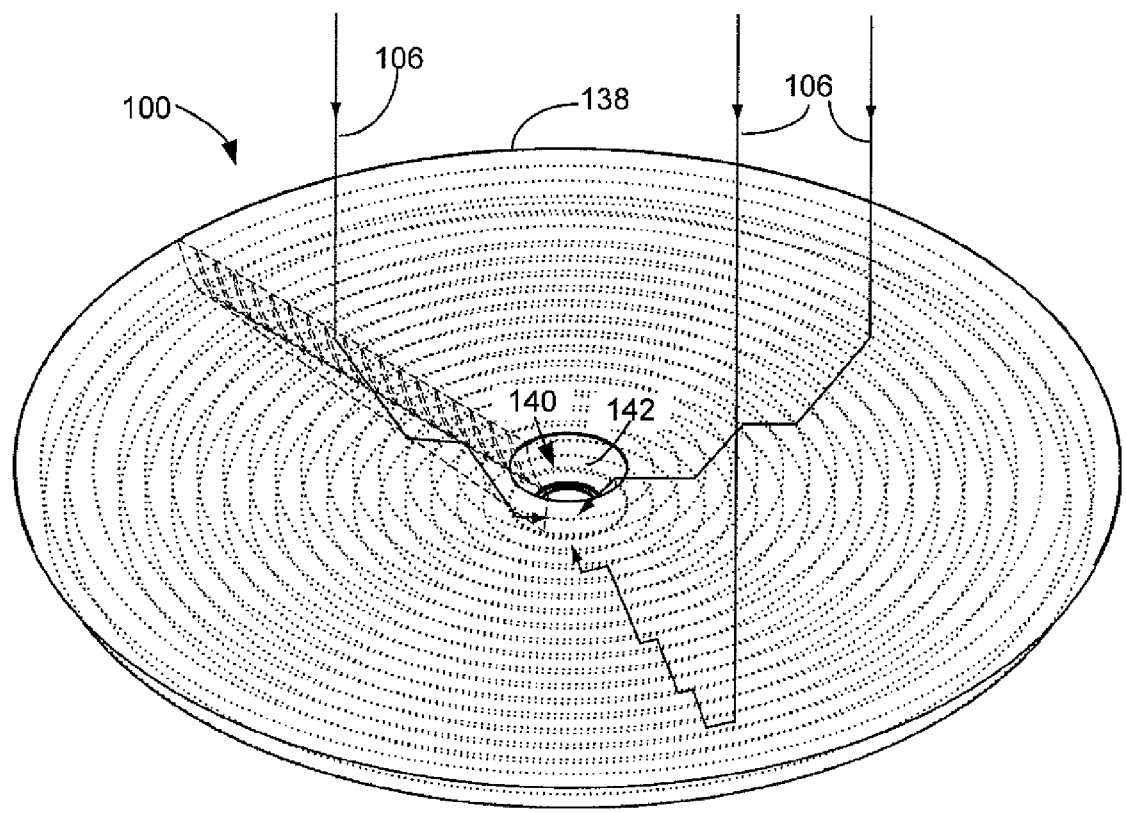
FIG. 9 shows a perspective view of a revolved geometry embodiment of the light-guide solar panel of the present invention.

FIG. 9 shows a perspective view of another LGSP 100 that can have the cross-section shown at FIG. 1. The LGSP 100 of FIG. 9 is substantially shaped as a discus 138 and concentrates the sunlight on an inner wall 140 formed in the hub region of the discus 138, the inner wall 140 acting as an output surface 142, which can be optically coupled, through any suitable way, to any suitable SEC. Examples of how the sunlight 106 can be coupled to a SEC are discussed further below. The embodiment of the LGSP 100 of FIG. 9 can be referred to as having a revolved geometry since the reflectors 110 lie on concentric circles. SECs include, for example, photovoltaic detectors, solar cells, fiber-optic collectors which gathers incident sunlight and transmits it by fiber-optics to the interior of a building for use in lighting fixtures and thermal collectors such as for heating water, or any combination thereof.

Figure 10:
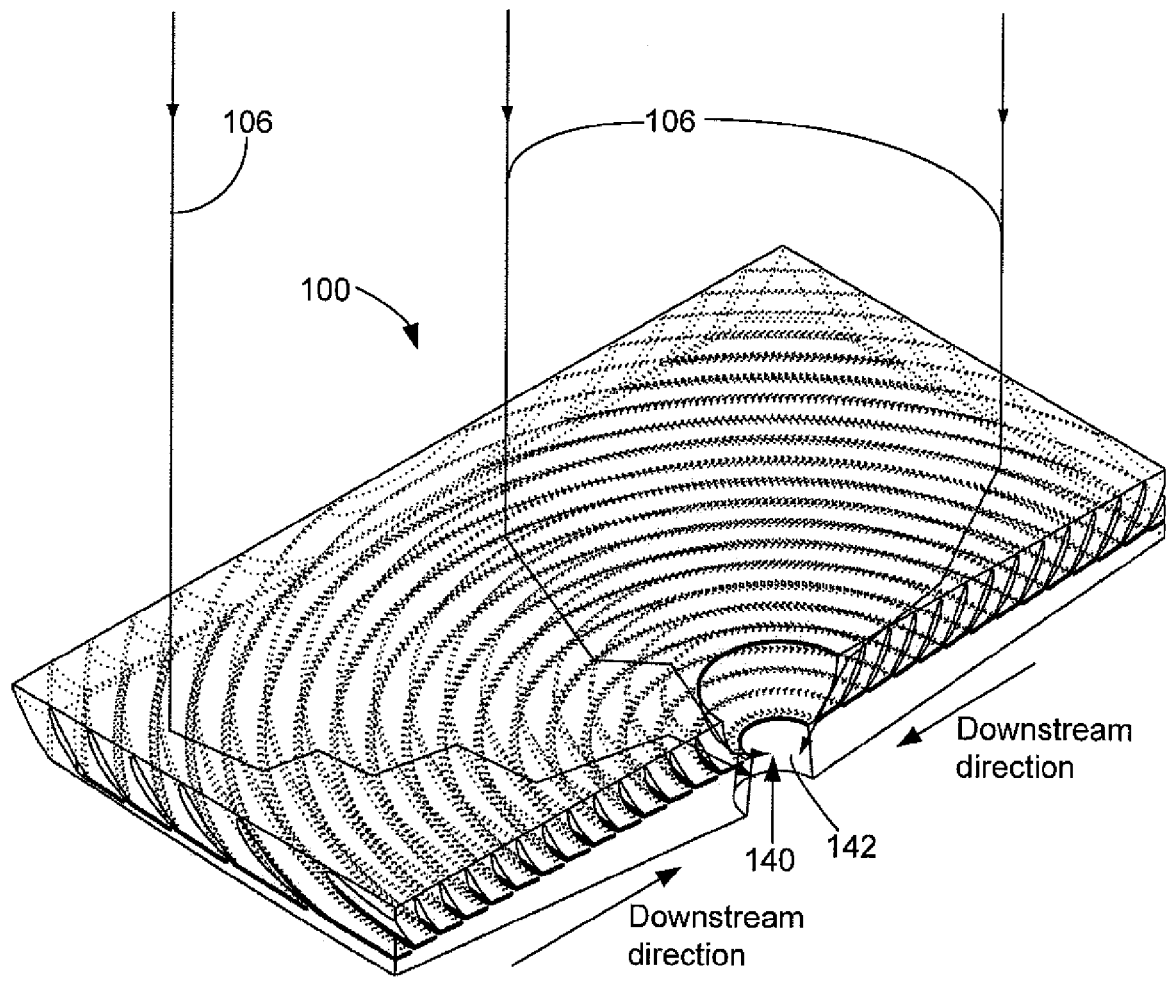
FIG. 10 shows a perspective view of a rectangular section of the embodiment of FIG. 9.
Figure 11:
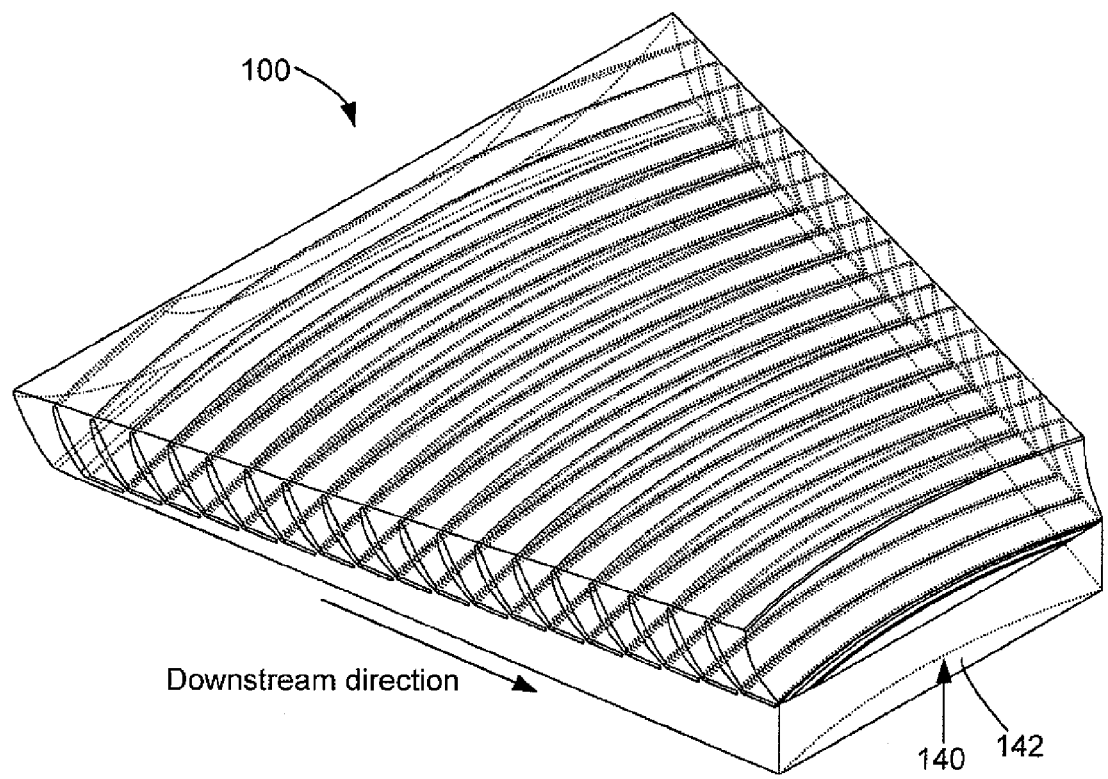
FIG. 11 shows a perspective view of an slice section of the embodiment of FIG. 9.

The LGSP 100 of FIG. 9 can be sectioned off in rectangular panes, as shown at FIG. 10, or in angular slices, as shown at FIG. 11, or in any other suitable shape, in order to adapt to any desirable mounting bracket or structure (not shown).

As will be understood by the skilled worker, the LGSPs 100 shown at FIGS. 7-11 can be mounted to any suitable type of sun tracking systems such as, for example, single axis tracking systems and dual axis tracking systems. For the LGSPs 100 of FIGS. 7-11, design tradeoffs can be made between concentration and angular sunlight acceptance, which in turn determine the required alignment and tracking precision. The LGSP 100 of FIG. 7 can achieve, for example, concentrations of 20-50 suns and require single axis solar tracking of approximately 1°. The LGSP 100 of FIG. 10 can achieve, for example, concentrations of approximately 500-1000 suns and require dual axis tracking of approximately 1°. Having a larger hub region at the center of the LGSP 100 of FIG. 10, i.e., having a larger opening at center of the LGSP 100, will produce less concentration than if the hub region were smaller and will require less accurate tracking.

As will be understood by the skilled worker, the ratio of the width of the optical output aperture 116 to the horizontal span of the reflector 110 determines the concentration. If the ratio is made very small, such that the optical output aperture 116 is extremely tight then the concentration can be made very high however the angular acceptance will be very small. The ratio between the width of 116 and the horizontal span of 110 also affects the angle of the first surface 120, as a tighter aperture allows for the angle between the surfaces 118 and 108 to be smaller, such as, for example, 1°. This in turn can leads to a smaller sidewall 132, and hence a smaller SEC.

Figure 12:
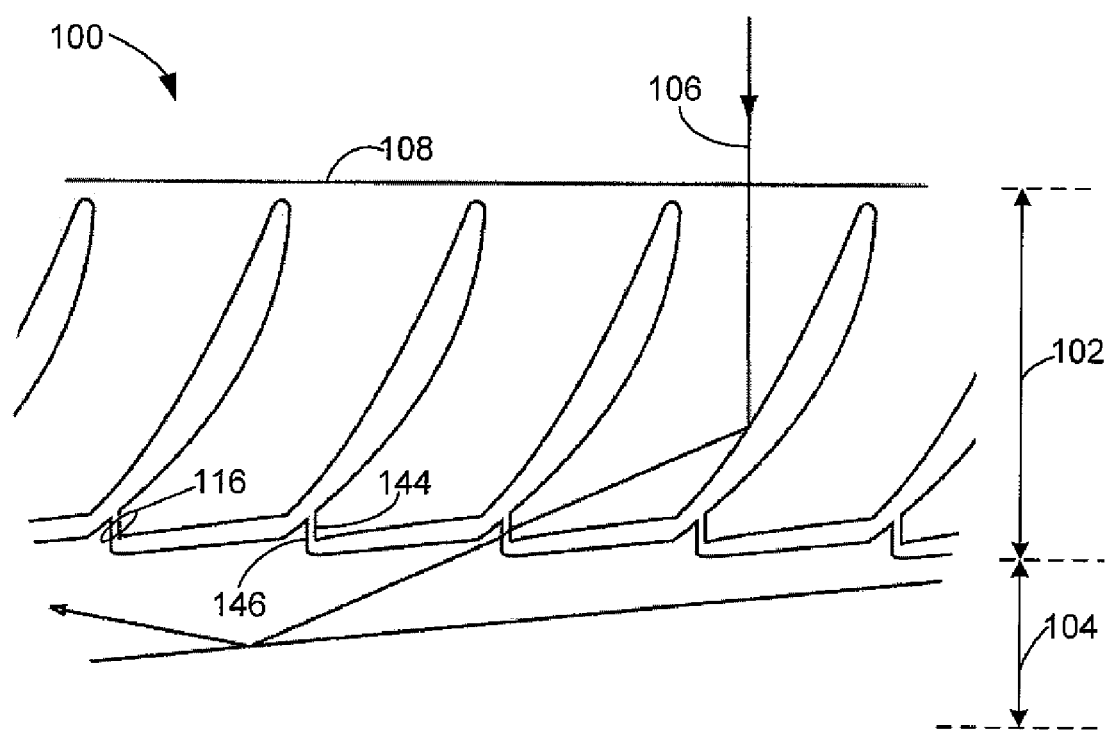
FIG. 12 shows a portion of a two-layer light-guide solar panel embodiment of the present invention.

For fabrication purposes, the light-insertion stage 102 and the optical waveguide stage 104, for the LGSP 100 of, for example, FIGS. 7 and 10, can form distinct layers as shown at FIG. 12. This creates an exit face 144 in the light-insertion stage 102 and an injection face 146 in the optical waveguide stage 104. The exit face 144 and the injection face 146 need not be parallel or flat. The exit face 144 and the injection face 146 are part of the optical output aperture 116.

Figure 13:
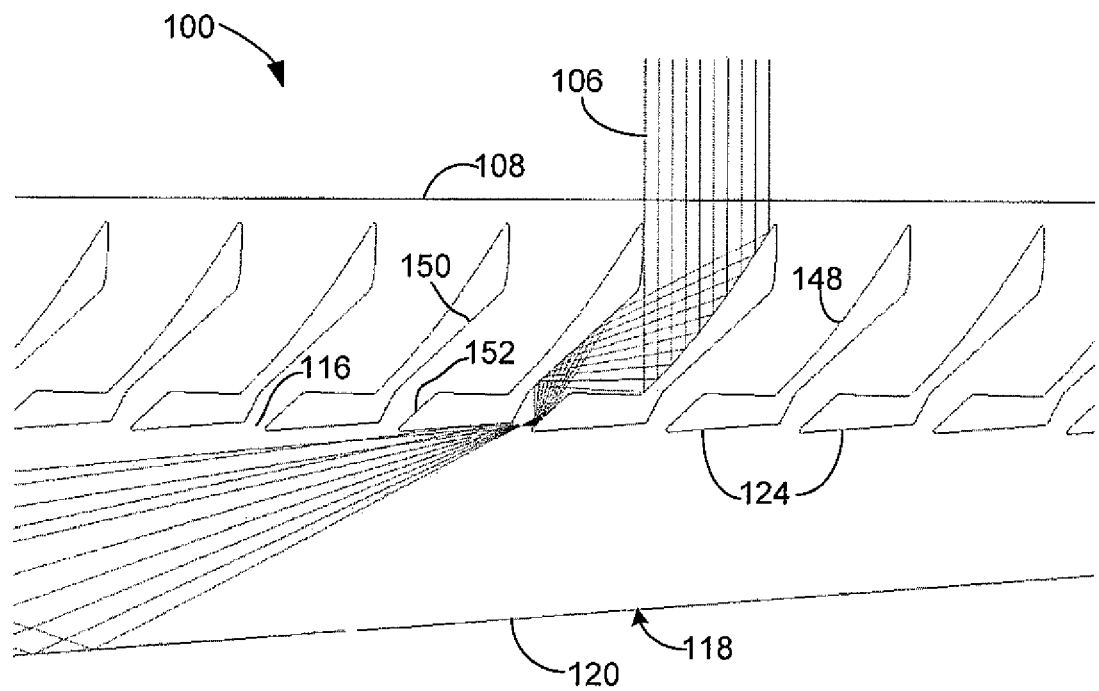
FIG. 13 shows a portion of an embodiment of the light-guide solar panel of the present invention where three reflections occur in the light-insertion stage.

FIG. 13 shows a cross-section of another embodiment of a LGSP of the present invention. In the embodiment of FIG. 13, the sunlight 106 bounces off a first reflector 148, a second reflector 150 and a third reflector 152 before being input into the optical waveguide stage 104 at the output optical aperture 116. The first, second and third reflectors are optical elements and can have any suitable shape such as, for example, flat, parabolic, hyperbolic, elliptical and round surfaces.

Further, any suitable optical elements such as, for example, lenses, Fresnel lenses, parabolic troughs, Cassegrain optics, Winston cones and tapered prisms can also be included in the light-insertion stage 102. The optical elements need only be able to deliver the sunlight 106 to the optical output apertures 116 in the general downstream direction of the optical waveguide stage. The optical waveguide stage 104 can be independent of the embodiment of the light-insertion stage 102, i.e., a same optical waveguide stage 104 can be used for different embodiments of the light-insertion stage 102.

Figure 14:
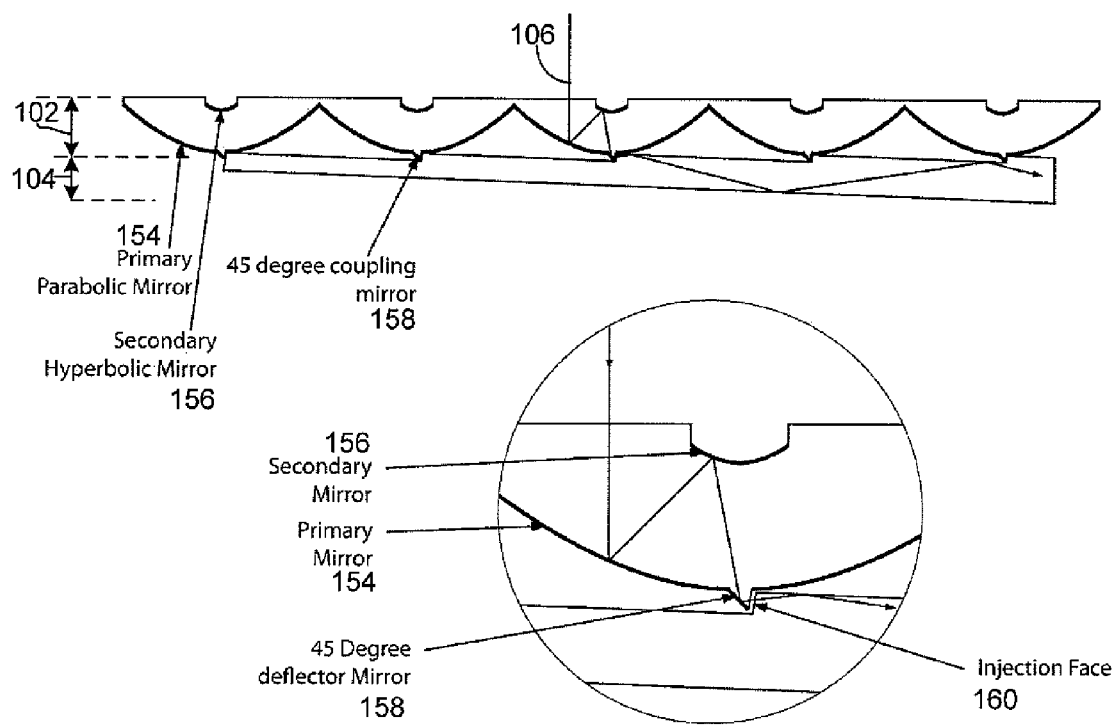
FIG. 14 shows an embodiment of the light-guide solar panel of the present invention where Cassegrain optics are used in the light-guide stage.

FIG. 14 shows an embodiment of the light-insertion stage 102 having a Cassegrain optic design. In this embodiment, a parabolic primary mirror 154 and a hyperbolic secondary mirror 156 are used to focus and direct the sunlight 106 at a flat reflector 158. The sunlight 106 reflects off the reflector 158 and enters the optical waveguide stage 104 at the injection face 160, which acts as an optical output aperture of the light-insertion stage 102. The embodiment of FIG. 14 can be used in a linear or revolved geometry LGSP. The Cassegrain optics of FIG. 14 require mirrored surfaces on the primary and secondary mirrors (154 and 156 respectively), as well as on the flat reflector 158.

Figure 15:
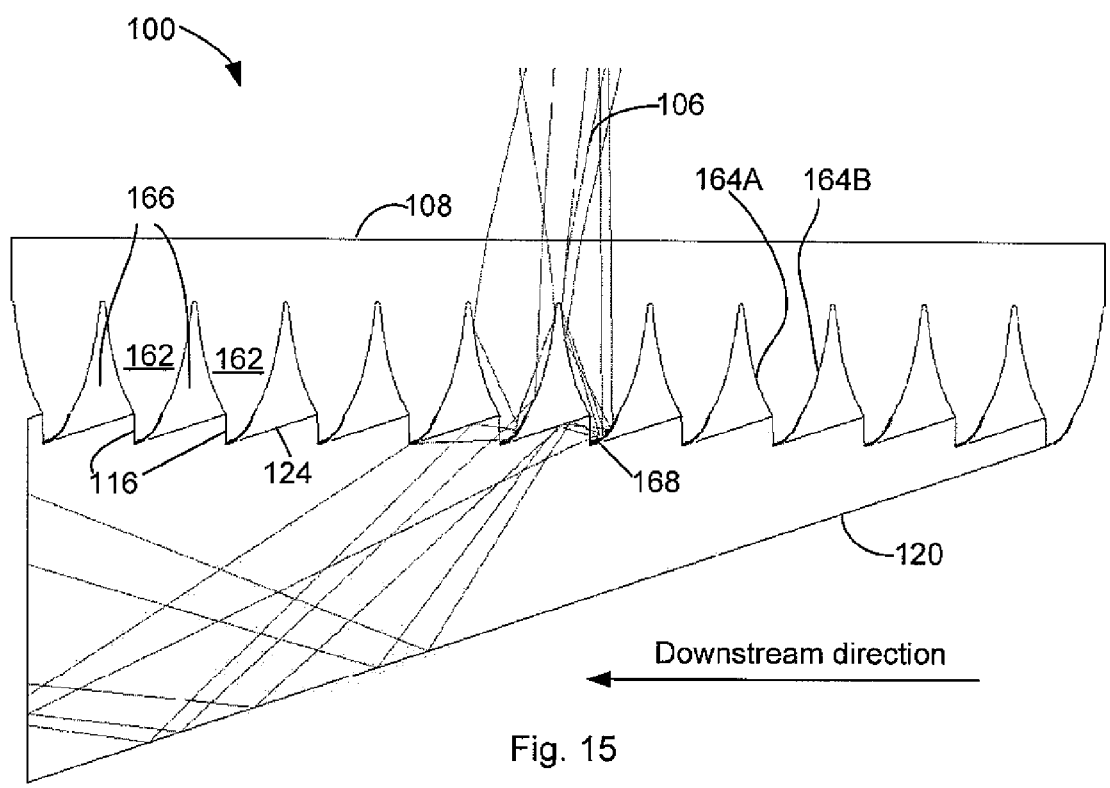
FIG. 15 shows an embodiment of the light-guide solar panel of the present invention where Winston cone optics are used in the light-guide stage.

FIG. 15 shows a light-insertion stage 102 having a series of Winston cones 162 defined by the interfaces 164A and 164B that lie between the optically transmissive material of the light-insertion stage 102 and the material 166, which can be air or any other suitable gas; however, any other suitable material can also make up the material 166. The geometry of the interfaces 164 with respect to the impinging sunlight 106 and ratio of the refractive index of the optically transmissive material of the light-insertion stage 102 to that of the refractive index of the material 166, are chosen such that the sunlight 106 impinging on the interfaces 164 goes through total internal reflection. For a given cone 162 defined by interfaces 164A and 164B, the sunlight 106 impinging on the interface 164A is reflected towards a reflector 168, which in turn directs the sunlight 106 at the optical output aperture 116. As for the sunlight 106 impinging on the interface 164B, depending on where on the interface 164B it reflects, it will either be reflected directly to the optical output aperture 116 or to the reflector 168, which will reflect it towards the optical output aperture 116. As for the sunlight 106 impinging directly on the reflector 168, it is also directed at the output optical aperture 116. After having entered the optical waveguide stage 104 through the optical output aperture 116, the sunlight 106 can either impinge on the first surface 120 or on the reflecting element 124, either way, the sunlight 106 undergoes total internal reflection and is propagated in the downstream direction. The reflector 168 can have any suitable geometry such as, for example, a rounded geometry, and can include any suitable type of mirrored coating. The light-insertion stage 102 of FIG. 15 can be used in a linear or revolved geometry LGSP. The light-insertion layer 102 of FIG. 15 can be used in non-tracking solar panels due to its relatively wide sunlight acceptance angle.

In the embodiments described above, increased concentration can be obtained by reducing the height of the optical waveguide stage 104 adjacent the output optical aperture of the optical waveguide stage. As described in the embodiments above, the optical waveguide stage 104 propagates the sunlight 106 by total internal reflection of the sunlight. In general, if the optical waveguide stage tapers or converges downstream as shown at FIG. 6, the sunlight will escape from the optical waveguide stage. However, this limitation does not apply to the last reflection within the optical waveguide stage since at this point, the sunlight is about to exit the optical waveguide stage 104. Immediately prior to harvesting of the sunlight by a SEC, the sunlight can be reflected at any suitable angle provided it still reaches the optical output aperture of the optical waveguide stage. Because the SEC will harvest the sunlight, the angle of incidence of the light matters less and, as such, the light can be pinched, or concentrated further, immediately prior to being harvested. The additional concentration achievable in this way depends upon the angular spread of the sunlight 106 within the optical waveguide stage 104, with greater concentration being achievable the more collimated the light within the light guide layer is. In typical embodiments the extra concentration can range, for example, between 1.5 times and 2 times.

Figure 16:
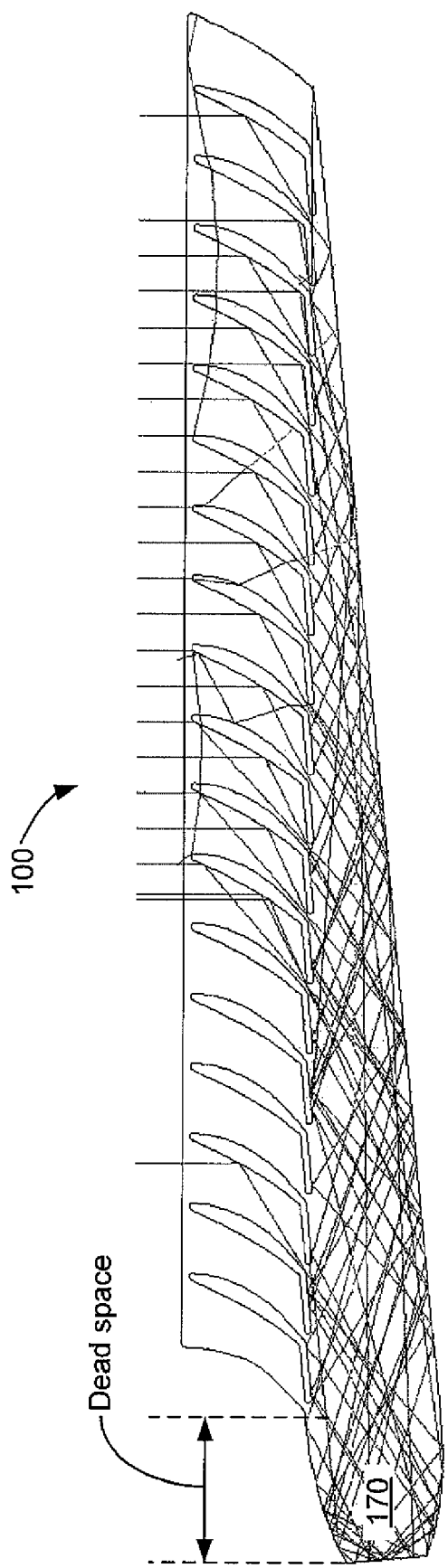
FIG. 16 shows an embodiment of the light-guide solar panel of the present invention where Winston cone optics are used in the optical waveguide stage.

The simplest way to add this extra concentration is to taper the light-guide layer close to the SEC. A good taper for concentration is a Winston Cone, which is an off-axis paraboloid, an example of which is shown at reference numeral 170 at FIG. 16. However, the inclusion of such a Winston cone 170 introduces dead space (defined as LGSP surface exposed to sunlight which does not capture and transmit light to the SEC) in the LGSP 100 because light incident on the Winston cone from above is substantially not captured. Such dead space leads to reductions in overall system efficiency in the use of space for converting solar energy to useful energy.

Figure 17:
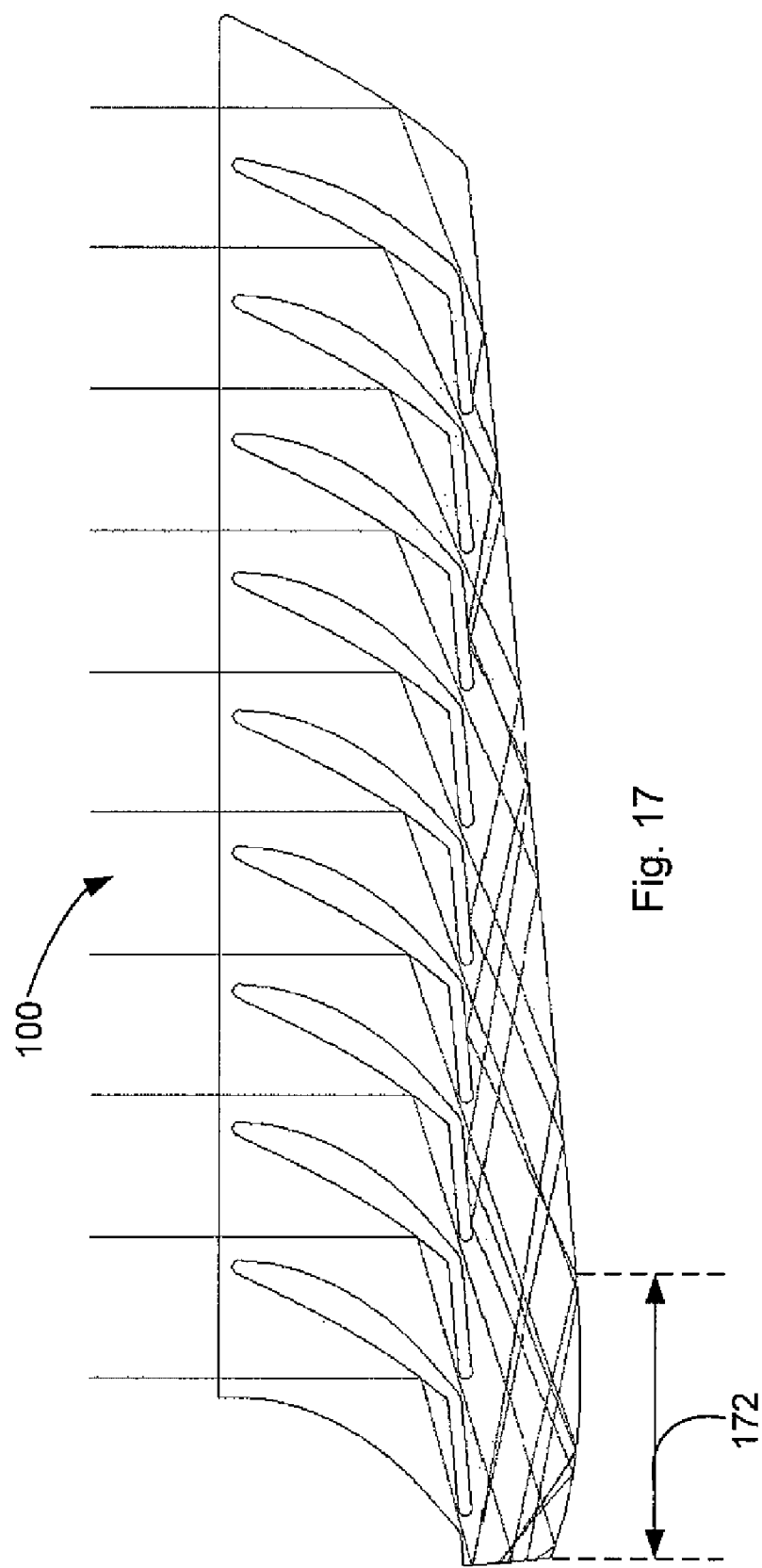
FIG. 17 shows an embodiment of the light-guide solar panel of the present invention where Winston half-cone optics are used in the optical waveguide stage.
Figure 18:
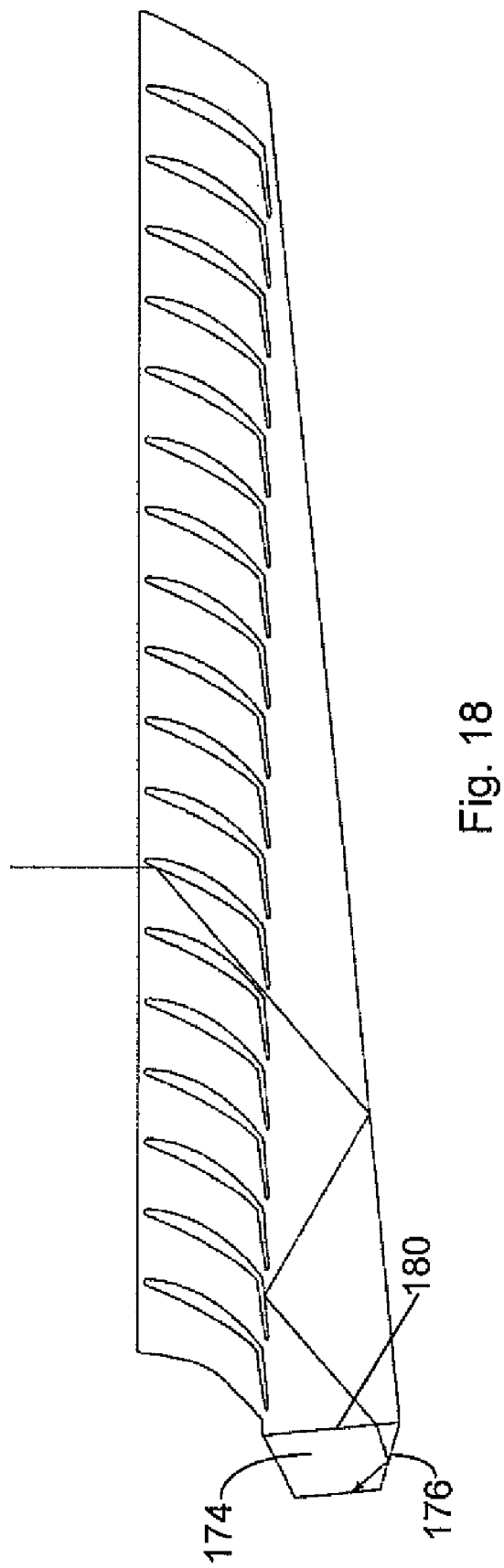
FIG. 18 shows an embodiment of the light-guide solar panel of the present invention where a flat-faceted concentrating element is used in the optical waveguide stage.

A compromise between extra concentration and dead space can be achieved by using a half Winston Cone 172 shown at FIG. 17. As another alternative, a flat faceted taper 174, as shown at FIG. 18, can be used to approximate the effect of a Winston cone. However, the flat faceted taper does not provide the same additional concentration that can be provided by a Winston cone. Despite this fact, and because flat elements are easier to fabricate than curved elements, the approach shown at FIG. 18 can be interesting.

The increased concentration described above can be achieved using a separate optical element, a pinch, which is made of an optically transmissive material and can be secured between the optical waveguide stage and the SEC (not shown). Such a pinch is shown at reference numeral 176 at FIG. 18. If the refractive index of the pinch 176 is greater than that of the optical waveguide stage, then further additional concentration can be gained. The additional concentration occurs because sunlight deflection occurs at the interface 180 between the optical waveguide stage and the pinch 176, and because the critical angle with a high index material (pinch 176) is lower.

An advantage of placing an optical element such as, for example, a pinch 176, between the optical waveguide stage and the SEC is that it can insulate the optical waveguide stage against heat accumulation at the SEC. This becomes important if the SEC becomes hotter than what can be withstood by the material of which the optical waveguide stage is made during worst-case operation.

Figure 19:
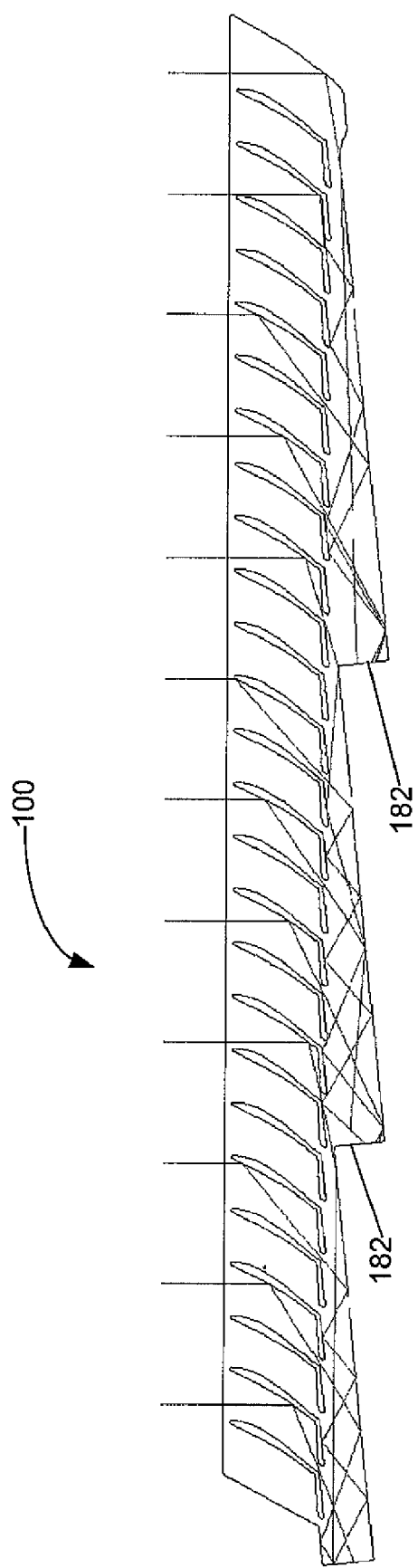
FIG. 19 shows an embodiment of the light-guide solar panel of the present invention where multiple output surfaces are present on the optical waveguide stage.

Another embodiment of the LGSP 100 of the present invention is shown at FIG. 19. This embodiment allows the optical waveguide stage 104 to provide sunlight to a series of SECs secured to a series of walls 182 defined by the optical waveguide stage 104. As will be understood by the skilled worker, the use the plurality of walls 182 make for a thinner optical waveguide stage 104.

Figure 20:
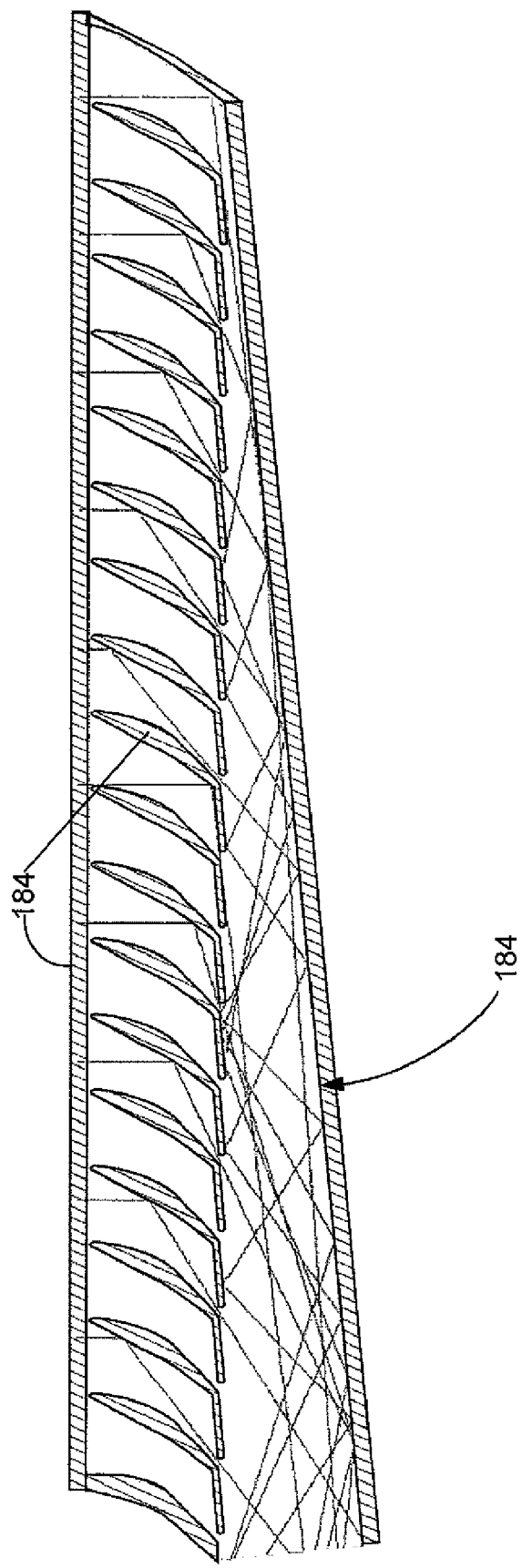
FIG. 20 shows an embodiment of the light-guide solar panel of the present invention where a cladding layer surround the panel.

To protect the input surface 108 of the light-insertion stage 102 and the first surface 120 of the optical waveguide stage 104, a cladding layer 184, shown at FIG. 20, can be applied to the input surface and/or to first surface. The cladding layer can have a refractive index lower that the refractive index of the light-insertion stage and lower than that of the optical waveguide stage. Further, the cladding layer 184 can also be applied to all spaces within the LGSP 100 that is usually occupied by air or gas.

The advantage of having such a cladding layer 184 is that it can protect the integrity of the LGSP. With such a cladding layer 184 present, the outer surface of the cladding may become dirty or scratched without compromising the function of the LGSP. The cladding layer 184 can be made of any suitable material such as, for example, fluorinated ethylene propylene. As will be understood by the skilled worker, the thickness of the cladding layer can be relatively thin and still be effective.

The LGSP embodiments presented above are scalable. That is, their dimensions can all change by a common factor without affecting the functioning of the optics, provided that the optics do not become so small that interference effects dominate. Such interference effects can become important when the spacing between staggered optical elements is on a scale comparable to the optical wavelengths. The most energetic wavelength portion of the solar spectrum is between 0.2 microns and 3 microns. Accordingly, the staggering period of the optical elements and the apertures as well as the size of the apertures can be kept larger than 3 microns to mitigate interference effects.

In order to use a minimum of material and keep costs low, it is desirable to make the optical elements small to minimize the thickness of LGSPs and to enable maximum area coverage with minimal material. The thickness of the optical waveguide stage (light-guide layer) will largely be limited by the size of the SECs (e.g., the size of PV cell strips) disposed to harvest the sunlight. In the case of PV cell strips, their size can vary, for example, from 1 millimeter to 1 centimeter, although larger or smaller PV cells would work equally well. The light-insertion stage (insertion layer) on the other hand can be made as thin as interference effects and fabrication methods can allow.

The LGSPs of the present invention can be fabricated by molding techniques such as injection molding, compression molding, injection-compression molding or by any other suitable methods. Generally speaking, parts made by molding cannot have undercuts, and as such it is not possible to mold the entire light-guide panels described above at once using conventional molding. However, the LGSP can be manufactured by dividing them into sections that can be molded individually. Two exemplary approaches for sectioning a LGSP for purposes of manufacturing are described below.

Figure 21:
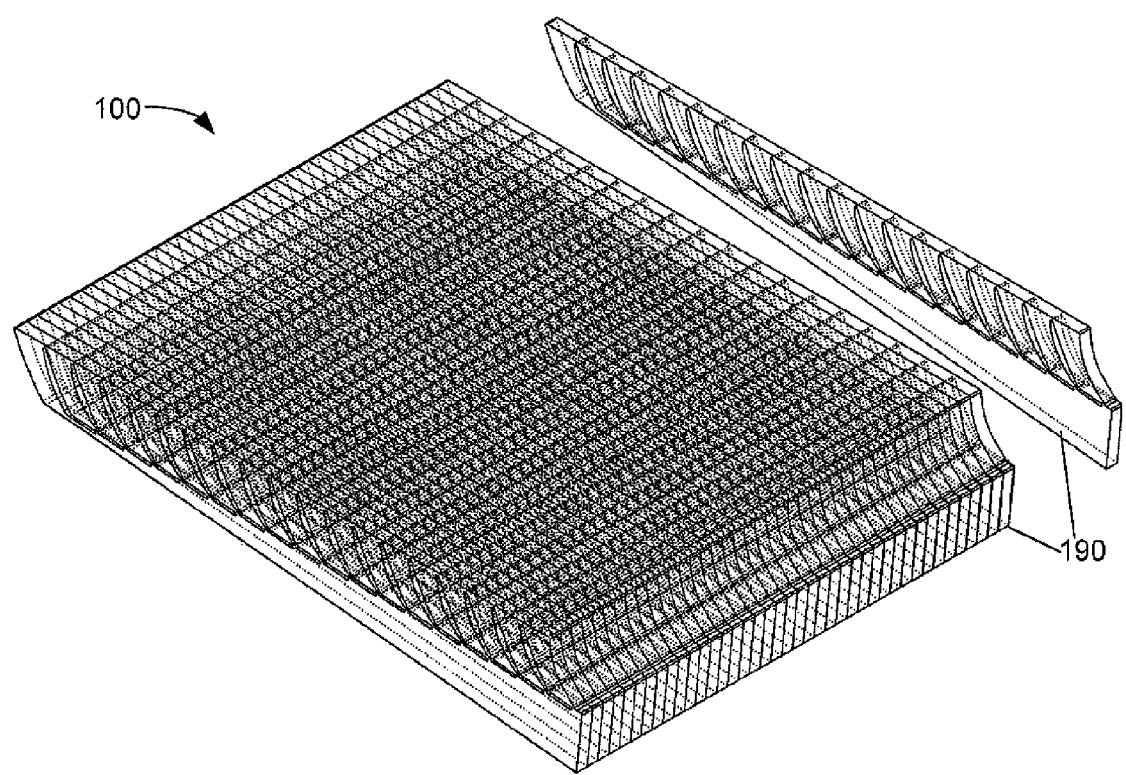
FIG. 21 shows an embodiment of the light-guide solar panel of the present invention made by assembling slices side by side.

A first approach it to manufacture thin vertical sections, or slices, of the LGSP and assemble them side by side as shown at FIG. 21. The separate slices 190 of the panel can be held together by an external bracing (not shown), or they can be glued or otherwise bonded together. This first approach (slice approach) is suitable for the linear geometry LGSPs.

A second approach is to fabricate horizontal slabs that can be stacked one on top of the other to make a LGSP. Such panels can be self-supporting, requiring little in the way of framing and enclosures, and can be such that no gluing or bonding is necessary. The slabs make up the functional layers previously described (light-insertion stage and optical waveguide stage); however, a given functional layer can be made up of any number of slabs.

FIGS. 22A-22D show one way to divide the LGSP 100 into three sheets with no undercuts. The top two sheets 192 and 194 act in concert to form the insertion layer (light-insertion stage 102), and the bottom sheet 196 forms the light-guide layer (optical waveguide stage 104). The embodiment shown at FIGS. 22A-22D is similar to that shown at FIG. 13. In the top slab 192, the sunlight 106 reflects by total internal reflection (TIR) off a parabolic reflector, it then exits the top slab 192 and enters the middle slab 194, then reflects by TIR off two flat facets before exiting the middle slab 194 and entering the bottom slab 196, which acts as the light-guide layer (optical waveguide stage 104).

Figure 24A:
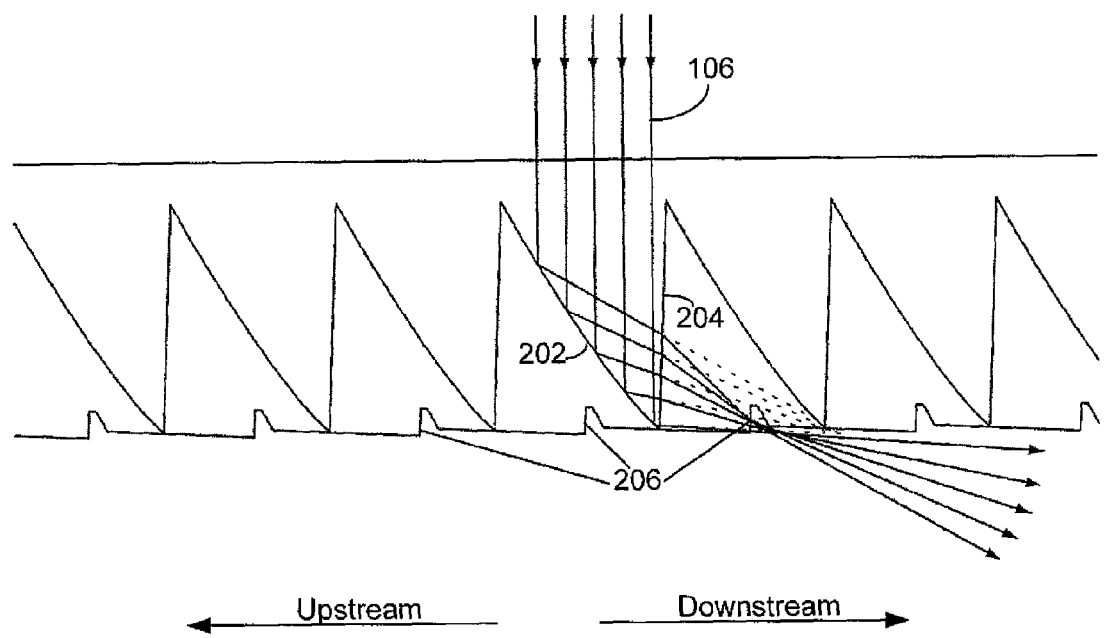
FIG. 24A shows an enlarged view of an embodiment of the light-guide panel of the present invention.
Figure 24B:
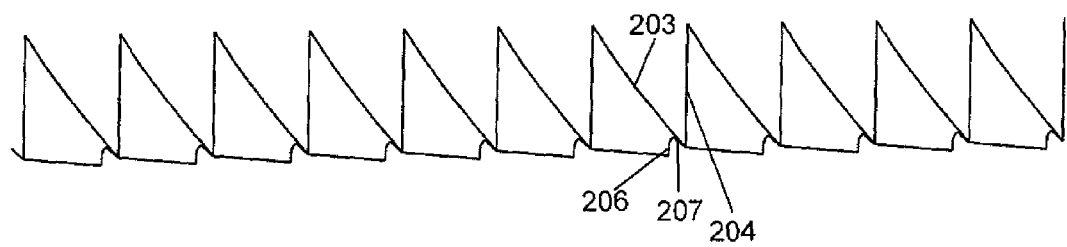
FIG. 24B shows an enlarged view of an embodiment of the light-guide panel of the present invention.

FIGS. 23A-23C show another potential division of the LGSP 100 into two slabs 198 and 200. The insertion layer and the light-guide layer are made with one slab each, slabs 198 and 200 respectively. As shown at FIG. 24A, sunlight 106 totally internally reflects off a parabolic surface 202 and then exits through a flat facet (exit surface) 204 into the air before encountering an injection face 206 of the light-guide layer (optical waveguide stage). Deflection at the exit surface 204 of the insertion layer slab alters the focal point of the parabolic reflector; it moves the focal point slightly upstream, which in turn requires moving the apertures of the light guide layer upstream. There is an advantage to the slight shift of the focal point: it allows for tight packing of the parabolic reflector faces with very little dead-space between them. However, a disadvantage of using deflection rather than only reflection to concentrate the sunlight is that the resulting embodiment will not function optimally under single axis sunlight tracking. As such, the two-slab approach of FIG. 24A is well-suited for a revolved geometry LGSP. This is because this embodiment requires, for optimal performance, two axis tracking in any event. The shift of the focus by a flat facet introduces some small astigmatism to the focusing parabolic optic. This spreads the sunlight 106 at the focus slightly and limits, to a small degree, the achievable concentration. It is possible to compensate somewhat for the astigmatism by tilting the parabola slightly. If the flat facet 204 is tilted 2° counter clockwise from the vertical, then tilting the parabolic reflector 110 by 5° clockwise from the vertical can somewhat compensate for the astigmatism. FIG. 24B shows another embodiment of a light-guide solar panel similar to the one of FIG. 24A but instead with a cubic surface 203 abutting the projection 207 formed by the injection face 206.

Figure 24C:
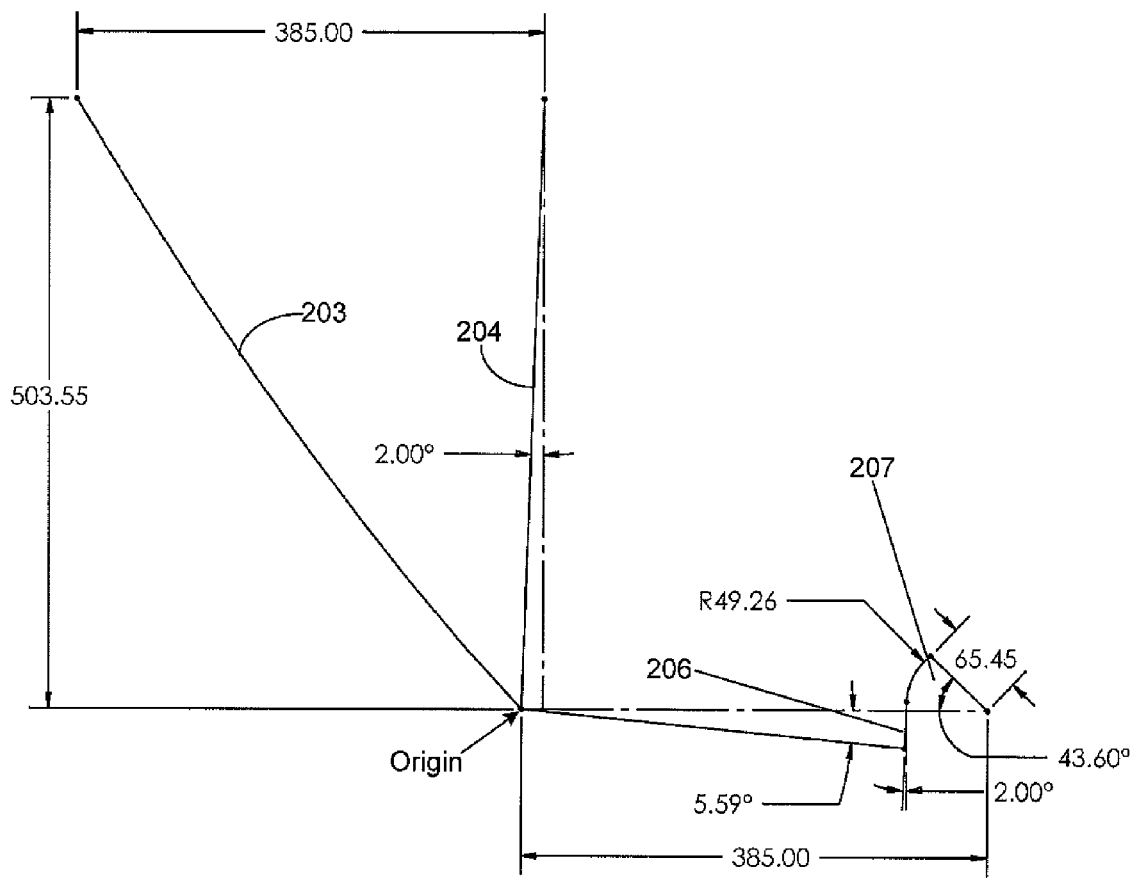
FIG. 24C shows geometrical details of the embodiment of FIGS. 24B and 33D.

FIG. 24C shows exemplary dimensions for the periodic unit of the light-insertion stage of FIG. 24B, the unit in question comprising the cubic reflector 203, the flat facet 204, the injection face 206 and the projection 207. The lengths are in microns and the equation of the cubic reflector 203 is $y=-1.049388x+9.1781775\times10^{-4}x^2+1.19193\times10^{-7}x^3$.

Figure 26:
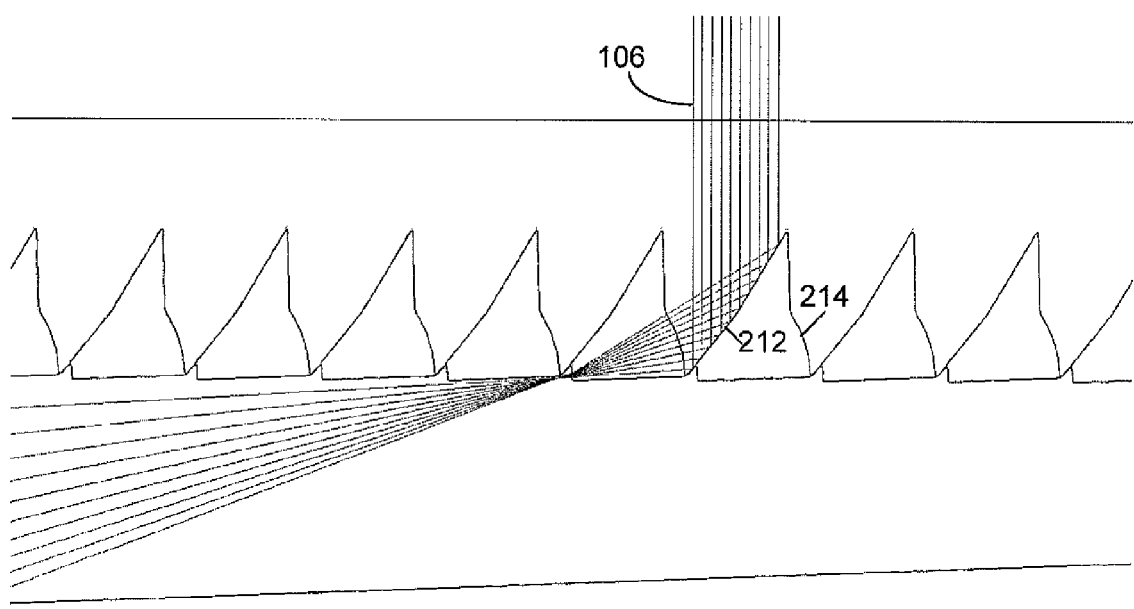
FIG. 26 shows an enlarged view of an embodiment of the light-guide panel of the present invention.

FIGS. 25A-25C shows yet another division of the LGSP 100 into two slabs 208 and 210 which improves on the limitation of the embodiment of FIG. 24A with respect to non-optimal single axis tracking, and allows for the fabrication of a linear geometry LGSP that does not use deflection to concentrate sunlight. As shown at FIG. 26, sunlight 106 is totally internally reflected off the parabolic reflector 212, but in this embodiment it exits the insertion layer slab at an exit face 214 that is the arc of a circle centered on the focus of the parabolic reflector 212. The sunlight rays that are converging on the focus of the parabolic reflector each encounter the arc exit face at substantially a right angle, and so no deflection occurs.

All the above-mentioned slabs can be molded with assembly features that ease the alignment between them when they are assembled into LGSPs. The assembly features can have minimal or no interference with the optical performance. In particular, embodiments of the LGSP of the present invention can be designed so that the backside of upstream apertures rests against the bottom of parabolic reflectors; this is the embodiment with the embodiment shown at FIG. 25C. Other assembly features can include small nubs, scattered over the surface of the light-guide layer, which hold the parabolic reflectors in place with respect to the optical waveguide stage 104. The space between the slabs should be substantially clear of dust and moisture. The slabs can be sealed to each other using silicone or any other suitable material, or by using a gasket or any other suitable seal. A small amount of desiccant can be added between the slabs to absorb moisture. A dust jacket or full envelope can be added to the LGSP to keep it clean and allow for color matching with architecture.

Figure 27:
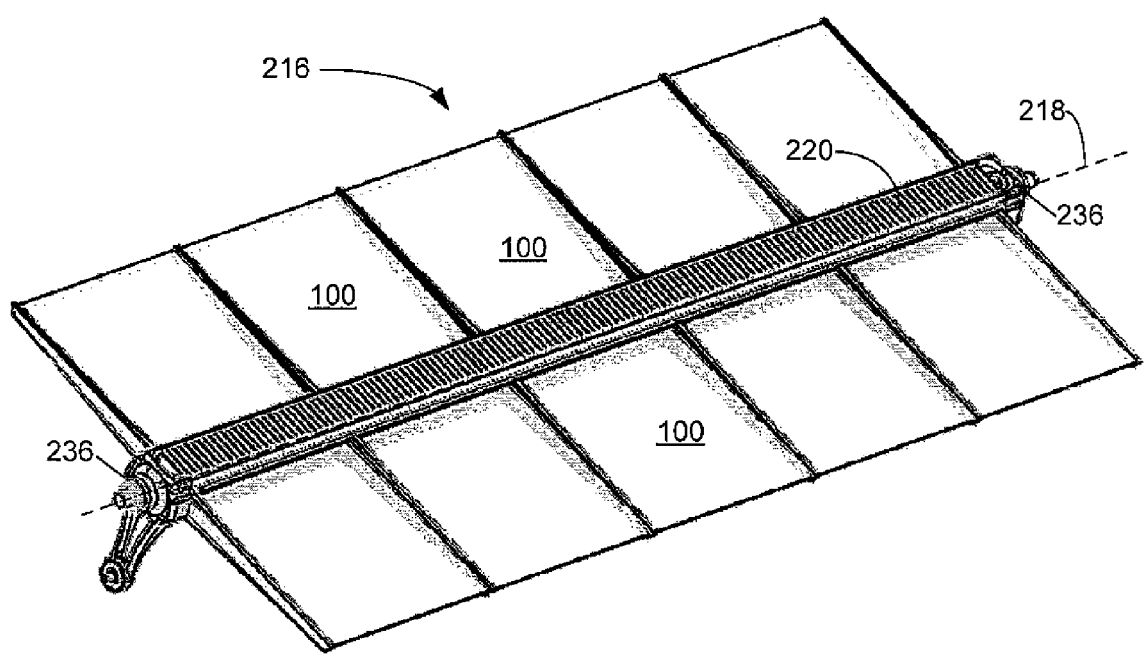
FIG. 27 shows an assembly of ten light-guide solar panels embodiments of the present invention.

A single axis tracking solar panel system 216 is shown at FIG. 27. The solar panel system 216 can use LGSPs 100 manufactured using the two-slab approach described above, and can be assembled to tilt about the axis 218. The LGSPs 100 can be made in squares, 125 millimeters each side. The light-guide layer (light-insertion stage) can use a half Winston Cone to concentrate the light onto PV cells that are 3 mm tall. The optical concentration of such a system is roughly 30 suns.

The system 216 is formed using several solar panels 100, for example 10, arranged in two parallel rows on either side of a heat sink 220, which can be made of aluminum or any other suitable material, and in such a way as to concentrate light towards the inner edge of the panels where they connect to the heat sink 220. PV cells are placed between the optical panels 100 and the heat sink 220.

Figure 28:
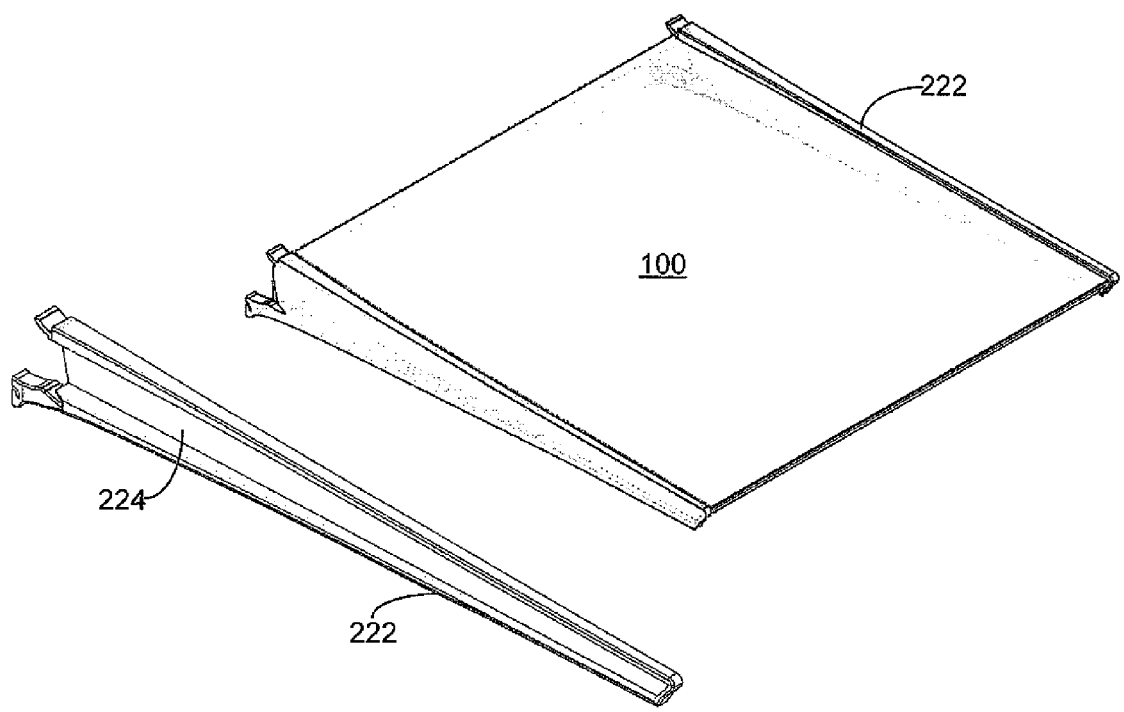
FIG. 28 shows a light-guide solar panel of the present invention assembled held between ribs.
Figure 29:
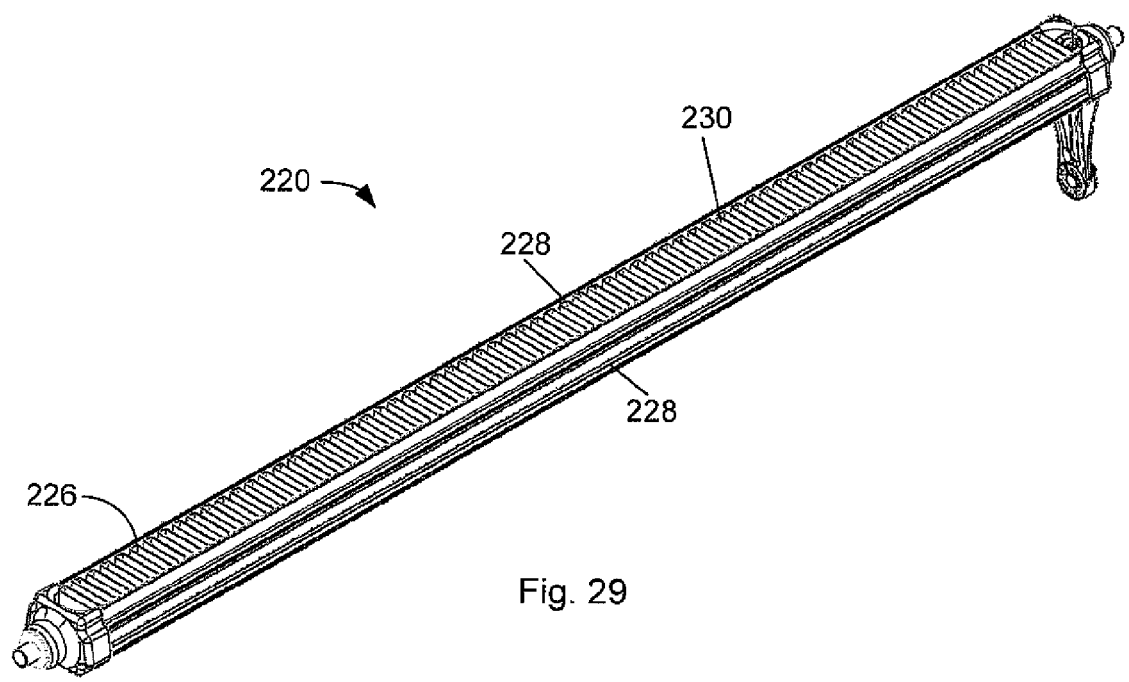
FIG. 29 shows a heat sink.

The solar panels 100 can be kept in alignment, for example, by ribs 222 shows at FIG. 28. The ribs can be made of injection-molded polymer, although machined aluminum or any other material can be used. The ribs 222 mechanically hold the panels 100 in position against the heat sink 220 and features on both the ribs 222 and the heat sink 220 can be included to facilitate assembly. Such features (e.g., recess 224) and details of the rib 222 and heat sink 220 are shown at FIGS. 28 and 29 respectively. The ribs 222 can be held in place against the heat sink using mechanical fasteners, adhesives, or any other suitable means.

This heat sink 220 can serve two functions: (1) it aids in dissipating heat from the PV cells and (2) it creates a rigid supporting axel for the LGSPs 100. The weight of the panels is balanced on either side of the heat sink 220 and the heat sink 220 is where the panel connects to an external supporting frame. To aid in dissipating heat, and as shown at FIG. 29, the heat sink 220 can have fins 226 made of a folded aluminum piece bonded between two extruded aluminum rails 228. The fins are connected to the two rails and create vertical air channels 230 in heat sink 220. The bond between the fins and the two rails can be made by brazing, epoxy, swaging or by any other means. This open heat-sink embodiment allows heat to be dissipated by natural convection as hot air can rise out of the heat-sink 220 and cooler air may enter into the heat-sink 220 from below.

Figure 30:
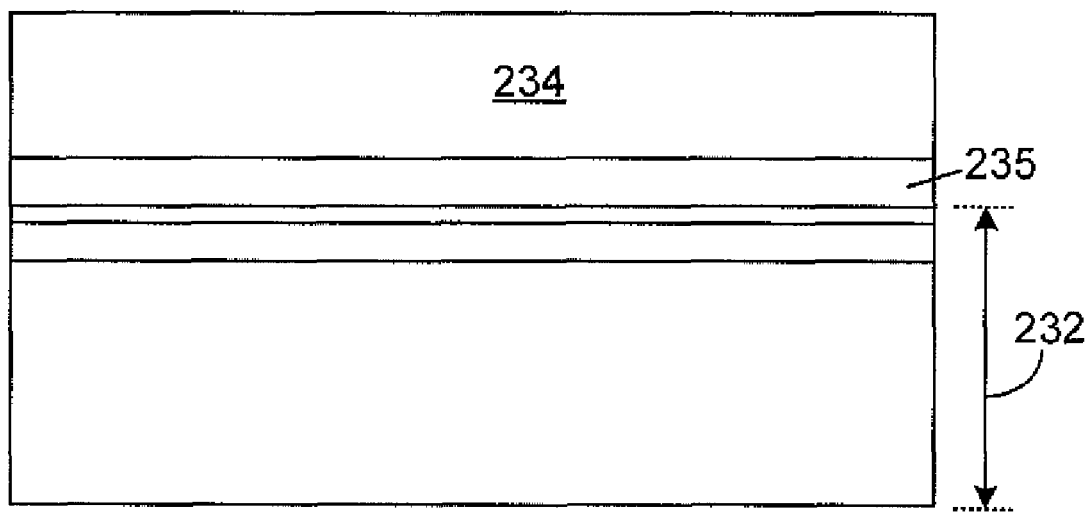
FIG. 30 shows photovoltaic cell assembly.

PV cells used in the system 216 can be of any size, such as 125 millimeters by 125 millimeters, and can be cut into strips of any height, for example, 3 mm tall for use with this embodiment. The PV cells can be encapsulated in any conventional way. For example, they can be soldered together in series and then encapsulated with ethylene vinyl acetate (EVA) or any other suitable material. Alternately, the electrical connections of the PV cells can be made by soldering, adhering or bonding the PV cells to a patterned circuit on a thermally conductive dielectric substrate. Insulated metal substrates (IMSs) such as those sold by The Bergquist Company of Chanhassen Minn. would be appropriate. FIG. 30 shows an IMS substrate 232 soldered to a PV cell 234; the solder layer is shown at 235. The IMS 232 can be connected to the aluminum heat sink 220 by epoxy or adhesive, or by any other suitable means.

A typical IMS 232 has electrical patterning of copper on top of a polymer insulating layer which is bonded to an aluminum or copper base. It is possible to forgo the base and affix the electrically patterned polymer-insulating layer directly to the heat sink 220. This process can be done in an oven by heat curing. An advantage of this approach is that it eliminates the base element and can reduce costs. The PV cell 234 can be bonded to the IMS 232 through a conductive ribbon or mesh that is connected to the entire length of the topside connector (not shown) of the PV cell 232. The backside connector of the PV cell 232 can be bonded over its entire length and/or surface as well. For PV cells 232 that are long and narrow and fragile, using the connection method described above allow the PC cells to break in sections without losing their functionality or substantially affecting the power production.

PV cells can be encapsulated to protect against moisture to avoid corrosion. This can be done using any suitable encapsulant such as, for example, ethylene vinyl acetate (EVA). However, EVA requires heat curing and so, the parts requiring sealing need to be placed in an oven. Another approach is to use an encapsulant, which cures in place at room temperature. Certain optically clear adhesives, such as the silicone Sylgar184 by Dow Corning, can serve this purpose and can be poured in a thin layer on top of the PV cells after soldering. As an added benefit, the panels can be fixed in place before the silicone has begun curing. This seals the space between the panels and the PV cells and creates an optical bond between them. The optical bond between the optical panels and the PV cells diminishes Fresnel losses at the exit edge of the optical panel.

Figure 31:
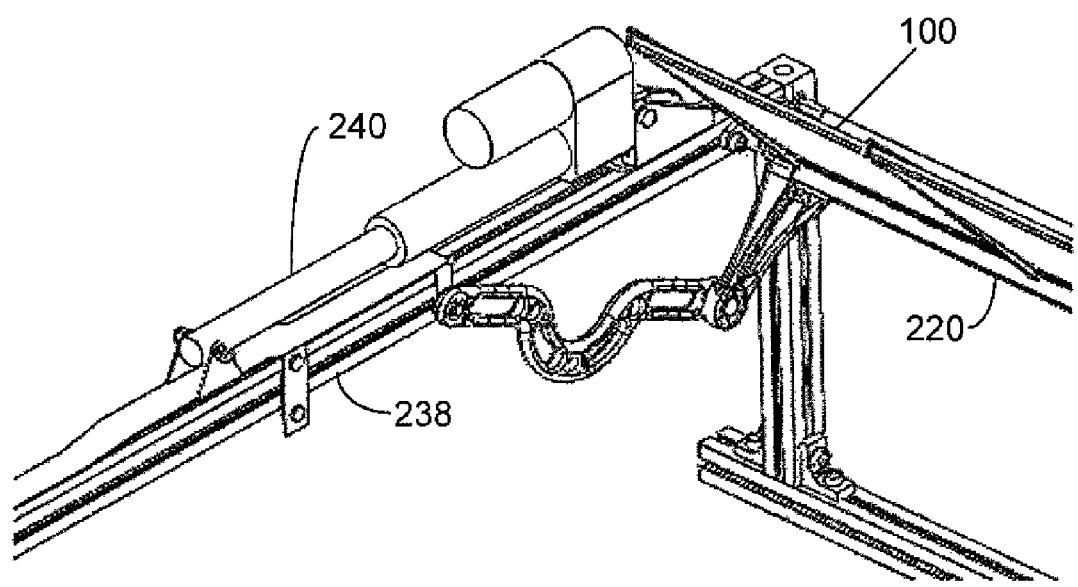
FIG. 31 shows details of a single axis sun tracking mechanism.

The LGSPs can be arranged on a mounting frame to form a solar power system. The heat sinks can connect with bearings on the mounting frame, which allows for free rotation of the panel about the axel made by the heat-sink 220 (see axis 218 at FIG. 27). The heat sink 220 can connect to the bearings by way of injection molded end caps (236, FIG. 27), which are joined to the ends of the heat sink 220. These end caps 236 can have any suitable features that allow connection to the bearings on the frame. The end caps 236 can be joined to the heat-sink either mechanically, with epoxies, adhesives, with adhesive tape, or through any other suitable means. The end caps 236 of the heat-sink 220 are also coupled to a mechanism that allows an actuator to control the rotation of the LGSPs 100. For example, as shown at FIG. 31, three bar linkages can connect all the modules to a single rail 238 that is driven by a linear actuator 240. Alternately, each LGSP can have a pinion gear which attaches to a rack, which is again driven by a linear actuator. With either system, a single linear actuator moving the single rail can drive the motion of all the panels, so that they will tilt in unison and maintain alignment.

Full sunlight tracking solar panel system can be made using a LGSP having a revolved geometry and manufactured using the two-layer approach exemplified at FIGS. 23A-23C. The external appearance of the such full tracking systems can be similar to those described for the single axis tracking system above in that LGSPs can be arranged along either side of a central heat-sink and supported by ribs.

Figure 32A:
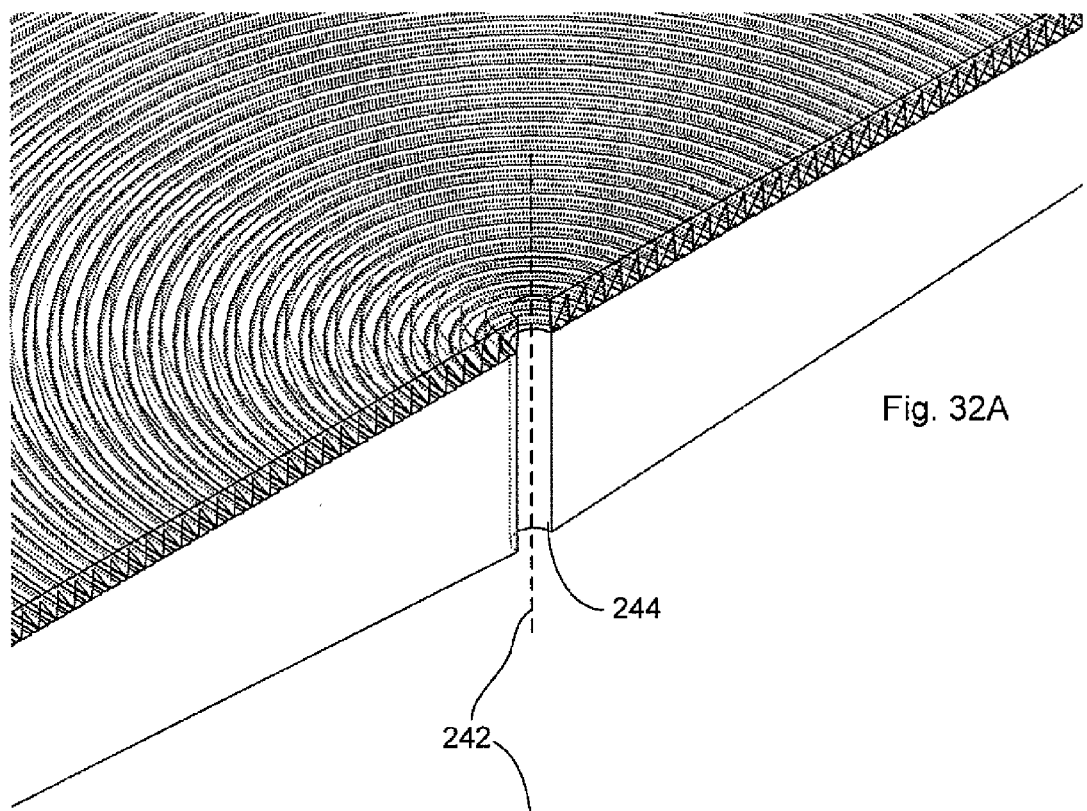
FIG. 32A shows a perspective view of a revolved geometry embodiment of the light-guide solar panel of the present invention.
Figure 32B:
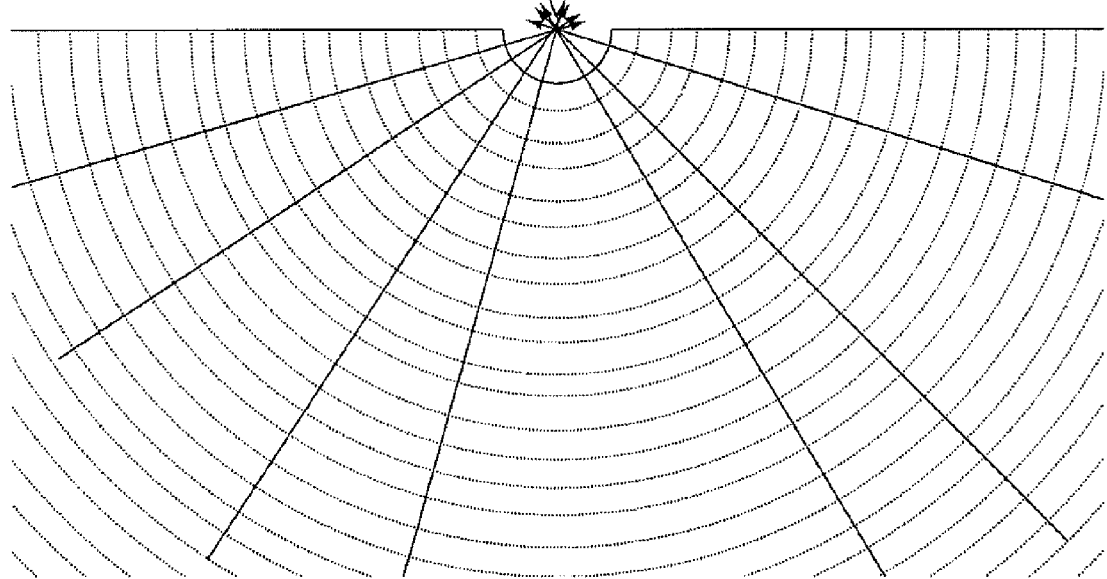
FIG. 32B shows a top view of the embodiment of FIG. 32A.

The external dimensions of the panels can be 125 millimeters by 250 millimeters. Sunlight is concentrated to a line 242 at the center of the inner edge of the LGSP as shown at FIGS. 32A and 32B. Sunlight exits the solar panel 100 at a half cylindrical facet 244 and enters an air gap. While in principle a thin PV cell could be placed along the line 242, such an arrangement would have limited angular acceptance.

Figure 33B:
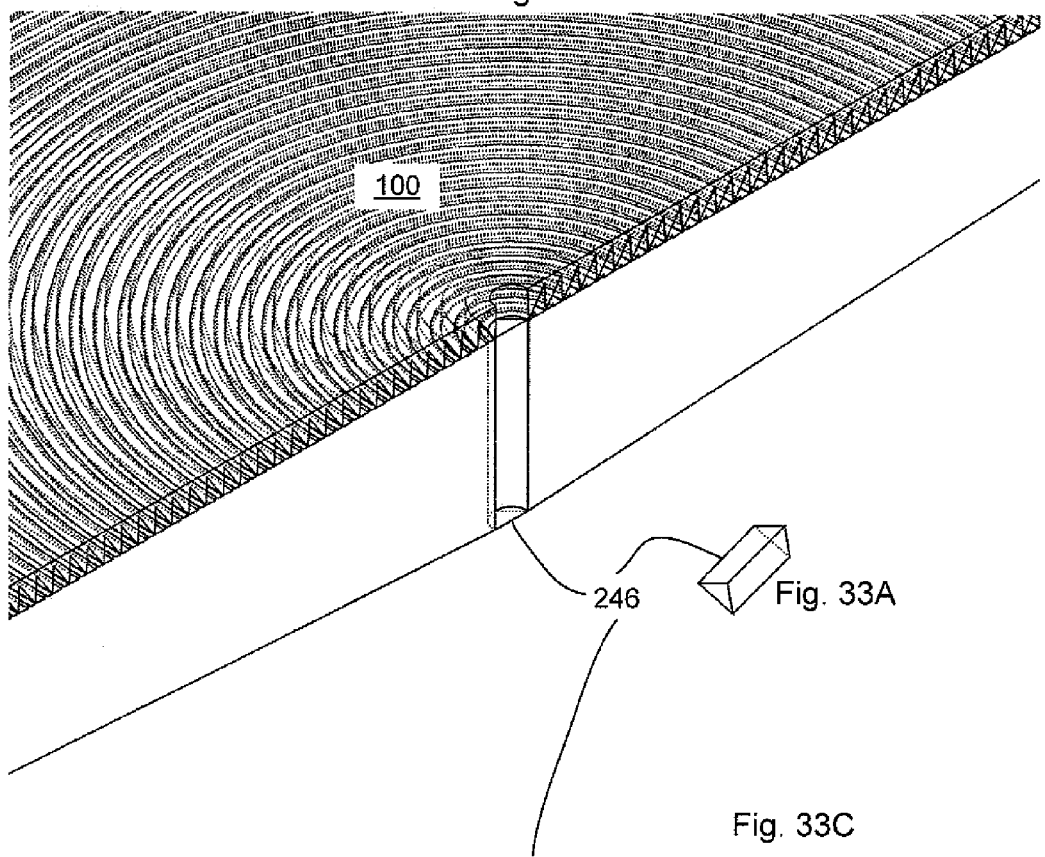
FIG. 33B shows a perspective view of a revolved geometry embodiment of the light-guide solar panel of the present invention with the prism of FIG. 33A.
Figure 33C:
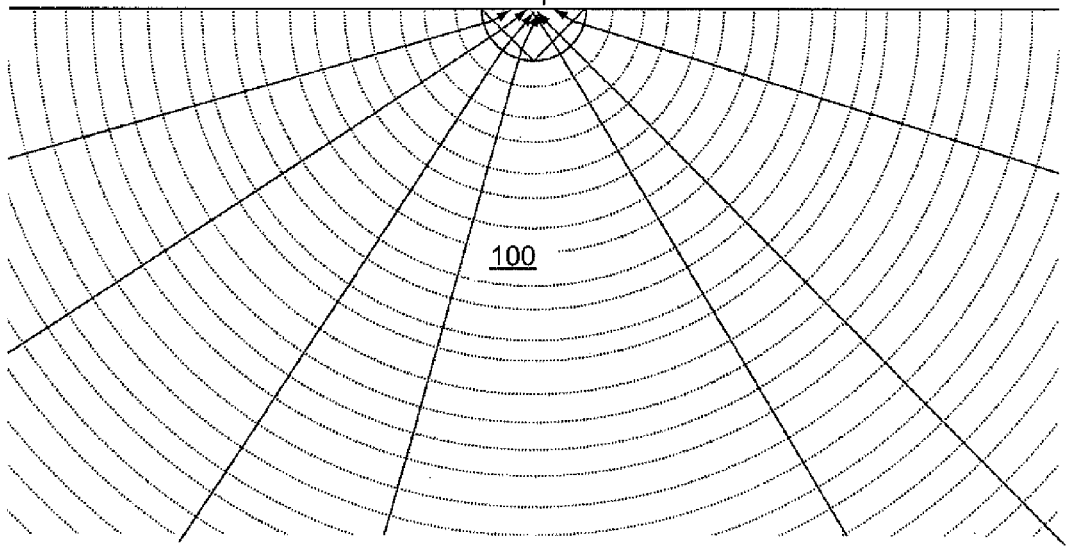
FIG. 33C shows a top view of the embodiment of FIG. 33A.

In practice, a wider angular acceptance is achieved by placing a 90° roof prism 246 into the half cylindrical facet, as shown at FIGS. 33A-33C. This roof prism 246 can be made of glass or of any other suitable material, and can have an index of refraction greater than 1.4. High efficiency PV cells, such as triple-junction cells, can be bonded optically to the base 248 of the roof prism using a silicone encapsulant or another optical epoxy. FIGS. 33D-33G show how a rectangular light-guide solar panel 800 can be made using two light-insertion stage sections 802 and 804 each having a revolved geometry and a corresponding optical waveguide stage section 806 and 808. Sunlight impinging on the light-insertion stage 802 is coupled to the optical waveguide stage 806, which propagates the sunlight to the surface 810. As for sunlight impinging on the light-insertion stage 804, it is coupled to the optical waveguide stage 808, which propagates the sunlight to the surface 812. The surfaces 810 and 812 can be flat surfaces and any suitable SECs can be secured thereto. By not having to use a prism to couple the light exiting from the optical waveguide stages 806 and 808, Fresnel reflections losses can be avoided. The optical waveguides 806 and 808 can have half-Winston cone profiles 816 and 818 such as shown at FIG. 33E. FIG. 33F shows that the light-guide solar panel 800 can be made in a two-layer process by laying the light-insertion stages 802 and 804 over the optical waveguide stages 806 and 808. FIG. 33G shows an exploded view of the assembly of FIG. 33E. Given that sunlight emerges from both sides of the optic, heat sinks can be placed on respective opposite sides of the panel. Because this panel of FIGS. 33D does not have a coupling prism, the portion of the optical waveguide stages 806 and 808 that is adjacent the surface 810 and 812 can be made of an insulating material, which can withstand more heat, such as, for example, fused silica, while the remainder is made out of PMMA.

While the arrangement described above in relation to FIGS. 33A-33C (with respect to sunlight exiting a half cylindrical facet 244 and then being directed to the PV cell by a prism 246) does introduce Fresnel losses to the system, it also places a layer of gas, either air or any other suitable gas such as, e.g., argon, between the prism 246, which is directly touching the PV cell and the LGSP. The advantage of this arrangement is that it protects the optics (the LGSP) from heat that can accumulate on the PV cell. The PV cell can become extremely hot under high concentration, perhaps reaching 120° C. or higher, and this would adversely affect the optical panel if it were made out of PMMA. The layer of gas can insulate and protect the optical panel from heat accumulation on the PV cell.

As mentioned previously, LGSPs using a revolved geometry and designed for high solar concentration offer better performance when used in conjunction with full tracking of the sun, maintaining the sun's rays parallel to the normal vector of input surface of the solar panel to within +/−1°. The full tracking can be achieved several ways, but two methods in particular lend themselves to the system.

Figure 34:
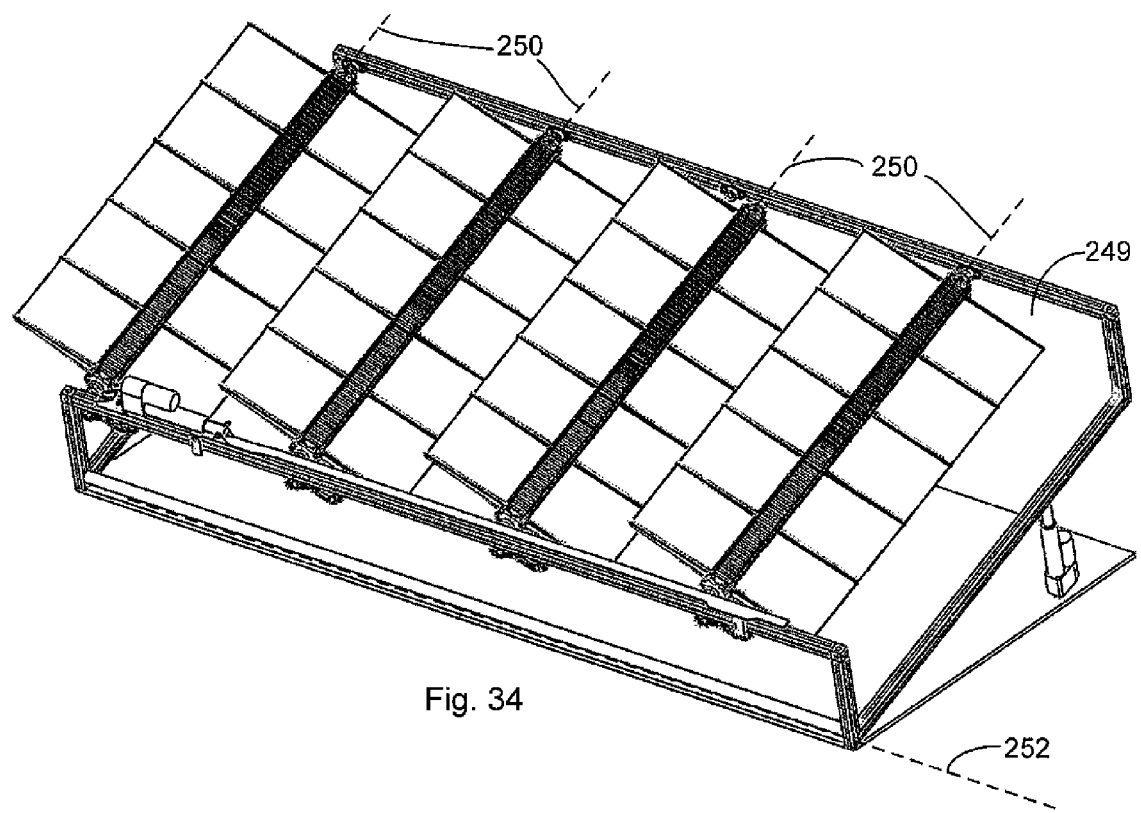
FIG. 34 shows a dual axis sun tracking mechanism.

The first full tracking method is shown at FIG. 34 where the LGSPs 100 are mounted in a frame 249 to tilt about a first series of axes 250 and the frame 249 can tilt about an axis 252, which is substantially orthogonal to the axes 250. As such, the LGSP can roll east-west to track the sun's movement over the course of the day and the frame can tilt north-south to adapt to the seasonal variation of the sun.

Figure 35:
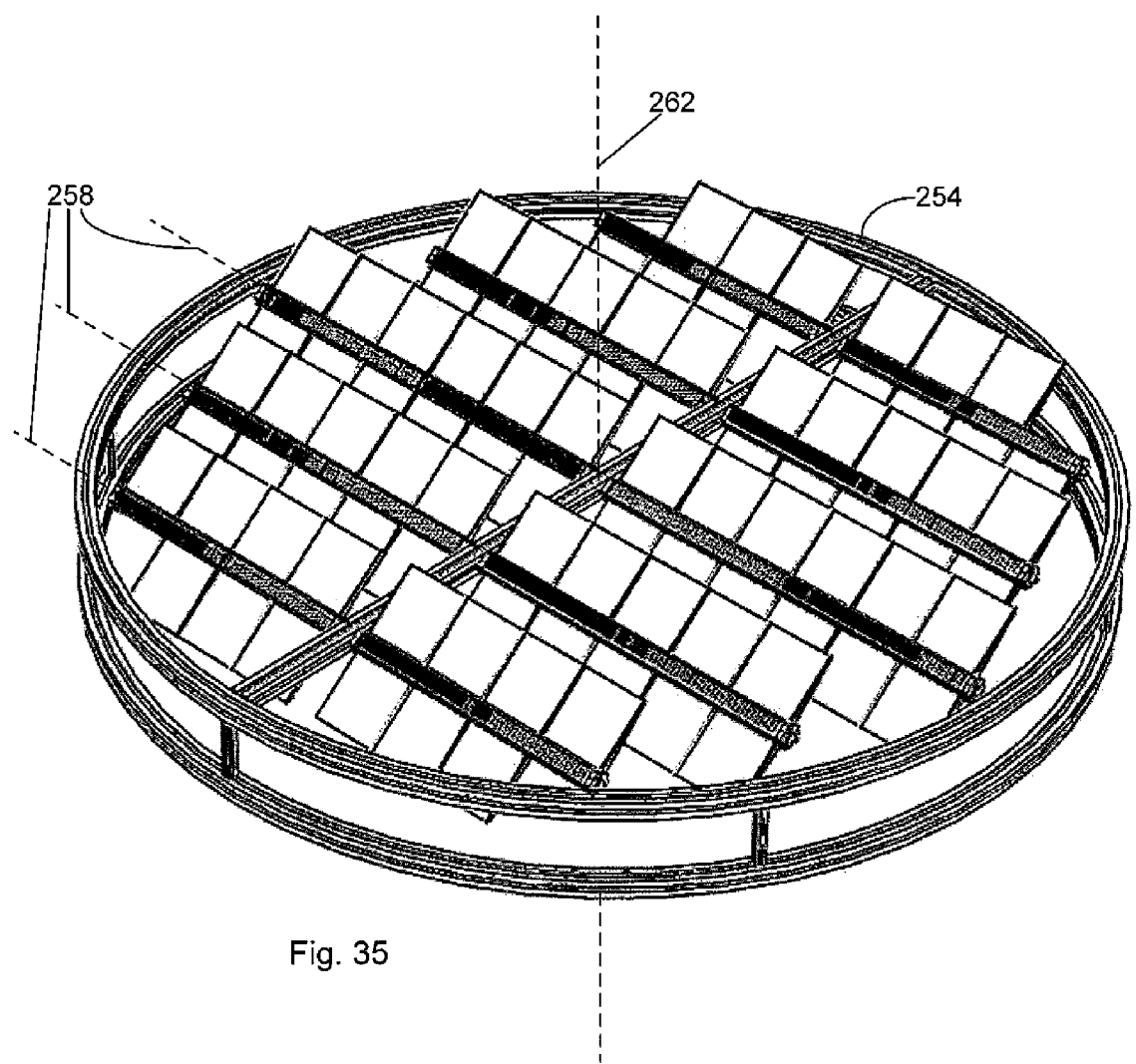
FIG. 35 shows another dual axis sun tracking mechanism.
Figure 36:
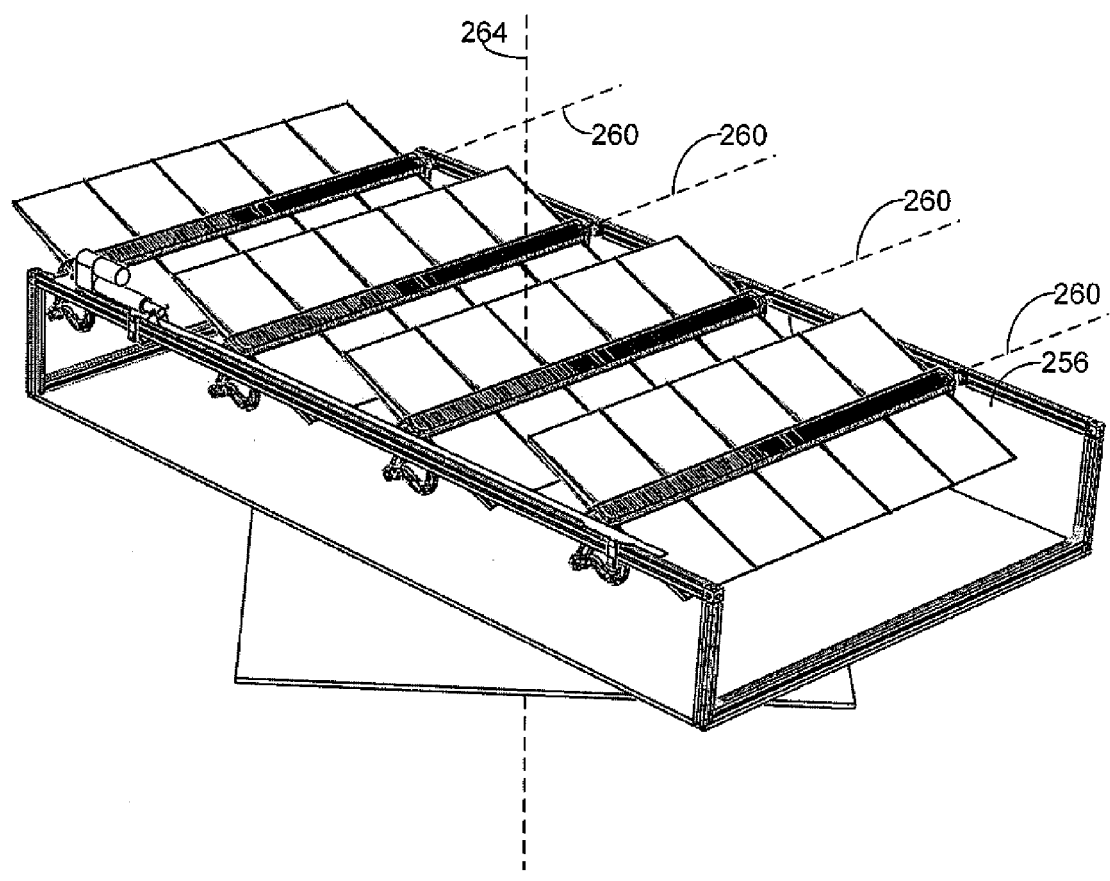
FIG. 36 shows yet another dual axis sun tracking mechanism.

A second full tracking approach that allows to maintain a lower profile is shown at FIGS. 35 and 36. The LGSPs 100 can be arranged in frames 254 or 256 and can tilt about the axes 258 and 260 respectively. Further, the frames 254 and 256 can be made to rotate about the axes 262 and 264 respectively.

Figure 37:
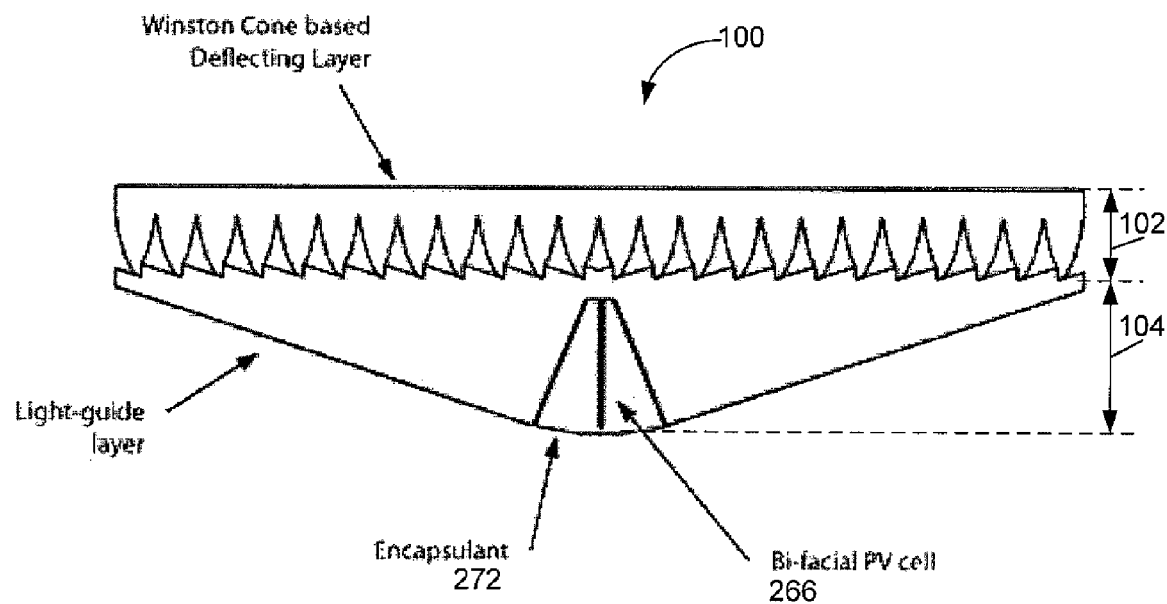
FIG. 37 shows another embodiment of the light-guide solar panel of the present invention.

FIG. 37 shows a variant of the LGSP employing Winston cones in the insertion layer (light-insertion stage 102), as shown at FIG. 15. The embodiment of FIG. 37, which is a linear geometry embodiment, is well suited for non-tracking applications because it has a wide angular acceptance because of the Winston cones. In order to improve the concentration achievable, it is possible to employ a bifacial PV cell 266 positioned between two optical panels; this embodiment doubles the concentration.

Figure 38:
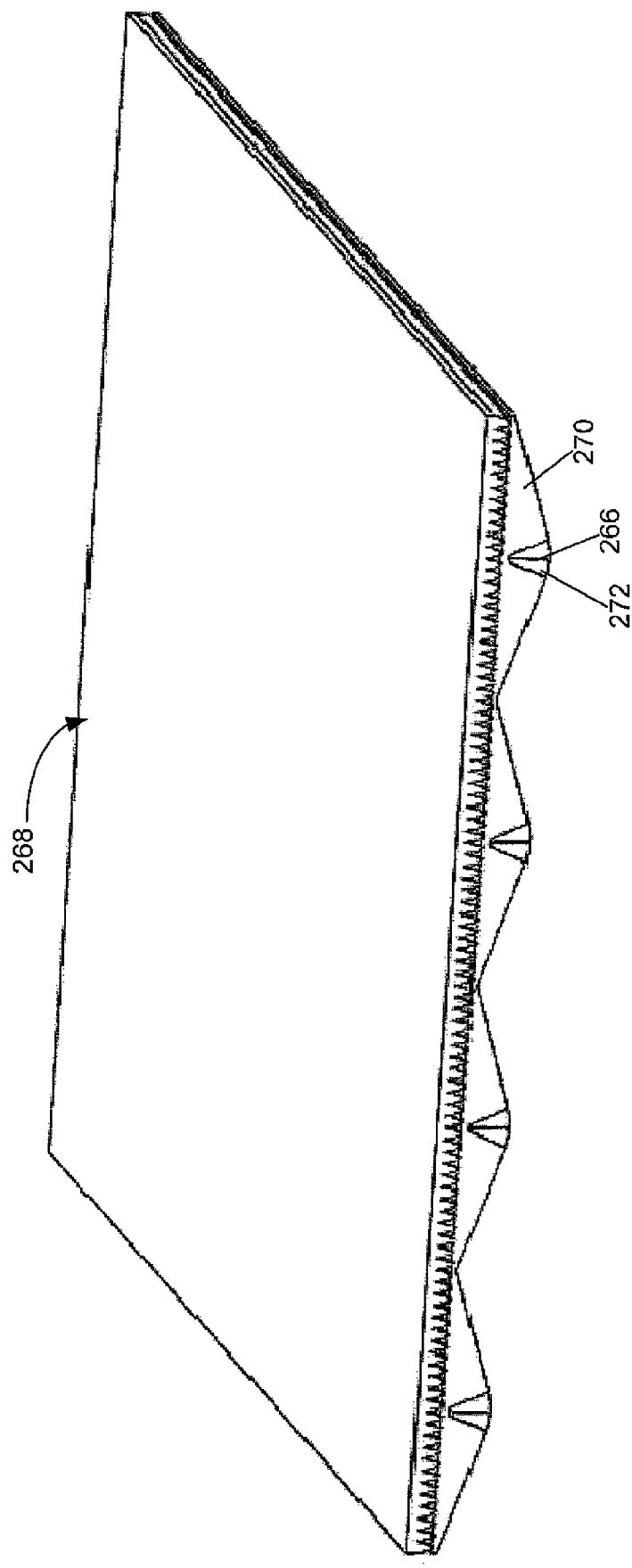
FIG. 38 shows another embodiment of the light-guide solar panel of the present invention.

The LGSP 100 of FIG. 37 can be made in a two part stack, but rather than molding a solar panel for each PV cell strip, a cluster of panels can be molded, a cluster of optical panels being a grouping of a number of concentrator optics into fewer pieces. FIG. 38 shows how a cluster LGSP 268 can be made to accommodate four PV cells 266.

The slab 270 that forms light-guide layers (optical waveguide stages 104) can have grooves 272 molded into it to accommodate bifacial PV cells 266. The PV cells 266 can be soldered and then encapsulated before being placed in the groove, or they can be only soldered together to form a circuit and then placed in the groove and encapsulated in place using a cast in place encapsulant such as clear silicone or any other optical epoxy.

Attaching a number of cluster panels together makes for a full solar panel module. Numerous methods exist for combining the LGSPs together. One method is to use an aluminum framing grill to tie all the panels together. Another method is to array and bond the optical panels by any suitable means onto a stiff superstrate of glass or of any other suitable material.

Figure 39:
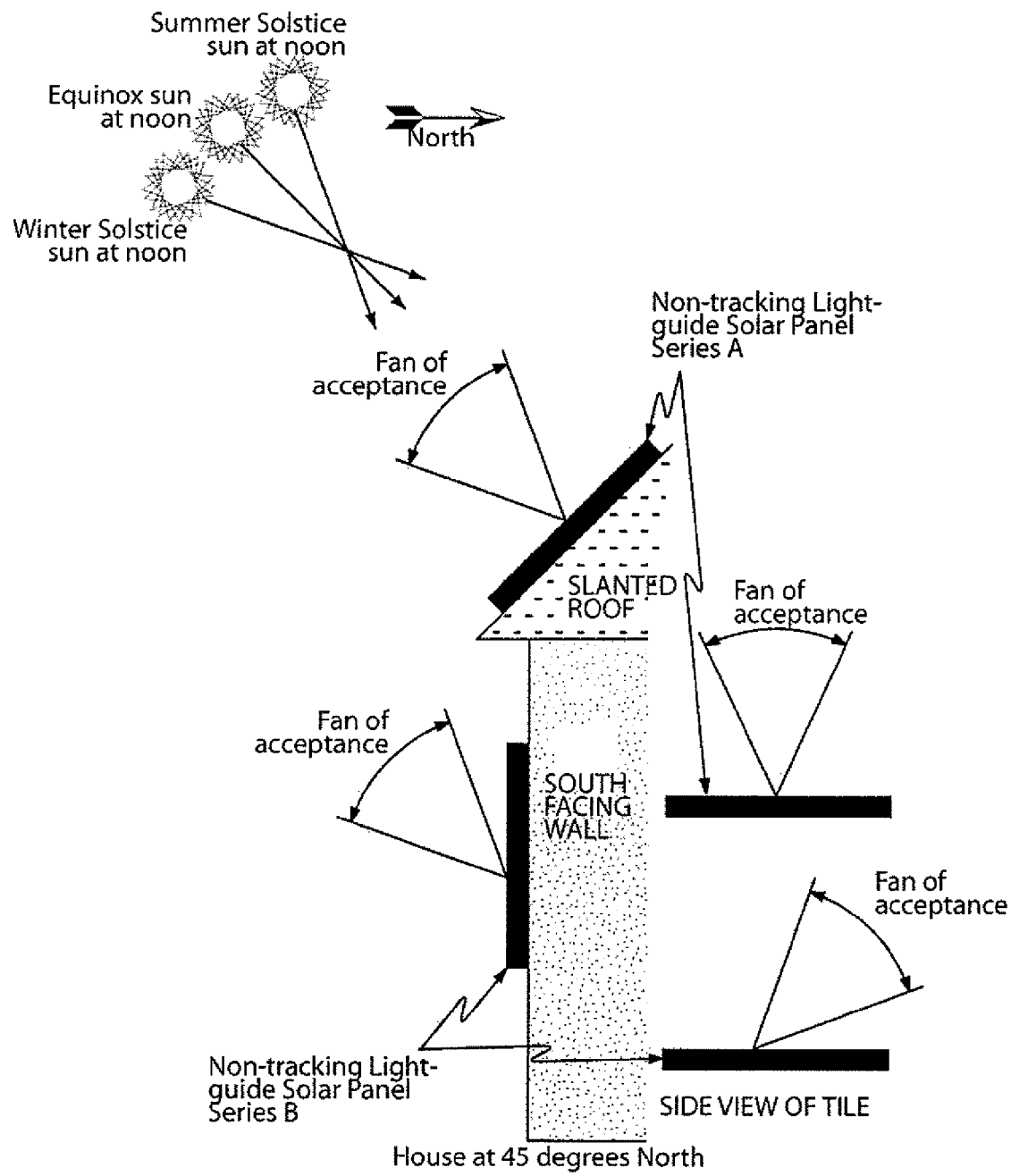
FIG. 39 shows various embodiments of light-guide solar panels having different light acceptance angles.

The non-tracking LGSP 268 will generally not have 180° of angular acceptance in the cross sectional plane of the optics as seen at FIG. 37. The cone of acceptance of the LGSP 268 can be ±30° from the normal of the panel, which is sufficient to accommodate the seasonal variation of the sun's position in the sky. As such, the non-tracking LGSP 168 should be installed at a tilt which matches the latitude of the installation location; this would ensure that the normal to the panel's input surface is parallel with the sun's rays at equinox. However, this does limit the installation configurations of the non-tracking LGSP 268. In fact, the LGSP 268 can be designed with their cone of acceptance tilted off the normal as shown at FIG. 39 for northern hemisphere locations. In practice, a finite number of non-tracking LGSPs 268 series can be designed to accommodate any installation configuration.

In order to make the LGSP of the present invention as cost efficient as possible, roll-to-roll continuous casting or embossing can be used to fabricate the light-insertion stage optics as films. It is possible to use roll-to-roll manufacturing methods because all of the above solar panels are composed of a stack of slabs that have no undercuts. The wedge-shaped light-guide layer (optical waveguide stage) can be made separately, and the light-insertion stage can be applied to the optical waveguide stage using a lamination process or any other suitable process.

Figure 40:
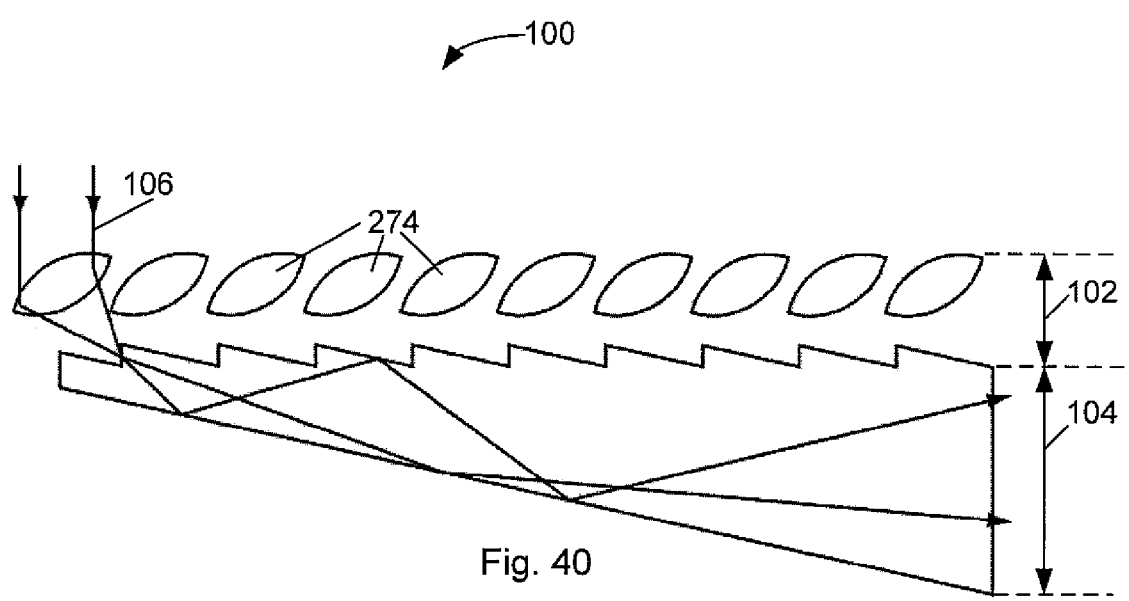
FIG. 40 shows another embodiment of the light-guide solar panel of the present invention.
Figure 41A:
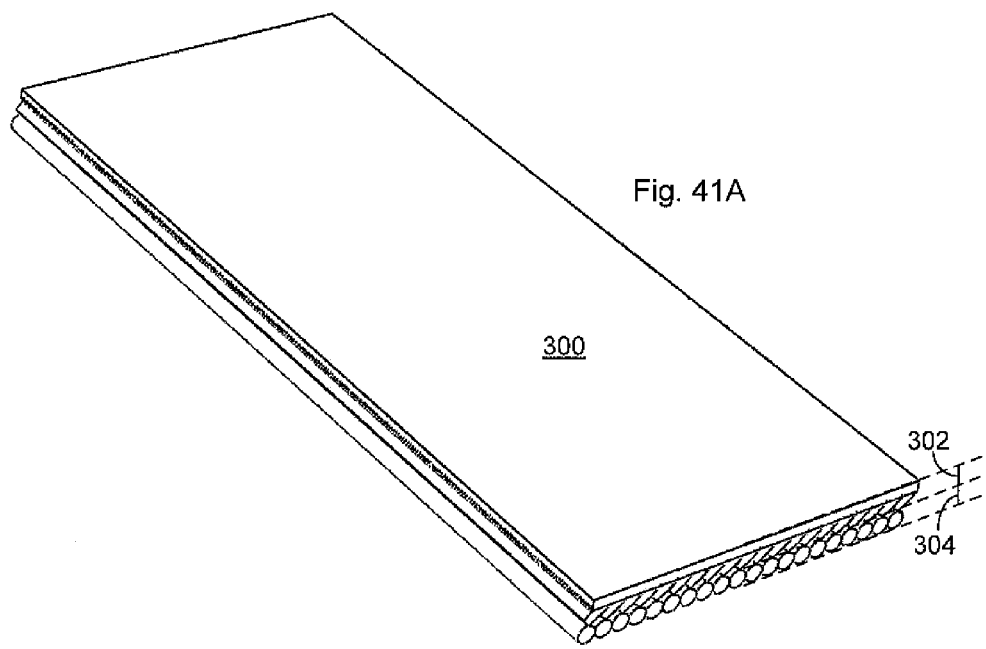
FIG. 41A is a perspective view of another embodiment of the light-guide solar panel of the present invention.
Figure 41B:
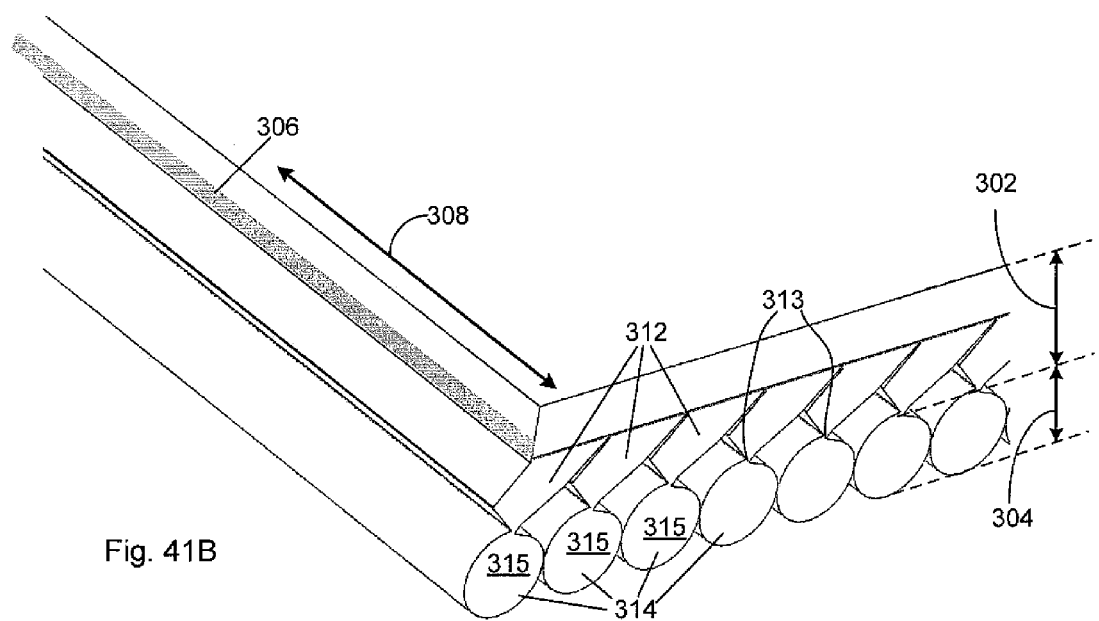
FIG. 41B is a detailed view of the embodiment of FIG. 41A.

As will be understood by the skilled worker, the light-insertion layer 102 of the LGSP of the present invention can also use any suitable type of lenses as optical elements instead of just the focusing TIR interfaces described above. FIG. 40 shows a LGSP 100 having a series of lenses 274 that focus and optically couples the sunlight 106 to the optical waveguide stage 104.

Another embodiment of the LGSP of the present invention is shown at FIGS. 41A, 41B, and 42A-42D. The LGSP 300 has an insertion layer (light-insertion stage 302) and a light-guide layer (optical waveguide stage 304). The light-insertion stage 302 has optical elements in the form of a deflector section 306 and reflector sections 312. The deflector section 306 deflects impinging sunlight 106 in one or both of the directions indicated by the double-arrow 308. The deflected sunlight is directed towards the optical elements that are the reflector sections 312, which are shaped as a series of focusing tapered light channels. The tapered light channels are optically coupled, through a series of optical output apertures 313 to a series of waveguides 314 that form the optical waveguide stage 304.

Figure 42A:
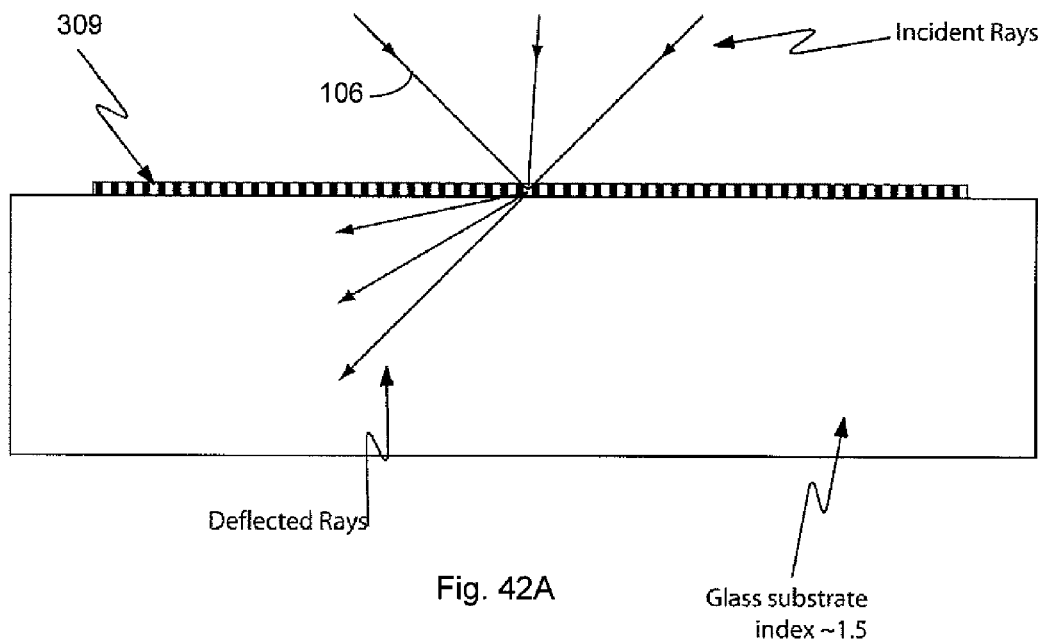
FIG. 42A shows a hologram on a glass substrate.

The deflector section 306 can include an optical directing layer in the form of a Volume Phase Hologram (VPH). Fringes in the VPH hologram are formed in any suitable manner, using the interference between two coherent UV light sources. The fringe spacing and angle can be designed such that one or more modes of diffraction can fall within 45 degrees of the plane of the solar panel 300. FIG. 42A shows an example of how such a VPH 309 operates. The resulting deflection is exemplified at FIGS. 42B to 42D.

Figure 43:
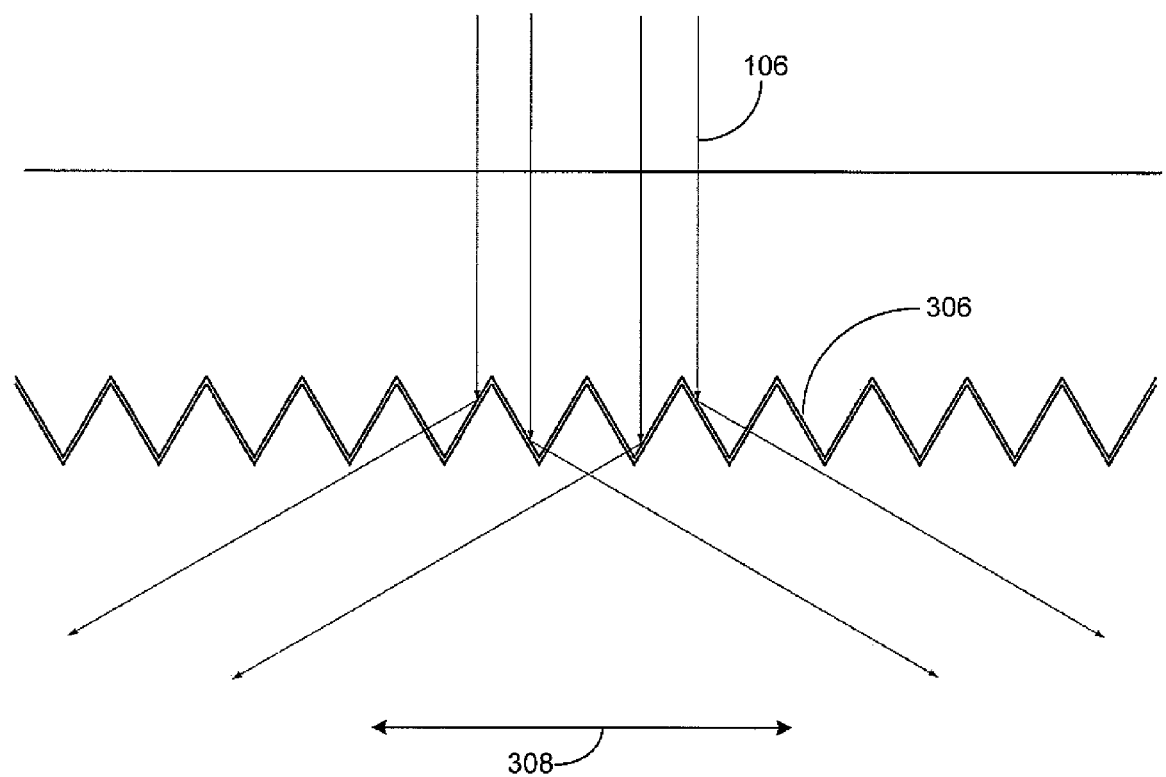
FIG. 43 shows a deflection layer made of prismatic ridges.

The deflector section 306 can also be made using non-interference optics, such as, for example, flat faceted optics like prisms. For instance, an array of 60° prisms arranged in an interlocking manner with a small air gap in between them would split light incident into the plane of the panel in two directions. This bidirectional deflection would lead to light accumulating on two opposite edges of the solar panel 300. Such directing optics are shown at FIG. 43.

Figure 42B:
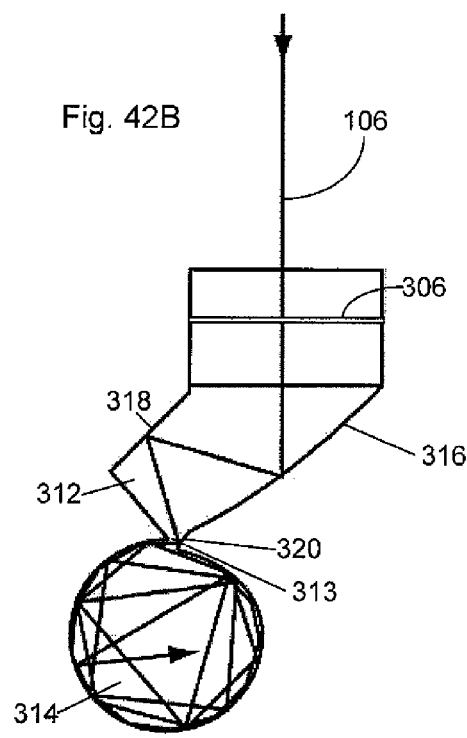
FIG. 42B shows a detailed cross-sectional view of the embodiment of FIG. 41A.
Figure 42D:
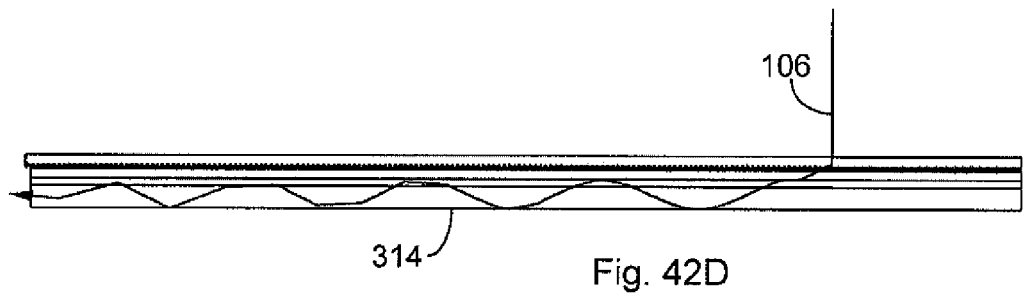
FIG. 42D shows a perspective view of the detailed another view of FIG. 42B
Figure 42C:
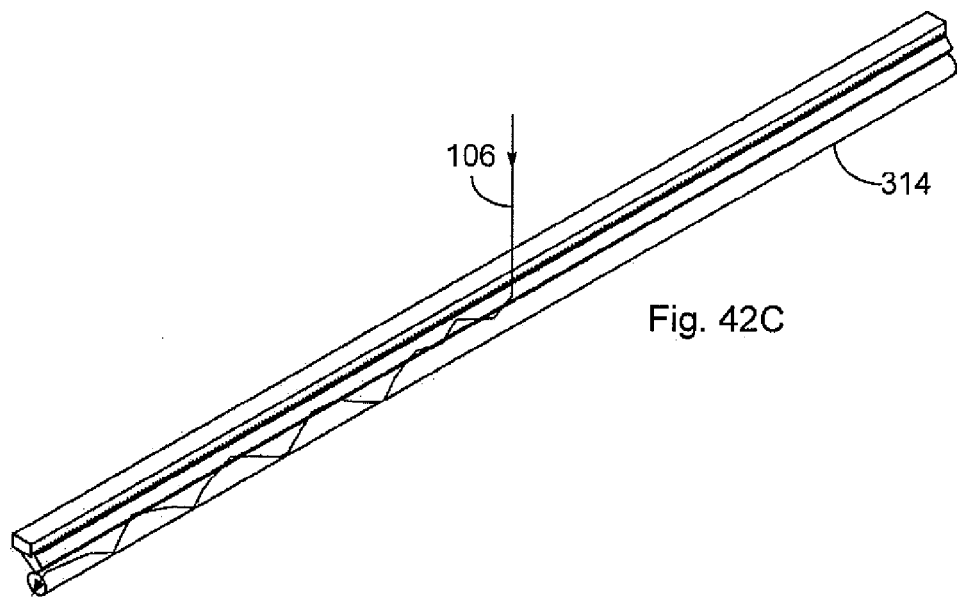
FIG. 42C shows a perspective view of the detailed view of FIG. 42B.

The optical waveguide stage 304 has a linear geometry and can have a plurality of waveguides 314 that receive light from their respective tapered light channels (reflector section 312) and that trap light by total internal reflection. The waveguides 314 act as delay lines whereby light enters from above, at optical output apertures 313, travels for some distance and then exits out the top through the optical output apertures 313. A potential channel embodiment is shown at FIGS. 42A-42C. Light entering a tapered light channel (reflector section 312) is reflected off a first parabolic section 316, then off a flat face 318 and off a second parabolic section 320 before entering into a cylindrical section, which defines the waveguide 314. The light can travel within the waveguide 314 in a spiral manner for some distance before escaping out. Provided that the length of the waveguide 314 is less than the mean travel distance of the trapped light rays, light coupled into the waveguide 314 will emerge concentrated from the end of the channel where it can be harvested by any suitable SEC. As an example, if the optical waveguide stage 104 is 1 cm tall, and the waveguides 314 are 150 cm long then 75% of the light incident on the LGSP 300 will reach the two ends of the waveguide for harvesting by an SEC. If light is incident evenly on the LGSP 300 then light will be distributed evenly between the two ends of the waveguide channel.

The LGSP 300 can include any number of waveguides 314 and tapered light channels 312 and each waveguide 314 can form a unit with a respective tapered light channel 312. The units formed by the tapered light channel 312 and their respective waveguides 314 can be made by molding.

In the LGSP 300, each waveguide 314 has an output surface 315, and the sum of the output surface 315 form the total output surface of the optical waveguide stage 304. Any suitable SEC can be placed at the output of the plurality of optical output apertures 315 to harvest the sunlight 106.

Other geometries of tapered light channels/waveguide can be used. For example, FIGS. 44A-44C shows a tapered light channel 322 having a plurality of waveguides 326 formed thereon, with the diameter of the waveguide decreasing as the width of the tapered light channel decreases. The staggering of the waveguides vertically allows for two or more channels to be positioned closely side by side with little dead space in between them.

Figures 45A, 45B:
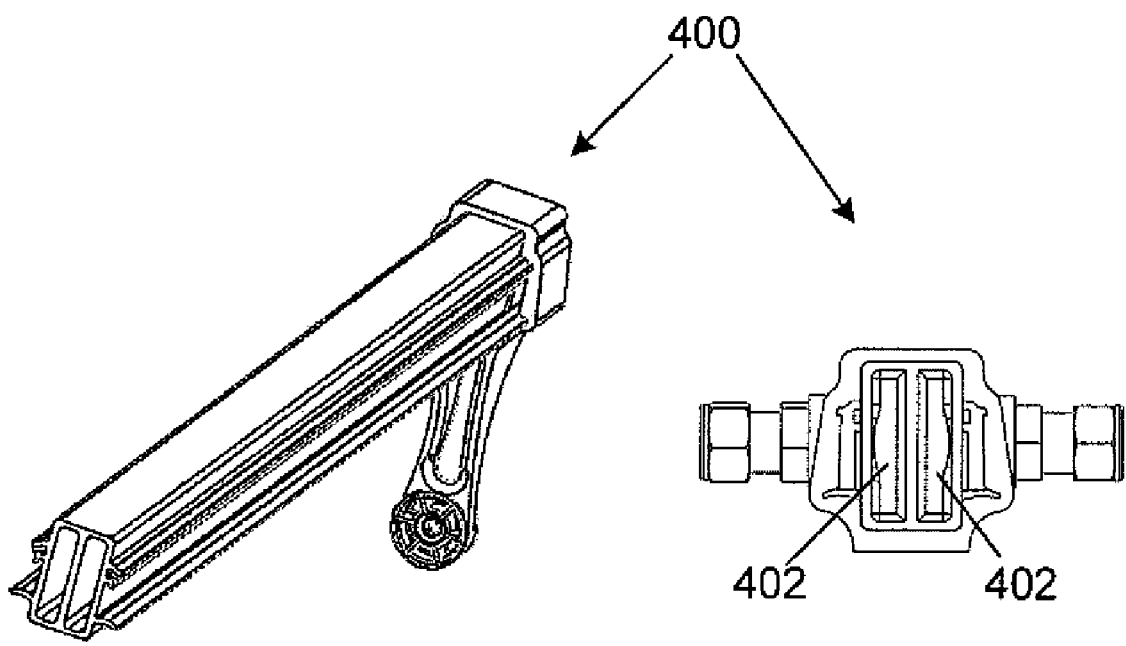
FIG. 45A shows a perspective view of a heat sink.
FIG. 45B shows a cross-sectional view of the heat sink of FIG. 45A.

The heat sink 220 previously described can be used in conjunction with single axis tracking systems and the full tracking high concentrator systems to shed excess heat from the SEC (e.g., PV cells) into the surrounding air. However, the excess heat can instead be used to heat water. This functionality can be accomplished with the heat sink 400 shown at FIGS. 45A and 45B. The heat sink 400 can be made of aluminum of any other suitable material. In contrast to the heat sink 220, which features fins to shed excess heat into the air, the heat sink 400 has one or more channels 402 for flowing water which extracts excess heat generated at the SECs.

Figure 46:
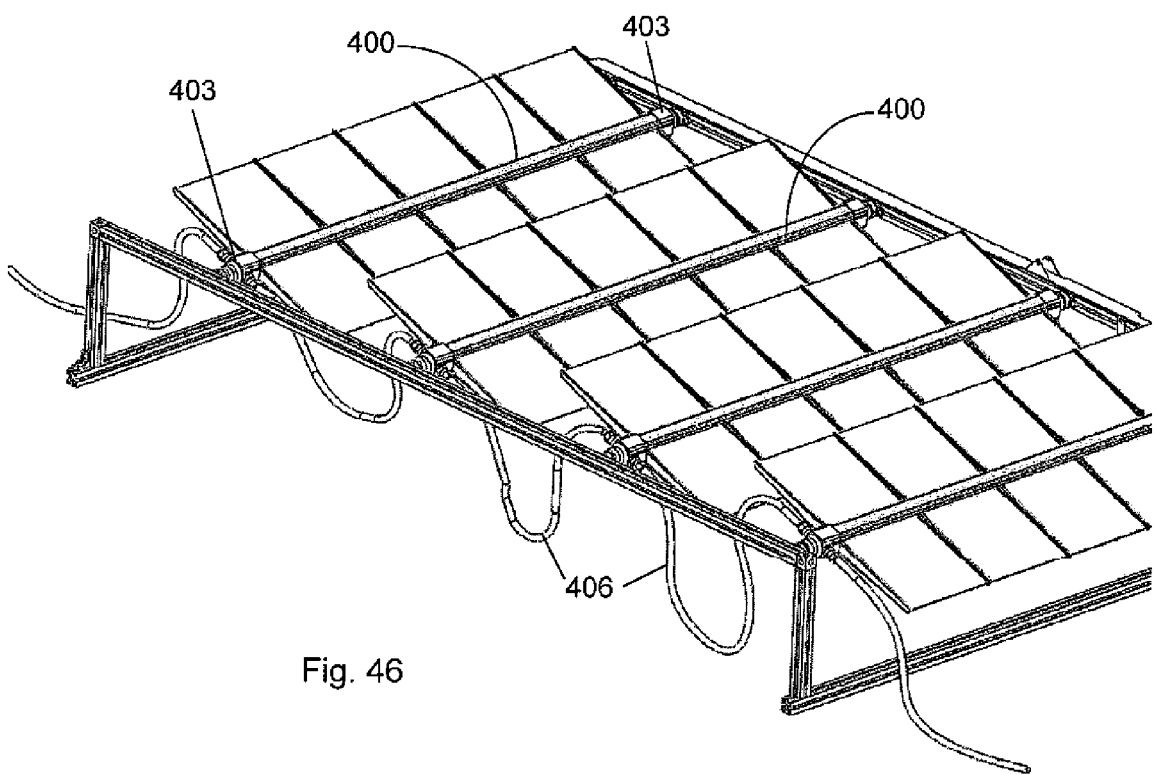
FIG. 46 shows a solar panel single axis tracking assembly.

As seen at FIG. 46, end caps 403 can be affixed to the heat sink 400 and serve the dual purpose of securing LGSPs to a mounting frame via bearings, and they also serve as inlet and outlets to a heat exchanger (not shown). Water could either flow straight through a heat sink 400, with an inlet on one end cap and an outlet on the other, or it could flow in and out of the heat sink 400 through the same end-cap, with the opposite end cap serving as a u-bend. This embodiment can simplify hose routing between many modules in an extended system. The number of channels in the extrusion could be increased so as to have a larger surface area of contact between the water and the aluminum of the heat sink 400. The rate of water flow through the heat sink 400 can be used to control the temperature of the SECs and be used to keep the LGSPs within their operating temperature range. A system using heat sinks 400 interconnected through hoses 406 is shown at FIG. 46. As will be understood by the skilled worker, a heat exchange fluid other than water can be used in the system of FIG. 46.

Figure 47:
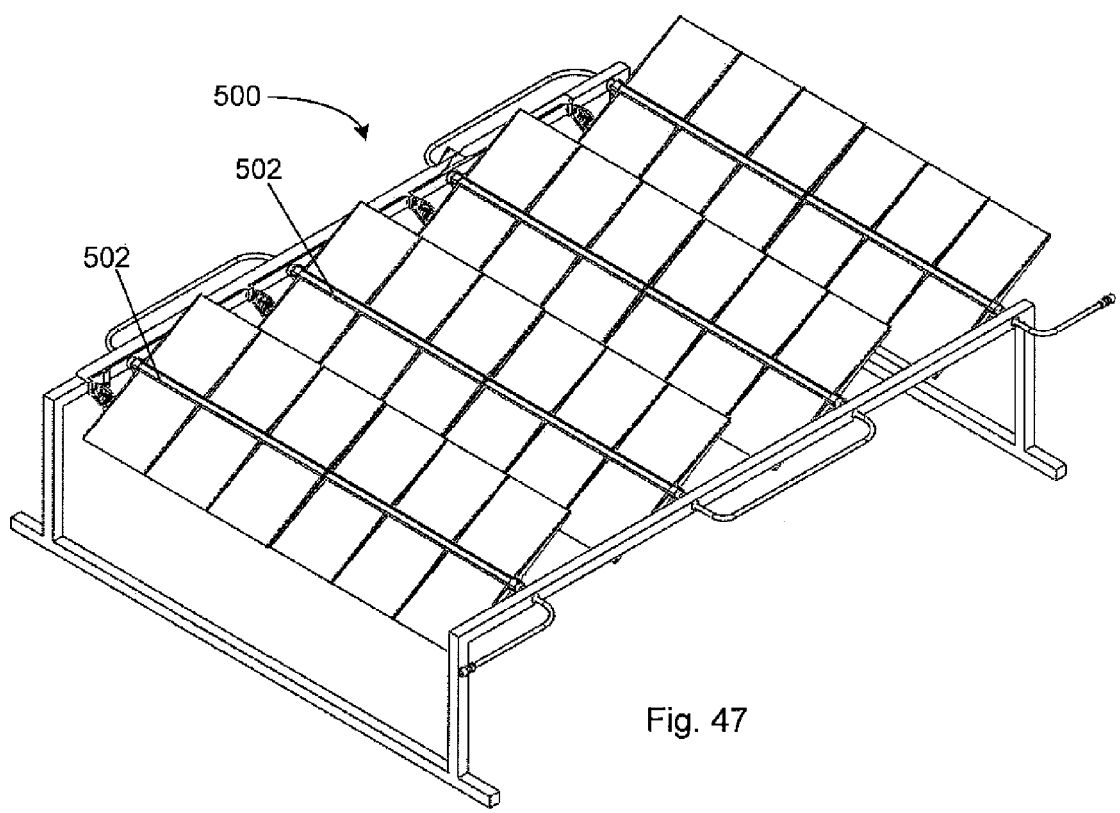
FIG. 47 shows a solar thermal single axis tracking assembly.

Sunlight captured by the LGSP of the present invention can be used in a solar thermal system that does not use PV cells. An example of such a solar thermal system 500 is shown at FIG. 47. The system 500 can use a double walled tube 502 that has its outermost tube transparent. An insulating gas, such as argon, would separate the inner tube from the outer tube. The inner tube can be black so as to absorb incident sunlight. Through the central tube a heat absorbing liquid, such as water, oil, or any other suitable liquid flows.

The tube 502 is placed in the position previously occupied by heat sinks in the above-described embodiments. The concentrated sunlight, passes through the clear outer tube, and the insulating gas layer, and is absorbed by the inner tube. This causes the liquid in the inner tube to heat. The fluid carrying tubes can remain fixed in position while the optics rotate about them.

It is possible to fabricate some of small optical structures of the LGSP of the present invention using a technique known as silicone on glass. Thin clear silicone rubber, similar to the Sylgard™ 184 by Dow, is formed into the necessary shapes on a glass substrate. It is also possible to mold silicone on its own with no glass substrate.

Advantageously, the LGSP of the present invention is relatively insensitive to thermal expansion or contraction. This is possible because all the optical components of the solar panels are made of similar, if not the same, materials. Because of this, they will expand by the same degree and the function of the optical element will not change significantly. Specifically, as the reflectors 110 expand, so too will the waveguide section 104. This maintains the same focus for light 106 reflecting off 110 and focusing on 116 from FIG. 1 as the unit expands and contracts with changes in temperature.

For single axis tracking, the panel is tilted to maintain alignment in one plane with incident sunlight. It is also possible to add an optical device on top of the optics that preconditions the light, altering the angle of the incident light to align the incident light to the optics. Such preconditioning optics could employ moving mirrors, prisms, or electro-optics.

Tracking can be accomplished manually by occasionally tilting the single axis tracking panel, or the non-tracking panel. A manual-tracking panel would be one with a wide enough angular acceptance, say, for example, plus or minus 5 degrees in the cross-sectional plane, so that it would only need to be re-aligned slightly by hand every few weeks. Electronic alignment sensors could assist in the alignment, but actuators would not be needed.

Figure 48:
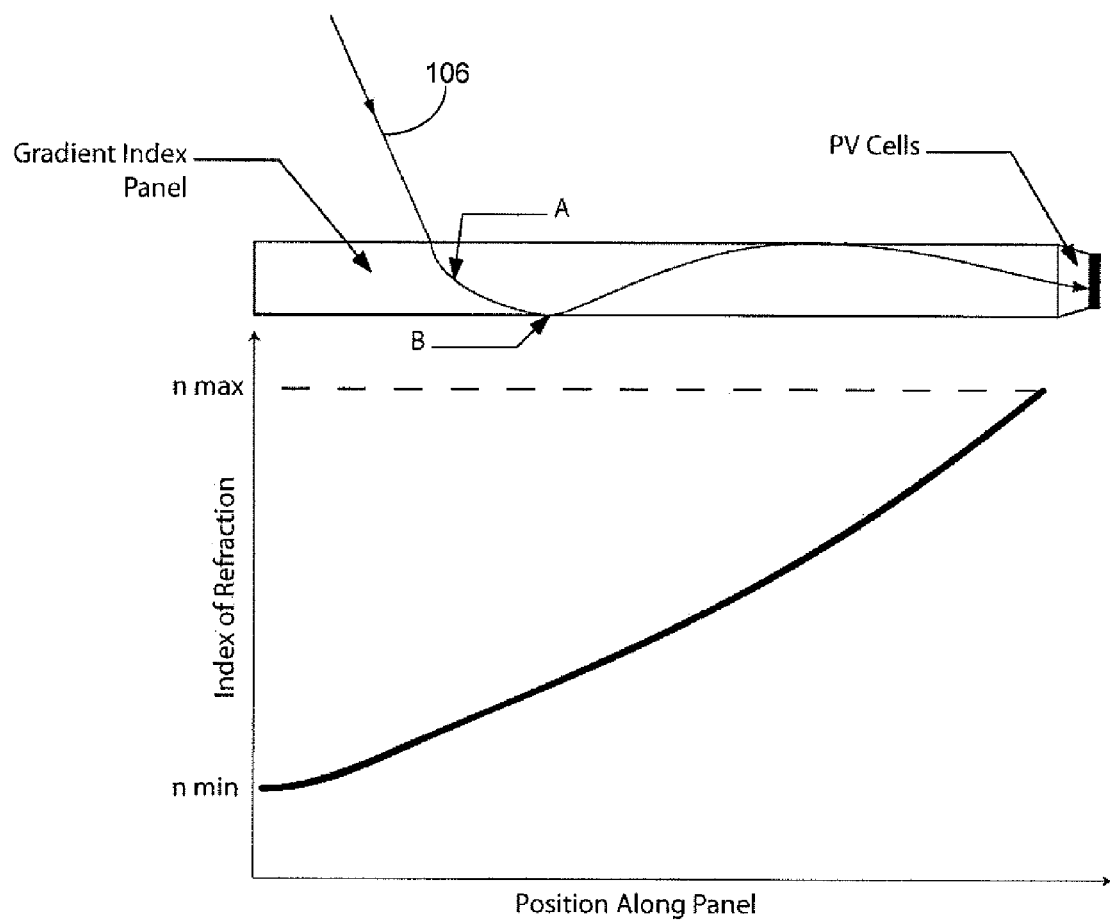
FIG. 48 shows a gradient index solar panel embodiment.
Figure 49:
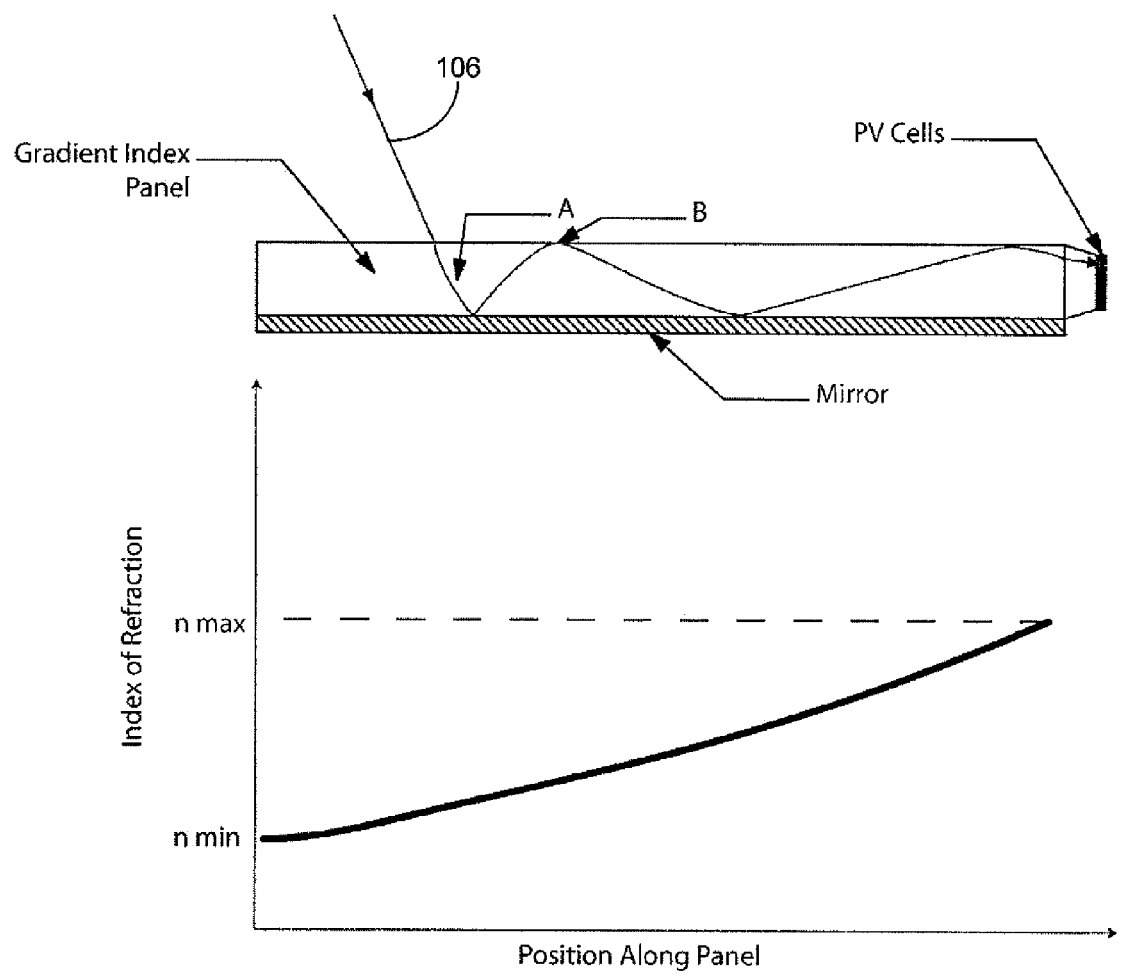
FIG. 49 shows another gradient index solar panel embodiment.

A LGSP using a different mechanism can be made using a panel with a gradient index of refraction. The refractive index gradient increases in the downstream direction of the LGSP, so that light incident on the panel would deflect towards the downstream direction. If the gradient was sufficient to cause enough deflection for TIR to occur at the bottom face of the panel then the light would be trapped and would become conducted down to the edge of the panel as shown at FIG. 48. With less of a gradient, a mirror may be required for the first reflection if light exits the bottom face of the panel, and further deflection while traveling back up through the panel to the top surface would increase the angle of incidence on the top face enough for TIR to occur. This is shown at FIG. 49.

Figure 33D:
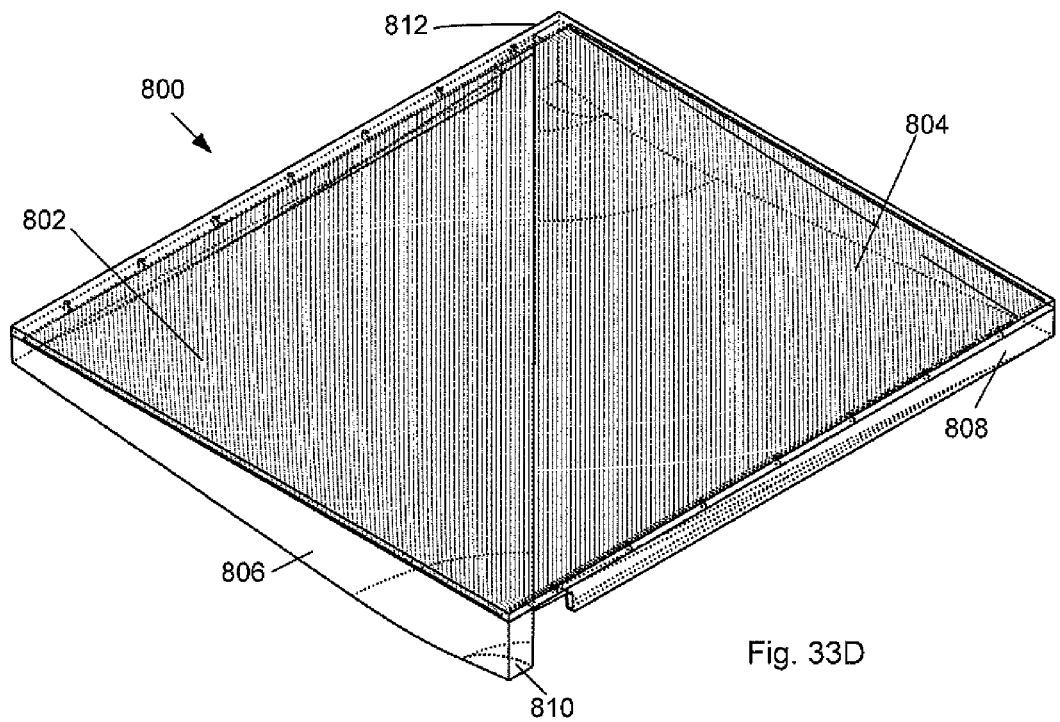
FIG. 33D shows a perspective view of an assembly of light-guide solar panel sections.
Figure 33E:
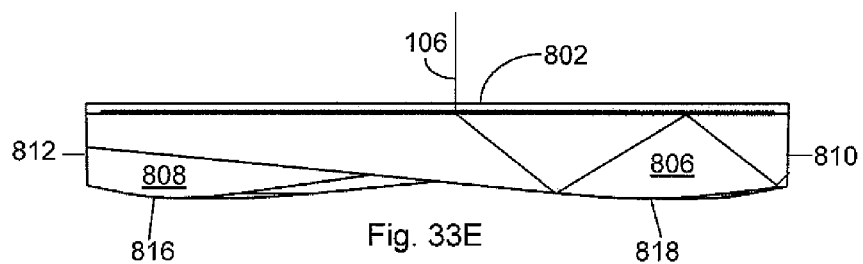
FIG. 33E shows a side view of the assembly of FIG. 33D.
Figure 33F:
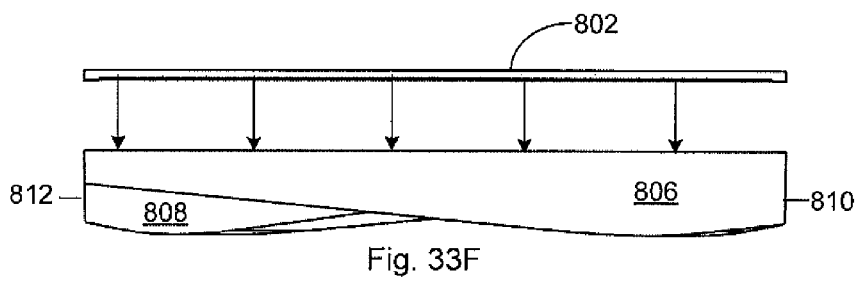
FIG. 33F shows an exploded view of the assembly of FIG. 33E.
Figure 33G:
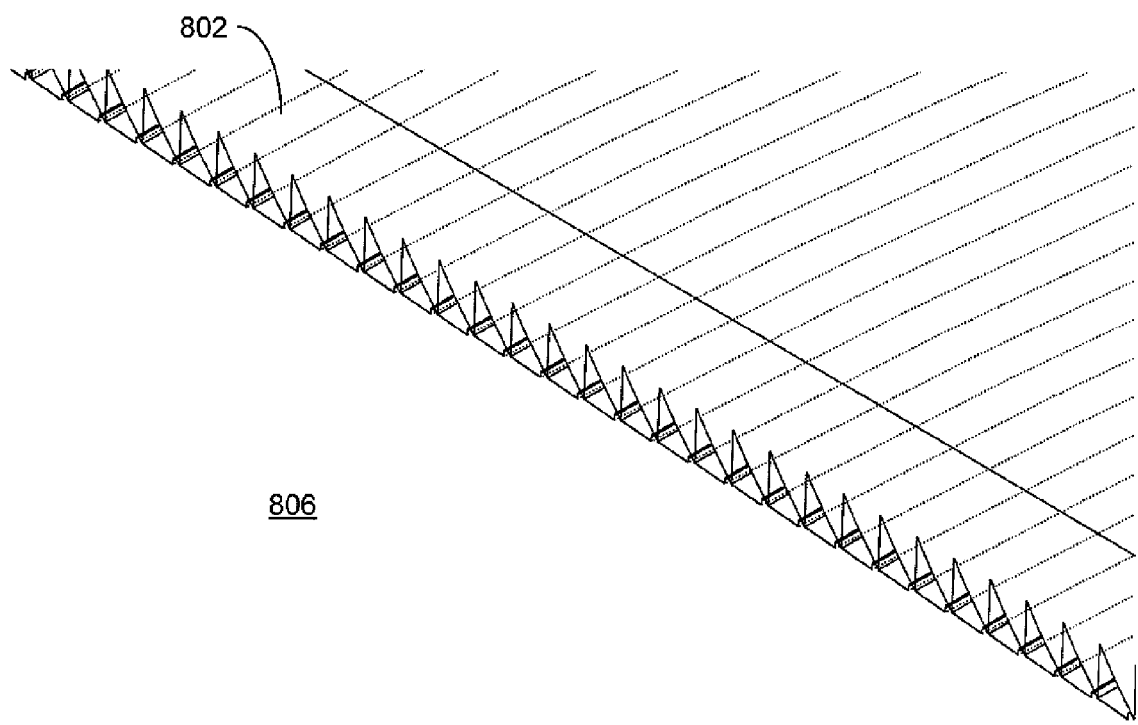
FIG. 33G shows details of the light-insertion stage and the optical waveguide stage of the embodiment of FIG. 33D.
Figure 50A:
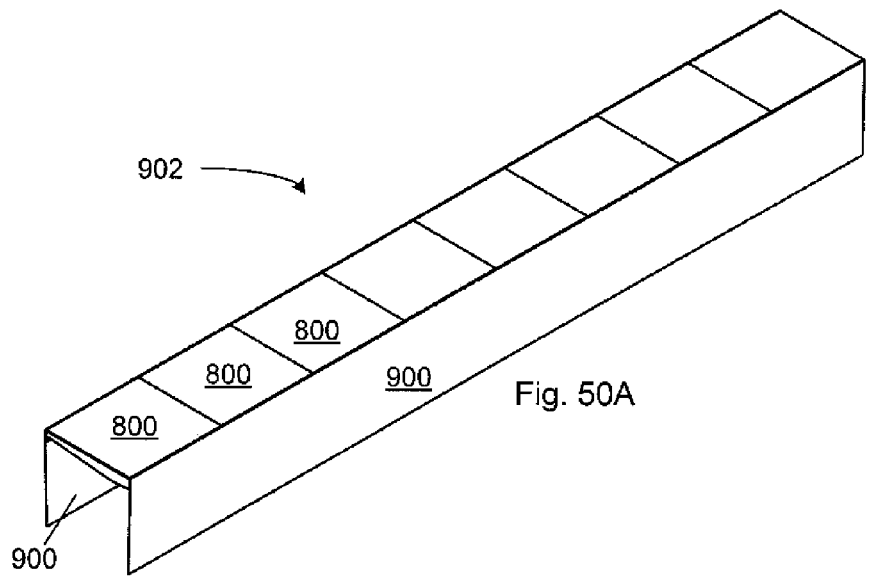
FIGS. 50A-50B show assemblies of the solar panels shown at FIGS. 33D-33F.
Figure 50B:
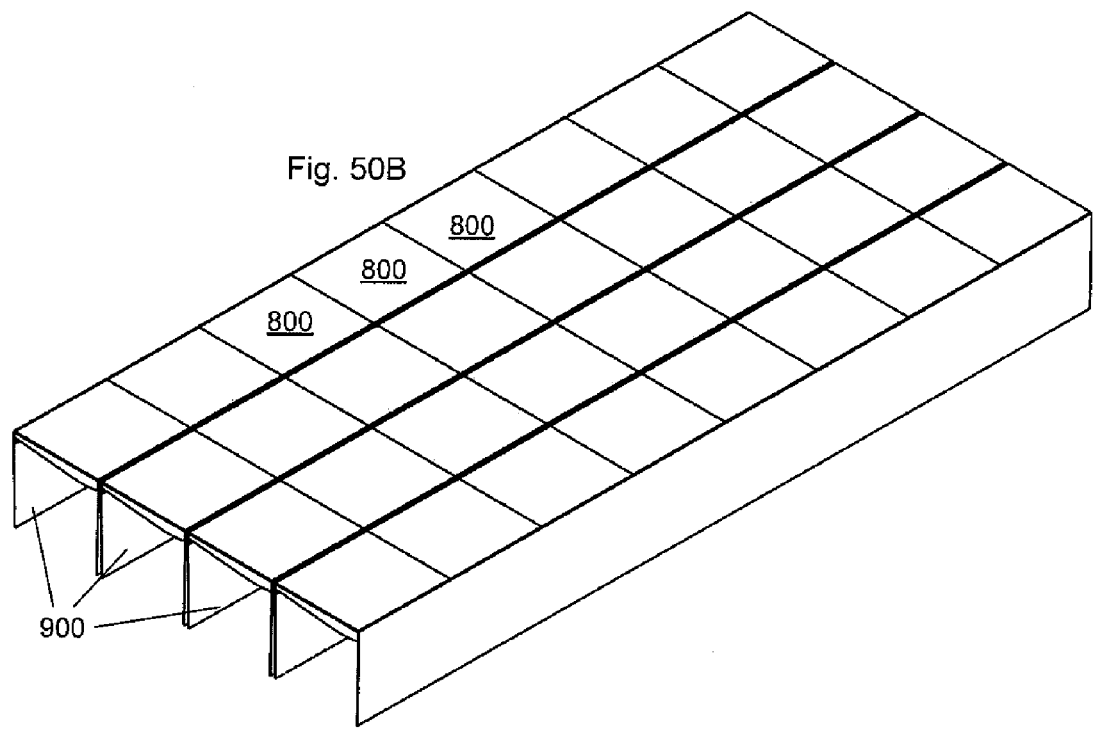

FIGS. 50A and 50B show how light-guide solar panels such as the light-guide solar panel 800 of FIG. 33D can be grouped together. The light-guide solar panels 800 can be placed between two vertically oriented aluminum heat sinks 900 to form a linear assembly 902 of light-guide solar panels 800. Larger groups of light-guide solar panels 800 can be assembled by joining together the linear assemblies 902.

The present invention is that of a solar energy system that uses a LGSP to trap light inside a dielectric or other transparent panel and propagates the light to one of the panel edges for harvesting by a SEC. This allows for very thin modules whose thickness is comparable to the height of the SEC, for example a PV cell, at the edge of the module, thus eliminating the depth requirements inherent in traditional solar energy systems such as CPV systems. Light striking the LGSP is redirected and trapped internally so that it exits the panel through one of its edges where a SEC receives it.

LGSPs can be combined in clusters to make modules. The LGSP optics can be designed structurally to be largely self-supporting, meaning that they do not require an external enclosure to maintain their shape and orientation. A full enclosure can be added to the embodiment. As will be described below, to minimize material use and cost, LGSP modules can be supported by a minimal axle-and-rib configuration.

Concentrated sunlight may be harnessed for a purpose other than creating electricity with PV cells. One alternate use is the heating of an element. The modules can also be configured to heat water while simultaneously generating electricity. It is also possible to couple the concentrated light into a fiber optic or other light-guide to propagate it to another location for some other use, such as to a lighting fixture to provide solar lighting. Furthermore, the LGSP optics of the present invention can be used to reduce the thickness of optics in other applications including, for example, lamps and lighting. Other aspects and uses of the present invention will become apparent to those ordinarily skilled in the art upon review of the following description of specific embodiments of the invention in conjunction with the accompanying figures.

In the preceding description, for purposes of explanation, numerous details are set forth in order to provide a thorough understanding of the embodiments of the invention. However, it will be apparent to one skilled in the art that these specific details are not required in order to practice the invention. In other instances, well-known electrical structures and circuits are shown in block diagram form in order not to obscure the invention. For example, specific details are not provided as to whether the embodiments of the invention described herein are implemented as a software routine, hardware circuit, firmware, or a combination thereof.

The above-described embodiments of the invention are intended to be examples only. Alterations, modifications and variations can be effected to the particular embodiments by those of skill in the art without departing from the scope of the invention, which is defined solely by the claims appended hereto.

What is claimed is:

1. A light-guide solar panel module comprising:
    a) a single planar light-insertion molded polymeric slab that is transmissive to sunlight including:
        an input surface for receiving impinging sunlight,
        a plurality of first optical elements, and
        a plurality of optical output apertures formed from the sunlight transmissive polymer, each one of the plurality of optical output apertures being associated with one of the plurality of first optical elements such that there is a one-to-one relationship between each one of the plurality of optical output apertures and each one of the plurality of first optical elements,
            each one of the plurality of first optical elements being located optically in between the input surface and its associated optical output aperture, wherein each one of the plurality of first optical elements including a first reflector having a single reflective surface positioned with respect to the input surface (i) to receive sunlight directly through the input surface at an angle smaller than a critical angle for total internal reflection of the sunlight at the reflecting surface, and (ii) to reflect the received sunlight only once and at an oblique angle with respect to the impinging sunlight to redirect the sunlight towards the one of the plurality of optical apertures;
    b) a single planar wedge-shaped optical waveguide molded polymeric slab that is transmissive to sunlight having:
        a first surface,
        a plurality of stepped second reflectors opposite to the first surface, each one of the plurality of second reflectors being associated with one of the first optical elements such that there is a one-to-one relationship between each one of the plurality of second reflectors and each one of the plurality of first optical elements,
        an output surface,
            wherein the optical waveguide slab being optically coupled to each of the plurality of optical output apertures to receive the sunlight therefrom, the first surface and the plurality of second reflectors being positioned and arranged such that the sunlight received via the optical output apertures is guided through the optical waveguide slab towards the output surface via multiple total internal reflections between the plurality of second reflectors and the first surface;
    c) a photovoltaic cell for receiving the sunlight having been concentrated by the light-insertion slab and the waveguide slab; and
    d) a single second optical element that is transmissive to sunlight and has at least one reflective surface positioned to redirect at least a portion of the sunlight travelling within the waveguide slab towards the photovoltaic cell.

2. The light-guide solar panel module as claimed in claim 1 wherein the first optical elements are spaced-apart from each other along substantially parallel lines.

3. The light-guide solar panel module as claimed in claim 1 further comprising a cladding layer formed between the light-insertion slab and the optical waveguide slab, the cladding layer having a refractive index lower than a refractive index of the light-insertion slab and lower than a refractive index of the optical waveguide slab.

4. The light-guide solar panel module as claimed in claim 1 wherein the plurality of stepped reflectors includes planar reflectors.

5. The light-guide solar panel module as claimed in claim 1 wherein the plurality of second planar reflectors are substantially parallel to the first surface.

6. The light-guide solar panel module as claimed in claim 1 wherein at least some of the plurality of optical output apertures are located in between adjacent second reflectors.

7. The light-guide solar panel module as claimed in claim 1 wherein each of the first optical elements are optical focusing elements.

8. The light-guide solar panel module as claimed in claim 1 wherein the second optical element is a distinct element from the optical waveguide slab and further concentrates the sunlight.

9. The light-guide solar panel module as claimed in claim 1 wherein the second optical element is integral with and formed from the same polymer as the optical waveguide slab.

10. A light-guide solar panel module comprising:
    a) a single planar light-insertion molded polymeric slab that is transmissive to sunlight including:
        a plurality of first optical elements equally spaced apart from one another, each of the first optical elements having:
            an input surface for receiving impinging sunlight,
            a first reflector having a single reflective surface inclined with respect to the impinging sunlight (i) to receive sunlight directly through the input surface at an angle smaller than a critical angle for total internal reflection of the sunlight at the reflecting surface, and (ii) to reflect the received sunlight only once and at an oblique angle with respect to the impinging sunlight to redirect the sunlight;

b) a single planar wedge-shaped optical waveguide molded polymeric slab that is transmissive to sunlight including:
   a first reflective surface,
   a plurality of stepped planar second reflectors opposite to the first reflective surface and being equally spaced apart from one another,
   an output surface,
      the optical waveguide slab being optically coupled to each of the first reflectors of the light-guide slab to receive the oblique sunlight therefrom, the first reflective surface and the plurality of second reflectors being positioned and arranged such that the sunlight received from the first reflectors is guided through the optical waveguide slab towards the output surface via multiple total internal reflections between the plurality of second reflectors and the first surface;
c) a photovoltaic cell for receiving the sunlight having been concentrated by the light-insertion slab and the waveguide slab; and
d) a single second optical element that is transmissive to sunlight and has at least one reflective surface positioned to redirect at least a portion of the sunlight travelling within the waveguide slab towards the photovoltaic cell.

11. The light-guide solar panel module as claimed in claim 10 further comprising a cladding layer formed between the light-insertion slab and the optical waveguide slab, the cladding layer having a refractive index lower than a refractive index of the light-insertion slab and lower than a refractive index of the optical waveguide slab.

12. The light-guide solar panel module as claimed in claim 10 wherein the light insertion molded polymeric slab further comprises optical output apertures formed from the molded polymer, the optical output apertures located in between adjacent second reflectors.

13. The light-guide solar panel module as claimed in claim 10 wherein each of the first optical elements are optical focusing elements.

14. The light-guide solar panel module as claimed in claim 10 wherein the second optical element is a distinct element from the optical waveguide slab and further concentrates the sunlight.

15. The light-guide solar panel module as claimed in claim 10 wherein the second optical element is integral with and formed from the same polymer as the optical waveguide slab.

16. A light-guide solar panel module comprising:
a) a single planar light-insertion slab that is transmissive to sunlight having a plurality of optical focusing elements equally spaced apart from one another, each of the optical focusing elements having an input surface for receiving impinging sunlight,
b) a single planar optical waveguide slab that is transmissive to sunlight including:
   a first reflective surface,
   a plurality of reflectors opposite to the first reflective surface and being equally spaced apart from one another,
   an output surface,
      the optical waveguide slab being optically coupled to each of the optical focusing elements of the light-guide slab to receive the sunlight therefrom, the first reflective surface and the plurality of reflectors being positioned and arranged such that the sunlight received from the optical focusing elements is guided towards the output surface via multiple total internal reflections within the optical waveguide slab;
c) a cladding layer formed between the light-insertion slab and the optical waveguide slab, the cladding layer having a refractive index lower than a refractive index of the light-insertion slab and lower than a refractive index of the optical waveguide slab;
d) a photovoltaic cell for receiving the sunlight having been received and concentrated via the light-insertion slab and the waveguide slab; and
e) a single second optical element transmissive to sunlight having at least one reflective surface being positioned and structured to redirect at least a portion of the sunlight travelling within the waveguide slab towards the photovoltaic cell.

17. The light-guide solar panel module as claimed in claim 16 further comprising optical output apertures located in between adjacent reflectors.

18. The light-guide solar panel module as claimed in claim 16 wherein the light-insertion slab and the optical waveguide slab are each formed from a molded polymer.

19. The light-guide solar panel module as claimed in claim 16 wherein the second optical element is a distinct element from the optical waveguide slab and further concentrates the sunlight.

20. The light-guide solar panel module as claimed in claim 16 wherein the second optical element is integral with the optical waveguide slab.

* * * * *

UNITED STATES PATENT AND TRADEMARK OFFICE
CERTIFICATE OF CORRECTION

| | | |
|---|---|---|
| PATENT NO. | : 7,873,257 B2 | Page 1 of 1 |
| APPLICATION NO. | : 12/113705 | |
| DATED | : January 18, 2011 | |
| INVENTOR(S) | : John Paul Morgan | |

It is certified that error appears in the above-identified patent and that said Letters Patent is hereby corrected as shown below:

Column 22, line 38, -- planar -- should be removed

Signed and Sealed this
Twenty-ninth Day of March, 2011

David J. Kappos
*Director of the United States Patent and Trademark Office*